US008470701B2

(12) United States Patent
Rogers et al.

(10) Patent No.: US 8,470,701 B2
(45) Date of Patent: Jun. 25, 2013

(54) PRINTABLE, FLEXIBLE AND STRETCHABLE DIAMOND FOR THERMAL MANAGEMENT

(75) Inventors: John A. Rogers, Champaign, IL (US); Tae Ho Kim, Masan (KR); Won Mook Choi, Hwaseong (KR); Dae Hyeong Kim, Champaign, IL (US); Matthew Meitl, Raleigh, NC (US); Etienne Menard, Durham, NC (US); John Carlisle, Plainfield, IL (US)

(73) Assignees: Advanced Diamond Technologies, Inc., Romeoville, IL (US); The Board of Trustees of the University of Illinois Semprius, Inc.

( * ) Notice: Subject to any disclaimer, the term of this patent is extended or adjusted under 35 U.S.C. 154(b) by 409 days.

(21) Appl. No.: 12/418,071

(22) Filed: Apr. 3, 2009

(65) Prior Publication Data
US 2010/0052112 A1    Mar. 4, 2010

Related U.S. Application Data

(60) Provisional application No. 61/042,162, filed on Apr. 3, 2008.

(51) Int. Cl.
*H01L 21/20*    (2006.01)
(52) U.S. Cl.
USPC ............................ 438/584; 257/E21.09
(58) Field of Classification Search
USPC ............................ 438/584; 257/E21.09
See application file for complete search history.

(56) References Cited

U.S. PATENT DOCUMENTS

| 4,392,451 | A | 7/1983 | Mickelsen et al. |
| 4,471,003 | A | 9/1984 | Cann |
| 4,487,162 | A | 12/1984 | Cann |
| 4,761,335 | A | 8/1988 | Aurichio et al. |
| 4,766,670 | A | 8/1988 | Gazdik et al. |
| 4,784,720 | A | 11/1988 | Douglas |
| 4,855,017 | A | 8/1989 | Douglas |
| 5,204,144 | A | 4/1993 | Cann et al. |

(Continued)

FOREIGN PATENT DOCUMENTS

| DE | 4241045 C1 | 5/1994 |
| EP | 0929097 | 7/1999 |

(Continued)

OTHER PUBLICATIONS

Abbaschian et al. (Dec. 2005) "High Pressure-High Temperature Growth of Diamond Crystals Using Split Sphere Apparatus," *Diamond Relat. Mater.* 14(11-12):1916-1919.

(Continued)

*Primary Examiner* — Trung Q Dang
(74) *Attorney, Agent, or Firm* — Edwards Wildman Palmer LLP

(57) ABSTRACT

Various heat-sinked components and methods of making heat-sinked components are disclosed where diamond in thermal contact with one or more heat-generating components are capable of dissipating heat, thereby providing thermally-regulated components. Thermally conductive diamond is provided in patterns capable of providing efficient and maximum heat transfer away from components that may be susceptible to damage by elevated temperatures. The devices and methods are used to cool flexible electronics, integrated circuits and other complex electronics that tend to generate significant heat. Also provided are methods of making printable diamond patterns that can be used in a range of devices and device components.

6 Claims, 16 Drawing Sheets

U.S. PATENT DOCUMENTS

| | | | |
|---|---|---|---|
| 5,313,094 A | 5/1994 | Beyer et al. | |
| 5,525,815 A | 6/1996 | Einset | |
| 5,545,291 A | 8/1996 | Smith et al. | |
| 5,648,148 A | 7/1997 | Simpson | |
| 5,672,240 A * | 9/1997 | Stoner et al. | 216/36 |
| 5,691,245 A | 11/1997 | Bakhit et al. | |
| 5,753,529 A | 5/1998 | Chang et al. | |
| 5,757,081 A | 5/1998 | Chang et al. | |
| 5,767,578 A | 6/1998 | Chang et al. | |
| 5,772,905 A | 6/1998 | Chou | |
| 5,783,856 A | 7/1998 | Smith et al. | |
| 5,817,242 A | 10/1998 | Biebuyck et al. | |
| 5,824,186 A | 10/1998 | Smith et al. | |
| 5,904,545 A | 5/1999 | Smith et al. | |
| 5,907,189 A | 5/1999 | Mertol | |
| 5,915,180 A | 6/1999 | Hara et al. | |
| 5,928,001 A | 7/1999 | Gillette et al. | |
| 5,955,781 A * | 9/1999 | Joshi et al. | 257/712 |
| 5,976,683 A | 11/1999 | Liehrr et al. | |
| 5,998,291 A | 12/1999 | Bakhit et al. | |
| 6,080,608 A | 6/2000 | Nowak | |
| 6,225,149 B1 | 5/2001 | Gan et al. | |
| 6,265,326 B1 | 7/2001 | Ueno | |
| 6,274,508 B1 | 8/2001 | Jacobsen et al. | |
| 6,277,712 B1 | 8/2001 | Kang et al. | |
| 6,281,038 B1 | 8/2001 | Jacobsen et al. | |
| 6,291,896 B1 | 9/2001 | Smith | |
| 6,316,278 B1 | 11/2001 | Jacobsen et al. | |
| 6,317,175 B1 | 11/2001 | Salerno et al. | |
| 6,334,960 B1 | 1/2002 | Willson et al. | |
| 6,380,729 B1 | 4/2002 | Smith | |
| 6,403,397 B1 | 6/2002 | Katz | |
| 6,413,790 B1 | 7/2002 | Duthaler et al. | |
| 6,417,025 B1 | 7/2002 | Gengel | |
| 6,420,266 B1 | 7/2002 | Smith et al. | |
| 6,459,418 B1 | 10/2002 | Comiskey et al. | |
| 6,468,638 B2 | 10/2002 | Jacobsen et al. | |
| 6,479,395 B1 | 11/2002 | Smith et al. | |
| 6,527,964 B1 | 3/2003 | Smith et al. | |
| 6,555,408 B1 | 4/2003 | Jacobsen et al. | |
| 6,566,744 B2 | 5/2003 | Gengel | |
| 6,580,151 B2 | 6/2003 | Vandeputte et al. | |
| 6,586,338 B2 | 7/2003 | Smith et al. | |
| 6,590,346 B1 | 7/2003 | Hadley et al. | |
| 6,606,079 B1 | 8/2003 | Smith | |
| 6,606,247 B2 | 8/2003 | Credelle et al. | |
| 6,608,370 B1 | 8/2003 | Chen et al. | |
| 6,623,579 B1 | 9/2003 | Smith et al. | |
| 6,639,578 B1 | 10/2003 | Comiskey et al. | |
| 6,655,286 B2 | 12/2003 | Rogers | |
| 6,657,289 B1 | 12/2003 | Craig et al. | |
| 6,661,037 B2 | 12/2003 | Pan et al. | |
| 6,665,044 B1 | 12/2003 | Jacobsen et al. | |
| 6,667,548 B2 | 12/2003 | O'Connor et al. | |
| 6,683,663 B1 | 1/2004 | Hadley et al. | |
| 6,693,384 B1 | 2/2004 | Vicentini et al. | |
| 6,723,576 B2 | 4/2004 | Nozawa et al. | |
| 6,730,990 B2 | 5/2004 | Kondo et al. | |
| 6,731,353 B1 | 5/2004 | Credelle et al. | |
| 6,743,982 B2 | 6/2004 | Biegelsen et al. | |
| 6,780,696 B1 | 8/2004 | Schatz | |
| 6,784,450 B2 | 8/2004 | Pan et al. | |
| 6,814,898 B1 | 11/2004 | Deeman et al. | |
| 6,816,380 B2 | 11/2004 | Credelle et al. | |
| 6,844,673 B1 | 1/2005 | Bernkopf | |
| 6,848,162 B2 | 2/2005 | Arneson et al. | |
| 6,850,312 B2 | 2/2005 | Jacobsen et al. | |
| 6,863,219 B1 | 3/2005 | Jacobsen et al. | |
| 6,864,435 B2 | 3/2005 | Hermanns et al. | |
| 6,864,570 B2 | 3/2005 | Smith | |
| 6,872,645 B2 | 3/2005 | Duan et al. | |
| 6,878,871 B2 | 4/2005 | Scher et al. | |
| 6,900,094 B2 | 5/2005 | Hammond et al. | |
| 6,917,061 B2 | 7/2005 | Pan et al. | |
| 6,949,199 B1 | 9/2005 | Gauzner et al. | |
| 6,949,206 B2 | 9/2005 | Whiteford | |
| 6,950,220 B2 | 9/2005 | Abramson et al. | |
| 6,984,934 B2 | 1/2006 | Moller et al. | |
| 6,989,285 B2 | 1/2006 | Ball | |
| 7,029,951 B2 | 4/2006 | Chen et al. | |
| 7,067,903 B2 | 6/2006 | Tachibana et al. | |
| 7,116,318 B2 | 10/2006 | Amundson et al. | |
| 7,132,313 B2 | 11/2006 | O'Connor et al. | |
| 7,148,512 B2 | 12/2006 | Leu et al. | |
| 7,169,669 B2 | 1/2007 | Blakers et al. | |
| 7,170,164 B2 | 1/2007 | Chen et al. | |
| 7,186,624 B2 | 3/2007 | Welser et al. | |
| 7,195,733 B2 | 3/2007 | Rogers et al. | |
| 7,253,442 B2 | 8/2007 | Huang et al. | |
| 7,255,919 B2 | 8/2007 | Sakata et al. | |
| 7,309,515 B2 * | 12/2007 | Tsai et al. | 427/271 |
| 7,374,968 B2 | 5/2008 | Kornilovich et al. | |
| 7,521,292 B2 | 4/2009 | Rogers et al. | |
| 7,557,367 B2 | 7/2009 | Rogers et al. | |
| 7,622,367 B1 | 11/2009 | Nuzzo et al. | |
| 7,704,684 B2 | 4/2010 | Rogers et al. | |
| 7,705,280 B2 | 4/2010 | Nuzzo et al. | |
| 7,799,699 B2 | 9/2010 | Nuzzo et al. | |
| 2003/0006527 A1 | 1/2003 | Rabolt et al. | |
| 2003/0178316 A1 | 9/2003 | Jacobs et al. | |
| 2003/0227116 A1 | 12/2003 | Halik et al. | |
| 2004/0005723 A1 | 1/2004 | Empedocles et al. | |
| 2004/0026684 A1 | 2/2004 | Empedocles et al. | |
| 2004/0079464 A1 | 4/2004 | Kumakura | |
| 2004/0095658 A1 | 5/2004 | Buretea et al. | |
| 2004/0112964 A1 | 6/2004 | Empedocles et al. | |
| 2004/0136866 A1 | 7/2004 | Pontis et al. | |
| 2004/0146560 A1 | 7/2004 | Whiteford et al. | |
| 2004/0178390 A1 | 9/2004 | Whiteford | |
| 2004/0192082 A1 | 9/2004 | Wagner et al. | |
| 2004/0206448 A1 | 10/2004 | Dubrow | |
| 2004/0250950 A1 | 12/2004 | Dubrow | |
| 2005/0038498 A1 | 2/2005 | Dubrow et al. | |
| 2005/0227389 A1 | 10/2005 | Bhattacharya et al. | |
| 2005/0238967 A1 | 10/2005 | Rogers et al. | |
| 2006/0038182 A1 | 2/2006 | Rogers et al. | |
| 2006/0049485 A1 | 3/2006 | Pan et al. | |
| 2006/0127817 A1 | 6/2006 | Ramanujan et al. | |
| 2006/0132025 A1 | 6/2006 | Gao et al. | |
| 2006/0134893 A1 | 6/2006 | Savage et al. | |
| 2006/0244105 A1 | 11/2006 | Forbes et al. | |
| 2006/0286488 A1 | 12/2006 | Rogers et al. | |
| 2006/0286785 A1 | 12/2006 | Rogers et al. | |
| 2007/0032089 A1 | 2/2007 | Nuzzo et al. | |
| 2007/0158872 A1 * | 7/2007 | Jeong et al. | 264/220 |
| 2008/0055581 A1 | 3/2008 | Rogers et al. | |
| 2008/0108171 A1 | 5/2008 | Rogers et al. | |
| 2008/0157235 A1 | 7/2008 | Rogers et al. | |
| 2008/0212102 A1 | 9/2008 | Nuzzo et al. | |
| 2008/0266930 A1 * | 10/2008 | Auciello | 365/145 |
| 2009/0199960 A1 | 8/2009 | Nuzzo et al. | |
| 2009/0294803 A1 | 12/2009 | Nuzzo et al. | |
| 2010/0002402 A1 | 1/2010 | Rogers et al. | |
| 2010/0072577 A1 | 3/2010 | Nuzzo et al. | |

FOREIGN PATENT DOCUMENTS

| | | |
|---|---|---|
| EP | 1357773 | 10/2003 |
| JP | 2002092984 | 3/2002 |
| TW | 367570 | 8/1999 |
| TW | 494257 | 7/2002 |
| TW | 200836353 | 9/2008 |
| WO | WO 00/46854 | 8/2000 |
| WO | WO 00/49421 | 8/2000 |
| WO | WO 00/49658 | 8/2000 |
| WO | WO 00/55915 | 9/2000 |
| WO | WO 00/55916 | 9/2000 |
| WO | WO 01/31082 | 5/2001 |
| WO | WO 01/33621 | 5/2001 |
| WO | WO 02/27701 | 4/2002 |
| WO | WO 02/43032 | 5/2002 |
| WO | WO 02/097708 | 12/2002 |
| WO | WO 02/097724 | 12/2002 |
| WO | WO 03/032240 | 4/2003 |
| WO | WO 03/049201 | 6/2003 |
| WO | WO 03/063211 | 7/2003 |
| WO | WO 03/085700 | 10/2003 |
| WO | WO 03/085701 | 10/2003 |

| | | |
|---|---|---|
| WO | WO 03/092073 | 11/2003 |
| WO | WO 2004/003535 | 1/2004 |
| WO | WO 2004/022637 | 3/2004 |
| WO | WO 2004/022714 | 3/2004 |
| WO | WO 2004/023527 | 3/2004 |
| WO | WO 2004/024407 | 3/2004 |
| WO | WO 2004/027822 | 4/2004 |
| WO | WO 2004/032190 | 4/2004 |
| WO | WO 2004/032191 | 4/2004 |
| WO | WO 2004/032193 | 4/2004 |
| WO | WO 2004/034025 | 4/2004 |
| WO | WO 2004/086289 | 10/2004 |
| WO | WO 2004/094303 | 11/2004 |
| WO | WO 2004/100252 | 11/2004 |
| WO | WO 2004/099068 | 12/2004 |
| WO | WO 2004/105456 | 12/2004 |
| WO | WO 2005/005679 | 1/2005 |
| WO | WO 2005/015480 | 2/2005 |
| WO | WO 2005/017962 | 2/2005 |
| WO | WO 2005/022120 | 3/2005 |
| WO | WO 2005/054119 | 6/2005 |
| WO | WO 2005/104756 | 11/2005 |
| WO | WO 2005/122285 | 12/2005 |
| WO | WO 2006/130721 | 12/2006 |
| WO | WO 2007/126412 | 11/2007 |
| WO | WO 2008/030666 | 3/2008 |
| WO | WO 2008/030960 | 3/2008 |
| WO | WO 2008/036837 | 3/2008 |
| WO | WO 2008/055054 | 5/2008 |
| WO | WO 2008/143635 | 11/2008 |
| WO | WO 2009/011709 | 1/2009 |
| WO | WO 2009/111641 | 9/2009 |
| WO | WO 2010/005707 | 1/2010 |
| WO | WO 2010/036807 | 4/2010 |

OTHER PUBLICATIONS

Adachi et al (1982) "Chemical Etching of InGaAsP/InP DH Wafer," *J. Electrochem. Soc.* 129:1053-1062.
Adachi et al. (1983) "Chemical Etching Characteristics of (001)GaAs," *J. Electrochem. Soc.* 130:2427-2435.
Ahmed et al. (Web Release Oct. 11, 2005) "Extending the 3ω-Method to the MHz Range for Thermal Conductivity Measurements of Diamond Thin Films," *Diamond Relat. Mater.* 15(2-3):389-393.
Ahn et al. (2007) "Bendable Integrated Circuits on Plastic Substrates by Use of Printed Ribbons of Single-Crystalline Silicon," *Appl. Phys. Lett.* 90:213501.
Ahn et al. (Dec. 15, 2006) "Heterogeneous Three-Dimensional Electronics by Use of Printed Semiconductor Nanomaterials," *Science* 314:1754-1757.
Ahn et al. (Jun. 2006) "High-Speed Mechanically Flexible Single-Crystal Silicon Thin-Film Transistors on Plastic Substrates," *IEEE Electron Dev. Lett.* 27(6):460-462.
Alivisatos et al. (1996) "Semiconductor Clusters, Nanocrystals, and Quantum Dots," *Science* 271:933-937.
Alivisatos et al. (1998) "From Molecules to Materials: Current Trends and Future Directions," *Adv. Mater.* 10:1297-1336.
Allen et al. (Feb. 20, 2006) "Nanomaterial Transfer Using Hot Embossing for Flexible Electronic Devices," *Appl. Phys. Lett.* 88:083112.
Al-Sarawi et al. (Feb. 1998) "A Review of 3-D Packaging Technology," *IEEE Trans. Comp. Packag. Manufac. Technol. B* 21(1):2-14.
Amano et al. (Feb. 3, 1986) "Metalorganic Vapor Phase Epitaxial Growth of a High Quality GaN Film Using an AlN Buffer Layer," *Appl. Phys. Lett.* 48(5):353-355.
Ambrosy et al. (1996) "Silicon Motherboards for Multichannel Optical Modules," *IEEE Trans. Compon. Pack. A* 19:34-40.
Andersson et al. (Oct. 16, 2002) "Active Matrix Displays Based on All-Organic Electrochemical Smart Pixels Printed on Paper," *Adv. Mater.* 14:1460-1464.
Ando et al. (2004) "Self-Aligned Self-Assembly Process for Fabricating Organic Thin-Film Transistors," *Appl. Phys. Lett.* 85:1849-1851.
Angadi et al. (Web Release Jun. 1, 2006) "Thermal Transport and Grain Boundary Conductance in Ultrananocrystalline Diamond Thin Films," *J. Appl. Phys.* 99:114301.

Aoki et al. (2003) "Microassembly of Semiconductor Three Dimensional Photonic Crystals," *Nat. Mater.* 2:117-121.
Arnold et al. (Web Release Dec. 28, 2002) "Field-Effect Transistors Based on Single Semiconducting Oxide Nanobelts," *J. Phys. Chem. B* 107(3):659-663.
Ayón et al. (Jan. 1999) "Characterization of a Time Multiplexed Inductively Coupled Plasma Etcher," *J. Electrochem. Soc.* 146(1):339-349.
Baca et al. (2008) "Semiconductor Wires and Ribbons for High-Performance Flexible Electronics," *Angew. Chem. Int. Ed.* 47:5524-5542.
Bachtold et al. (Nov. 9, 2001) "Logic Circuits with Carbon Nanotube Transistors," *Science* 294:1317-1320.
Bae et al. (Jul. 1, 2002) "Single-Crystalline Gallium Nitride Nanobelts," *Appl. Phys. Lett.* 81:126-128.
Balmer et al. (2005) "Diffusion of Alkanethiols in PDMS and Its Implications on Microcontact Printing (μCP)," *Langmuir* 21(2):622-632.
Banerjee et al. (May 2001) "3-D ICs: A Novel Chip Design for Improving Deep-Submicrometerinterconnect Performance and Systems-on-Chip Integration," *Proc. IEEE* 89(5):602-633.
Bao et al. (1997) "High-Performance Plastic Transistors Fabricated by Printing Techniques," *Chem. Mater.* 9:1299-1301.
Bao et al. (1999) "Printable Organic and Polymeric Semiconducting Materials and Devices," *J. Mater. Chem.* 9:1895-1904.
Barquins, M. (1992) "Adherence, Friction and Wear of Rubber-Like Materials," *Wear* 158:87-117.
Bates, F.S. (1991) "Polymer-Polymer Phase Behavior," *Science* 251:898-905.
Battaglia et al. (2003) "Colloidal Two-Dimensional Systems: CdSe Quantum Shells and Wells," Angew. Chem. Int. Ed. 442:5035-5039.
Bauer et al. (2004) "Biological Applications of High Aspect Ratio Nanoparticles," *J. Mater. Chem.* 14:517-526.
Berg et al. (2003) "Tailored Micropatterns Through Weak Polyelectrolyte Stamping," Langmuir 19:2231-2237.
Bernard et al. (1998) "Printing Patterns of Proteins," *Langmuir* 14(9):2225-2229.
Bhunia et al. (2004) "Free-Standing and Vertically Aligned InP Nanowires Grown by Metalorganic Vapor Phase Epitaxy," *Physica E* 21:583-587.
Bhushan et al. (2004) "Multiwalled Carbon Nanotube AFM Probes for Surface Characterization of Micro/Nanostructures," *Microsyst. Technol.* 10:633-639.
Bietsch et al. (2000) "Conformational Contact and Pattern Stability of Stamps Used for Soft Lithography," *J. Appl. Phys.* 88:4310-4318.
Bishay et al. (2000) "Temperature Coefficient of the Surface Resistivity of Two-Dimensional Island Gold Films," *J. Phys. D. Appl. Phys.* 33(18):2218-2222.
Blanchet et al. (2003) "Large Area, High Resolution, Dry Printing of Conducting Polymers for Organic Electronics," *Appl. Phys. Lett.* 82:463-465.
Blanchet et al. (2003) "Printing Techniques for Plastic Electronics," *J. Imag. Sci. Tech.* 47(4):296-303.
Blazdell et al. (Nov. 1999) "Preparation of Ceramic Inks for Solid Freeforming Using a Continuous Jet Printer," *J. Mat. Syn. Process.* 7(6):349-356.
Boltau et al. (1998) "Surface-Induced Structure Formation of Polymer Blends on Patterned Substrates," *Nature* 391:877-879.
Boncheva et al. (Mar. 15, 2005) "Magnetic Self-Assembly of Three-Dimensional Surfaces from Planar Sheets," *Proc. Natl. Acad. Sci. USA* 102(11):3924-3929.
Boncheva et al. (Mar. 8, 2005) "Templated Self-Assembly: Formation of Folded Structures by Relaxation of Pre-Stressed, Planar Tapes. The Path to Ubiquitous and Low-cost Organic Electronic Appliances on Plastic," *Adv. Mater.* 17(5):553-557.
Bowden et al. (1997) "Self Assembly of Mesoscale Objects into Ordered Two-Dimensional Arrays," *Science* 276:233-235.
Bowden et al. (1998) "Spontaneous Formation of Ordered Structures in Thin Films of Metals Supported on an Elastomeric Polymer," *Nature* 393:146-149.
Bowden et al. (2001) "Molecule-Mimetic Chemistry and Mesoscale Self-Assembly," *Acc. Chem. Res.* 34:231-238.

Bracher et al. (2009) "Shaped Films of Ionotropic Hydrogels Fabricated Using Templates of Patterns Paper," *Adv. Mater.* 21:445-450.
Braun et al. (1999) "Electrochemically Grown Photonic Crystals," *Nature* 402:603-604.
Britton et al. (Web Release Oct. 25, 2005) "Microstructural Defect Characterization of a Si:H Deposited by Low Temperature HW-CVD on Paper Substrates," *Thin Solid Films* 501(1-2):79-83.
Brown et al. (Dec. 19, 2001) "Heterogeneous Materials Integration: Compliant Substrates to Active Device and Materials Packaging," *Mater. Sci. Eng. B* 87(3):317-322.
Brown, H.R. (1991) "The Adhesion Between Polymers," *Ann. Rev. Mater. Sci.* 21:463-489.
Bruschi et al. (2001) "Micromachined Silicon Suspended Wires With Submicrometric Dimensions," *Microelectron. Eng.* 57-58:959-965.
Buma et al. (2001) "High-Frequency Ultrasound Array Element Using Thermoelastic Expansion in an Elastomeric Film," *Appl. Phys. Lett.* 79:548-550.
Burdinski et al. (2005) "Single Etch Patterning of Stacked Silver and Molybdenum Alloy Layers on Glass Using Microcontat Wave Printing," *J. Am. Chem. Soc.* 127(31):10786-10787.
Burdinski, D. (no-dated) "Soft Lithography and Microcontact Wave Printing," http://www.research.philips.com/technologies/light_dev_microsys/softlitho/index.html , Downloaded May 23, 2007.
Burgin et al. (2000) "Large Area Submicrometer Contact Printing Using a Contact Aligner," *Langmuir* 16:5371-5375.
Burns et al. (2003) "Printing of Polymer Thin-Film Transistors for Active-Matrix-Display Applications," *J. Soc. Inf. Display* 11:599-604.
Campbell et al. (2000) "Fabrication of Photonic Crystals for the Visible Spectrum by Holographic Lithography," *Nature* 404:53-56.
Cao et al. (2006) "Highly Bendable,Transparent Thin-Film Transistors That Use Carbon-Nanotube-Based Conductors and Semiconductors with Elastomeric Delectrics," *Adv. Mater.* 18(3):304-309.
Cao et al. (Jul. 24, 2008) "Medium-Scale Carbon Nanotube Thin-Film Integrated Circuits on Flexible Plastic Substrates," *Nature* 454:495-500.
Carr et al. (1998) "Measurement of Nanomechanical Resonant Structures in Single-Crystal Silicon," *J. Vac. Sci. Technol. B* 16:3821-3824.
Chadhury et al. (1991) "Direct Measurement of Interfacial Interactions Between Semispherical Lenses and Flat Sheets of Poly(dimethylsiloxane) and their Chemical Derivatives," *Langmuir* 7:1013-1025.
Chang et al. (1994) "Process Techniques, Lithography and Device-Related Physics and Principles," In; *GaAs High-Speed Devices: Physics, Technology and Circuit Application*, John Wiley and Sons, New York, pp. 115-278.
Chen et al. (2003) "Characterization of Pd-GaAs Schottly Diodes Prepared by the Electrodes Plating Technique," *Semiconductor. Sci. Technol.* 18:620-626.
Chen et al. (2003) "Electronic Paper: Flexible Active-Matrix Electronics Ink Display," *Nature* 423:136.
Chen et al. (2004) "Herringbone Buckling Patterns of Compresses Thin Films on Comlliant Substrates," *J. Appl. Mech.* 71:597.
Chen et al. (2005) "InGaN Nanorings and Nanodots by Selective Area Epitaxy," *Appl. Phys. Lett.* 87:143111.
Chen et al. (2005) "The Role of Metal-Nanotube Caontact in the Performance of Carbon Nanotube Field-Effect Transistors," *Nano Lett.* 5(7):1497-1502.
Chen et al. (Feb. 27, 2006) "Complementary Carbon Nanotube-Gated Carbon Nanotube Thin-Fim Transistor," *Appl. Phys. Lett.* 88:093502.
Chen et al. (Jun. 2002) Effect of Process Parameters on the Surface Morphology and Mechanical Performance of Silicon Structures After Deep Reactive Ion Etching (DRIE) *J. Microelectromech. Syst.* 11(3):264-2775.
Chen et al. (Mar. 2004) "A Family of Herringbone Patterns in Thin Films," *Scr. Mater.* 50(6):797-801.
Chen et al. (Mar. 24, 2006) "An Integrated Logic Crcuit Assembled on a Single Carbon Nanotube," *Science* 311:1735.
Cheng et al. (2005) "Ink-Jet Printing, Self-Assembled Polyelectrolytes, and Electroless Plating: Low Cost Fabrication of Circuits on a Flexible Substrate at Room Temperature," *Macromol. Rapid Commun.* 26:247-264.

Childs et al. (2002) "Decal Transfer Microlithography: A New Soft-Lithographic Patterning Method," *J. Am. Chem. Soc.* 124:13583-13596.
Childs et al. (2005) "Masterless Soft-Lithography: Patterning UV/Ozone-Induced Adhesion on Poly(dimethylsiloxane) Surfaces," *Langmuir* 21:10096-10105.
Childs et al. (Aug. 14, 2004) "Patterning of Thin-Film Microstructures on Non-Planar Substrate Surfaces Using Decal Transfer Lithography," *Adv. Mater.* 16(15):1323-1327.
Choi et al. (2007) "Biaxially Stretchable 'Wavy' Silicon Nanomembranes," *Nano Lett.* 7(6):1655-1663.
Choi et al. (Web Release Jan. 25, 2005) "Simple Detachment Patterning of Organic Layers and Its Applications to Organic Light-Emitting Diodes," *Adv. Mater.* 17(2):166-171.
Chou et al. (2004) "An Orientation-Controlled Pentacene Film Aligned by Photoaligned Polyimide for Organic Thin-Film Transistor Applications," *Adv. Func. Mater.* 14:811-815.
Chou et al. (Jun. 8, 1999) "Micromachining on (111)-Oriented Silicon," *Sens. Actuators A* 75(3):271-277.
Chu et al. (2005) "High-Performance Organic Thin-Film Transistors with Metal Oxide/Metal Bilayer Electrode," *Appl. Phys. Lett.* 87:193508.
Chung et al. (2000) "Silicon Nanowire Devices," *Appl. Phys. Lett.* 76(15):2068-2070.
Chung et al. (Jul. 1, 2003) "A Study on Formation of Al and $Al_2O_3$ on the Porous Paper by DC Magnetron Sputtering," *Surf. Coat. Technol.* 171(1-3):65-70.
Collins et al. (Apr. 27, 2001) "Engineering Carbon Nanotubes and Nanotube Circuits Using Electrical Breakdown," *Science* 292:706-709.
Creagh et al. (2003) "Design and Performance of Inkjet Print Heads for Non-Graphic-Arts Applications," *MRS Bull.* 28:807-811.
Crone et al. (Feb. 3, 2000) "Large-Scale Complementary Integrated Circuits Based on Organic Transistors," *Nature* 403:521-523.
Crowder et al. (1998) "Low-Temperature Single-Crystal Si TFTs Fabricated on Si Films Processed via Sequential Lateral Solidification," *IEEE Electron. Dev. Lett.* 19:306-308.
Cui et al. (2001) "Nanowire Nanosensors for Highly Sensitive and Selective Detection of Biological and Chemical Species," *Science* 293:1289-1292.
Dai et al. (2003) "Novel Nanostructures of Functional Oxides Synthesized by Thermal Evaporation," *Adv. Funct. Mater.* 13:9-24.
Dai et al. (Web Release Jan. 15, 2002) "Gallium Oxide Nanoribbons and Nanosheets," *J. Phys. Chem. B* 106(5):902-904.
Davidson et al. (2004) "Supercritical Fluid-Liquid-Solid Synthesis of Gallium Arsenide Nanowires Seeded by Alkanethiol-Stabilized Gold Nanocrystals," *Adv. Mater.* 16:646-649.
de Gans (2004) "Inkjet Printing of Polymers: State of the Art and Future Developments," *Adv. Mater.* 16(3):203-213.
De Sio et al. (Web Release May 18, 2005) "Electro-Optical Response of a Single-Crystal Diamond Ultraviolet Photoconductor in Transverse Configuration," *Appl. Phys. Lett.* 86:213504.
DeBoer et al. (2004) "Organic Single-Crystal Field-Effect Transistors," *Phys. Stat. Sol.* 201:1302-1331.
Deen et al. (2004) "Electrical Characterization of Polymer-Based FETs Fabricated by Spin-Coating Poly(3-alkylthiophene)s," *IEEE Trans. Electron Devices* 51:1892-1901.
Delmerche et al. (1997) "Stability of Molded Polydimethylsiloxane Microstructures," *Adv. Mat.* 9:741-746.
Deruelle et al. (1995) "Adhesion at the Solid-Elastomer Interface: Influence of Interfacial Chains," *Macromol.* 28:7419-7428.
Derycke et al. (Sep. 2001) "Carbon Nanotube Inter- and Intramolecular Logic Gates," *Nano Lett.* 1(9):453-456.
Desai et al. (Feb. 1999) "Nanopore Technology for Biomedical Applications," *Biomed. Microdevices* 2(1):11-40.
Dick et al. (2004) "Synthesis of Branched 'Nanotrees' by Controlled Seeding of Multiples Branching Events," *Nat. Mater.* 3:380-384.
Dimroth et al. (Mar. 2007) "High-Efficiency Multijunction Solar Cells," *MRS Bull.* 32:230-235.
Ding et al. (Oct. 4, 2004) "Self Catalysis and Phase Transformation in the Formation of CdSe Nanosaws," *Adv. Mater.* 16(19):1740-1743.
Dinsmore et al. (2002) "Colloidosomes: Selectively Permeable Capsules Composed of Colloidal Particles," *Science* 298:1006-1009.

Divliansky et al. (2003) "Fabrication of Three-Dimensional Polymer Photonic Crystal Structures Using Single Diffraction Element Interference Lithography," *Appl. Phys. Lett.* 82(11):1667-1669.

Dodabalapur A. (Apr. 2006) "Organic and Polymer Transistors for Electronics," *Mater Today* 9(4):24-30.

Dodabalapur et al. (1995) "Organic Transistors: Two-Dimensional Transport and Improved Electrical Characteristics," *Science* 268:270-271.

Duan et al. (2000) "General Synthesis of Compound Semiconductor Nanowires," *Adv. Mater.* 12:298-302.

Duan et al. (2003) "High-performance Thin-Film Transistors Using Semiconductor Nanowires and Nanoribbons," *Nature* 425:274-278.

Duan X, (2003) "Semiconductor Nanowires: From Nanoelectronics to Macroelectronics," Abstract from a presentation given at the 11$^{th}$ Foresight Conference on Molecular Nanotechnology, Oct. 10-20, Burlingame, CA.

Duboz et al. (1998) "Transistors and Detectors Based on GaN-Related Materials," In; *Group III Nitride Semiconductor Compounds*, Gill, B. ed., Clarendon, Oxford, pp. 343-387.

Duffy et al. (1998) "Rapid Prototyping of Microfluidic Systems in Poly(dimethylsiloxane)," *Anal. Chem.* 70(23):4974-4984.

Durkop et al. (2004) "Extraordinary Mobility in Semiconducting Carbon Nanotube," *Nano Lett.* 4(1):35-39.

Eder et al. (Apr. 5, 2004) "Organic Electronics on Paper," *Appl. Phys. Lett.* 84(14):2673-2675.

Edrington et al. (2001)"Polymer-Based Photonic Crystals," *Adv. Mater.* 13:421-425.

Efimenko et al. (Oct. 15, 2002) "Surface Modification of Sylgard-184 Poly(dimethyl Siloxane) Networks by Ultraviolet and Ultraviolet/Ozone Treatment," *J. Colloid Interface Sci.* 254(2):306-315.

Eftekhari, G. (1993) "Variation in the Effective Richardson Constant of Metal—GaAs and Metal—InP Contacta Due to the Effect of Processing Parameters," *Phys. Status Solid A-Appl. Res.* 140:189-194.

Ensell, G. (1995) "Free Standing Single-Crystal Silicon Microstructures," *J. Micromech. Microeng.* 5:1-4.

Examination Report, Corresponding to European Application No. EP 05 756 327.2, Dated Jan. 20, 2010.

Examination Report, Corresponding to Malaysian Patent Application No. PI 20062672, Mailed Aug. 28, 2009.

Examination Report, Corresponding to Malaysian Patent Application No. PI 20092343, Mailed Jun. 15, 2010.

Examination Report, Corresponding to Malaysian Patent Publication No. PI 20052553, Mailed Mar. 13, 2009.

Examination Report, Corresponding to Singapore Patent Application No. 200608359-6, Completed on Aug. 27, 2008.

Faez et al. (1999) "An Elastomeric Conductor Based on Polyaniline Prepared by Mechanical Mixing," *Polymer* 40:5497-5503.

Felgner et al. (1996) "Flexural Rigidity of Microtubules Measured with the Use of Optical Tweezers," *J. Cell Sci.* 109:509-516.

Fink et al. (1999) "Block Copolymers as Photonic Bandgap Materials," *J. Lightwave Tech.* 17:1963-1969.

Flewitt et al. (2005) "Low-Temperature Deposition of Hydrogenated Amorphous Silicon in an Electron Cyclotron Resonance Reactor for Flexible Displays," *Proc. IEEE* 93:1364-1373.

Folch et al. (1999) "Wafer-Level In-Registry Microstamping," *J. Microelectromech. Syst.* 8:85-89.

Forment et al. (2004) "Influence of Hydrogen Treatment and Annealing Processes Upon the Schottky Barrier Height of Au/n-GaAs and Ti/n-GaAs Diodes," *Semicond. Sci. Technol.* 19:1391-1396.

Forrest et al. (2004) "The Path to Ubiquitous and Low-Cost Organic Electronic Appliances on Plastic," *Nature* 428:911-918.

Fortunato et al. (2005) "Flexible a-Si: H Position-Sensitive Detectors," *Proc. IEEE* 93:1281-1286.

Fortunato et al. (Sep. 2008) "High-Performance Flexible Hybrid Field-Effect Transistors Based on Cellulose Fiber Paper," *IEEE Electron. Dev. Lett.* 29(9):988-990.

Freire et al. (1999) "Thermal Stability of Polyethylene Terephthalate (PET): Oligomer Distribution and Formation of Volatiles," *Packag. Technol. Sci.* 12:29-36.

Freund, L.B. (2000) "The Mechanics of Electronic Materials," *Int. J. Solids Struct.* 37:185-196.

Friedman et al. (2005) "Nanotechnology: High-Speed Integrated Nanowire Circuits," *Nature* 434:1085.

Fu et al. (Jan. 10, 2003) "Patterning of Diamond Microstructures on Si Substrate by Bulk and Surface Micromachining," *J. Mater. Process. Technol.* 132(1-3):73-81.

Furneaux et al. (1989) "The Formation of Controlled-Porosity Membranes from Anodically Oxidized Aluminum," *Nature* 337:147-149.

Gan et al. (2002) "Preparation of Thin-Film Transistors with Chemical Bath Deposited CdSe and CdS Thin Films," *IEEE Trans. Electron. Dev.* 49:15-18.

Gao et al. (Sep. 9, 2005) "Conversion of Zinc Oxide Nanobelts into Superlattice-Structures Nanohelices," *Science* 309:1700-1704.

Garcia et al. (Oct. 2004) "Etchant Anisotropy Controls the Step Bunching Instability in KOH Etching of Silicon," *Phys. Rev. Lett.* 93(16):166102.

Garnier et al. (1994) "All-Polymer Field-Effect Transistor Realized by Printing Techniques," *Science* 265:1684-1686.

Geim et al. (Mar. 2007) "The Rise of Graphene," *Nature Mater.* 6:183-191.

Geissler et al. (2003) "Fabrication of Metal Nanowires Using Microcontact Printing," *Langmuir* 19(15):6301-6311.

Geissler et al. (Jun. 2003) "Selective Wet-Etching of Microcontact-Printed Cu Substrates with Control Over the Etch Profile," *Microelec. Eng.* 67-68:326-332.

Gelinck et al. (2000) "High-Performance All-Polymer Integrated Circuits," *Appl. Phys. Lett.* 77:1487-1489.

Gelinck et al. (2004) "Flexible Active-Matrix Displays and Shift Registers Based on Solution-Processed Organic Transistors," *Nat. Mater.* 3:106-110.

Georgakilas et al. (2002) "Wafer-Scale Integration of GaAs Optoelectronic Devices with Standard Si Integrated Circuits Using a Low-Temperature Bonding Procedure," *Appl. Phys. Lett.* 81:5099-5101.

Givargizov, E.I. (1991) "Applications," In; *Oriented Crystallization on Amorphous Substrates*, Plenum Press, New York, pp. 341-363.

Goetting et al. (1999) "Microcontact Printing of Alkanephosphonic Acids on Aluminum: Pattern Transfer by Wet Chemical Etching," *Langmuir* 15:1182-1191.

Goldman et al. (1996) "Correlation of Buffer Strain Relaxation Modes with Transport Properties of Two-Dimensional Electron Gases," *J. Apple. Phys.* 80:6849-6854.

Goldmann et al. (2004) "Hole Mobility in Organic Single Crystals Measured by a "Flip-Crystal" Field-Effect Technique," *J. Appl. Phys.* 96:2080-2086.

Goldsmith, T.H. (Sep. 1990) "Optimization, Constraint, and History in the Evolution of Eyes," *Quart. Rev. Biol.* 65(3):281-322.

Gray et al. (2004) "High-Conductivity Elastomeric Electronics," *Adv. Mater.* 16:393-397.

Gray et al. (Dec. 2001) "Screen Printed Organic Thin Film Transistors (OTFTs) on a Flexible Substrate," *Proc. SPIE* 4466:89-94.

Grayson, T. (2002) "Curved Focal Plane Wide Field of View Telescope Design," *Proc. SPIE* 4849:269-274.

Gruen et al. (Mar. 21, 1994) "Fullerenes as Precursors for Diamond Film Growth Without Hydrogen or Oxygen Additions," *Appl. Phys. Lett.* 65(12):1502-1504.

Gudiksen et al. (Web Release Apr. 18, 2001) "Synthetic Control of the Diameter and Length of Single Crystal Semiconductor Nanowires," *J. Phys. Chem. B* 105:4062-4064.

Guo et al. (Aug. 19, 2002) "Metal-Insulator-Semiconductor Electrostatics of Carbon Nanotubes," *Appl. Phys. Lett.* 81(8):1486-1488.

Gur et al. (2005) "Air-Stable All-Inorganic Nanocrystal Solar Cells Processed from Solution," *Science* 310:462-465.

Gurbuz et al. (Jul. 2005) "Diamond Semiconductor Technology for RF Device Applications." *Solid State Electron.* 49(7):1055-1070.

Haisma et al. (2002) "Contact Bonding, Including Direct-Binding in a Historical and Recent Context of Materials Science and Technology, Physics and Chemistry—Historical Review in a Broader Scope and Comparative Outlook," *Mater. Sci. Eng. R* 37:1-60.

Halik et al. (2004) "Low-Voltage Organic Transistors with an Amorphous Molecular Gate Dielectric," *Nature* 431:963-966.

Hamedi et al. (May 2007) "Towards Woven Logic from Organic Electronic Fibres," *Nat. Mater.* 6:357-362.

Hamilton et al. (2004) "Field-Effect Mobility of Organic Polymer Thin-Film Transistors," *Chem. Mater.* 16:4699-4704.

Han et al. (2005) "Template-Free Directional Growth of Single-Walled Carbon Nanotues on a- and r-Plane Sapphire," *J. Am. Chem. Soc.* 127:5294-5295.

Harada et al. (2001) "Catalytic Amplification of the Soft Lithographic Patterning of Si. Nonelectrochemical Orthogonal Fabrication of Photoluminescent Porous Si Pixel Arrays," *J. Am. Chem. Soc.* 123:8709-8717.

Harkonen et al. (Jun. 8, 2006) "4 W Single-Transverse Mode VECSEL Utilizing Intra-Cavity Diamond Heat Spreader," *Electron Lett.* 42(12):693-694.

He et al. (2005) "Si Nanowire Bridges in Microtrenches: Integration of Growth into Device Fabrication," *Adv. Mater.* 17:2098-2102.

Hillbrog et al. (Web Release Dec. 30, 2003) "Nanoscale Hydrophobic Recovery: A Chemical Force Microscopy Study of UV/Ozone-Treated Cross-Linker Poly(dimethylsiloxane)," *Langmuir* 20(3):785-794.

Hines et al. (2005) "Nanotransfer Printing of Organic and Carbon Nanotube Thin-Film Transistors on Plastic Substrates," *Appl. Phys. Lett.* 86:163101.

Holmes et al. (Feb. 25, 2000) "Control of Thickness and Orientation of Solution-Grown Silicon Nanowires," *Science* 287:1471-1473.

Horn et al. (1992) "Contact Electrification and Adhesion Between Dissimilar Materials," *Science* 256:362-364.

Hoyer, P. (1996) "Semiconductor Nanotube Formation by a Two-Step Template Process," *Adv. Mater.* 8:857-859.

Hsia et al. (2005) "Collapse of Stamps for Soft Lithography Due to Interfacial Adhesion," *Appl. Phys. Lett.* 86:154106.

Hsu et al. (2002) "Amorphous Si TFTs on Plastically Deformed Spherical Domes," *J. Non-Crystalline Solids* 299-302:1355-1359.

Hsu et al. (2003) "Nature of Electrical Contacts in a Metal—Molecule—Semiconductor System," *J. Vac. Sci. Technol. B* 21(4):1928-1935.

Hsu et al. (2004) "Effects of Mechanical Strain on TFTs on Spherical Domes," *IEEE Trans. Electron. Dev.* 51:371-377.

Hsu et al. (Jan. 15, 2004) "Spherical Deformation of Compliant Substrates with Semiconductor Device Islands," *J. Appl. Phys.* 95(2):705-712.

Hu et al. (1997) "Using Soft Lithography to Fabricate GaAs/AIGaAs Heterostructure Field Effect Transistors," *Appl. Phys. Lett.* 71:2020-2022.

Hu et al. (1999) Chemistry and Physics in One Dimension: Synthesis and Properties of Nanowires and Nanotubes, *Acc. Chem. Res.* 32:435-445.

Huang et al. (2001) "Directed Assembly of One-Dimensional Nanostructures into Functional Networks," *Science* 291:630-633.

Huang et al. (2001) "Room-Temperature Ultraviolet Nanowire Nanolasers," *Science* 292:1897-1899.

Huang et al. (2004) "Self-Organizing High-Density Single-Walled Carbon Nanotube Arrays from Surfactant Suspensions," *Nanotechnol.* 15:1450-1454.

Huang et al. (2005) "Nanomechanical Architecture of Strained Bilayer Thin Films: From Design Principles to Experimental Fabrication," *Adv. Mater.* 17(23):2860-2864.

Huang et al. (2005) "Nanowires for Integrated Multicolor Nanophotonics," *Small* 1(1):142-147.

Huang et al. (2005) "Nonlinear Analyses of Wrinkles in a Film Bonded to a Compliant Substrate," *J. Mech. Phys. Solids* 53:2101-2118.

Huang et al. (2005) "Stamp Collapse in Soft Lithography," *Langmuir* 21:8058-8068.

Huang et al. (Jan. 16, 2001) "Catalytic Growth of Zinc Oxide Nanowires by Vapor Transport," *Adv. Mater.* 13(2):113-116.

Huck et al. (2000) "Ordering of Spontaneously Formed Buckles on Planar Surfaces," *Langmuir* 16:3497-3501.

Huie, J.C. (2003) "Guided Molecular Self-Assembly: A Review of Recent Efforts," *Smart Mater. Struct.* 12:264-271.

Huitema et al. (2001) "Plastic Transistors in Active-Matrix Displays," *Nature* 414:599.

Hur et al. (2005) "Organic Nanodelectrics for Low Voltage Carbon Nanotube Thin Film Transistors and Complementary Logc Gates," *J. Am. Chem. Soc.* 127:13808-13809.

Hur et al. (Dec. 2004) "Nanotransfer Printing by Use of Noncovalent Surface Forces: Applications to Thin-Film Transistors that Use Single-Walled Carbon Nanotube Networks and Semiconducting Polymers," *Appl. Phys. Lett.* 85(23):5730-5732.

Hur et al. (Jun. 13, 2005) "Extreme Bendability of Single Walled Carbon Nanotube Networks Transferred From High-Temperature Growth Substrates to Plastic and Their Use in Thin-Film Transistors," *Appl. Phys. Lett.* 243502.

Hutchinson et al. (1992) "Mixed Mode Cracking in Layered Materials," *Adv. Appl. Mech.* 29:63-191.

Imparato et al. (2005) "Excimer Laser Induced Crystallization of Amorphous Silicon on Flexible Polymer Substrates," *Thin Solid Films* 487:58-62.

International Search Report and Written Opinion, Corresponding to International Application No. PCT/US 07/77759, Mailed Apr. 11, 2008.

International Search Report and Written Opinion, Corresponding to International Application No. PCT/2005/014449, Mailed Jul. 3. 2008.

International Search Report and Written Opinion, Corresponding to International Application No. PCT/US07/22959, Mailed Oct. 14, 2008.

International Search Report and Written Opinion, Corresponding to International Application No. PCT/US2009/036192, Mailed Jul. 6, 2009.

International Search Report anf Written Opinion, Corresponding to International PCT Application No. PCT/US05/19354 Mailed Apr. 18, 2007.

Isberg et al. (Sep. 6, 2002) "High Carrier Mobility in Single-Crystal Plasma-Deposited Diamond," *Science* 297:1670-1672.

Islam et al. (Jan. 16, 2003) "High Weight Fraction Surfactant Solubilization of Single-Wall Carbon Nanotubes in Water," *Nano Lett.* 3(2):269-273.

Ismach et al. (2004) "Atomic-Step-Templated Formation or a Single Wall Carbon Nanotube Patterns," *Angew. Chem. Int. Ed.* 43:6140-6143.

Itoh et al. (1991) "Cathodoluminescence Properties of Undoped and Zn-Doped $Al_xGa_{1-x}N$ Grown by Metaloganic Vapor Phase Epitaxy," *Jap. J. Appl. Phys.* 30:1604-1608.

Jabbour et al. (2001) "Screen Printing for the Fabrication of Organic Light-Emitting Devices," *IEEE J. Select. Top. Quantum. Electron.* 7(5):769-773.

Jackman et al. (Aug. 4, 1995) "Fabrication of Submicrometer Features on Curved Substrates by Microcontact Printing," *Science* 269:664-666.

Jacobs et al. (2002) "Fabrication of a Cylindrical Display by Patterned Assembly," *Science* 296:323-325.

Jain et al. (2000) "III-Nitrides: Growth, Characterization, and Properties," *J. Appl. Phys.* 87:965-1006.

Jain et al. (2005) "Flexible Electronics and Displays: High-Resolution, Roll-to-Roll, Projection Lithography and Photoblation processing Technologies for Hiogh-Throughput Production," *Proc. IEEE* 93:1500-1510.

James et al. (1998) "Patterned Protein Layers on Solid Substrates by This Stamp Microcontact Printing," *Langmuir* 14:742-744.

Jang et al. (2006) "Low-Voltage and High-Field-Effect Mobility Organic Transistors with a Polymer Insulator," *Appl. Phys. Lett.* 88:072101.

Javey et al. (2002) "High-κ Dielectrics for Advanced Carbon-Nanotube Transistors and Logic Gates," *Nature Mater.* 1:241-246.

Javey et al. (Aug. 7, 2003) "Ballistic Carbon Nanotube Field-Effect Transistors," *Nature* 424:654-657.

Jenkins et al. (1994) "Gallium Arsenide Transistors: Realization Through a Molecularly Designed Insulator," *Science* 263:1751-1753.

Jeon et al. (1995) "Patterning of Dielectric Oxide Thin Layers by Microcontact Printing of Self-Assembled Monolayers," *J. Mater. Res.* 10:2996-2999.

Jeon et al. (2004) "Fabricating Complex Three-Dimensional Nanostructures with High Resolution Conformable Phase Masks," *Proc. Natl. Acad. Sci.* USA 101:12428-12433.

Jeon et al. (Aug. 4, 2004) "Three Dimensional Nanofabrication with Rubber Stamps and Conformable Photomasks," *Adv. Mater.* 16(15):1369-1373.

Jiang et a. (Oct. 2, 2007) "Finite Deformation Mechanics in Buckled Thin Films on Compliant Supports," *Proc. Natl. Acad. Sci.* USA 104(40):15607-15612.

Jiang et al. (1999) "Preparation of Macroporous Metal Films from Colloidal Crystals," *J. Am. Chem. Soc.* 121:7957-7958.

Jiang et al. (2002) "Polymer-on-Polymer Stamping: Universal Approaches to Chemically Patterned Surfaces," *Langmuir* 18:2607-2615.

Jin et al. (2004) "Scalable Interconnection and Integration of Nanowire Devices Without Registration," *Nano Lett.* 4:915-919.

Jin et al. (2004) "Soft Lithographic Fabrication of an Image Senbsor Array on a Curved Substrate," *J. Vac. Sci. Technol. B* 22:2548-2551.

Joachim et al. (Nov. 30, 2000) "Electronics Using Hybrid-Molecular and Mono-Molecular Devices," *Nature* 408:541-548.

Johnson et al. (1999) "Ordered Mesoporous Polymers of Tunable Pore Size from Colloidal Silica Templates," *Science* 283:963-965.

Jones et al. (Jul./Aug. 2004) "Stretchable Wavy Metal Interconnects," *J. Vac. Sci. Technol. A* 22(4):1723-1725.

Joo et al. (2006) "Low-Temperature Solution-Phase Synthesis of Quantum Well Structures CdSe Nanoribbons," *J. Am. Chem. Soc.* 128(17):5632-5633.

Jortner et al. (2002) "Nanostructured Advanced Materials Perspectives and Directions," *Pure Appl. Chem.* 74(9):1491-1506.

Kagan (1999) "Organic-Inorganic Hybrid Materials as Semiconducting Channels in Thin-Film Field-Effect Transistors," *Science* 286:945-947.

Kagan et al. (2001) "Patterning Organic—Inorganic Thin-Film Transistors Using Microcontact Printed Templates," *Appl. Phys Lett.* 79(21):3536-3538.

Kagan et al. (2003) "Thin Film Transistors—A Historical Perspective," In; *Thin Film Transistors*, Dekker, New York, pp. 1-34.

Kane et al. (2000) "Analog and Digital Circuits Using Organic Thin-Film Transistors on Polyester Substrates," *IEEE Electron. Dev. Lett.* 21:534-536.

Kane et al. (Apr. 2007) "High-Performance Electronics Using Dense, Perfectly Aligned Arrays of Single-Walled Carbon Nanotubes," *Nat. Nanotechnol.* 2(4):230-236.

Kang et al. (2007) "High-Performance Electronics Using Dense, Perfectly Aligned Arrays of Single-Walled Carbon Nanotubes," *Nat. Nanotechnol.* 2:230-236.

Kar et al. (Web Release Feb. 18, 2006) "Shape Selective Growth of CdS One-Dimensional Nanostructures by a Thermal Evaporation Process," *J. Phys. Chem. B.* 110(10):4542-4547.

Kar et al. (Web Release Feb. 8, 2005) "Controlled Synthesis and Photoluminescence Properties of ZnS Nanowires and Nanoribbons," *J. Phys. Chem. B* 109(8):3298-3302.

Kar et al. (Web Release Sep. 28, 2005) "Synthesis and Optical Properties of CdS Nanoribbons," *J. Phys. Chem B.* 109(41):19134-19138.

Karnik et al. (2003) "Lateral Polysilicon $p^+$-p-$n^+$ and $p^+$-n-$n^+$ Diodes," *Solid-State Electronics* 47:653-659.

Karnik et al. (2003) "Multiple Lateral Polysilicon Diodes as Temperature Sensors for Chemical Microreaction Systems," *Jpn. J. Appl. Phys.* 42:1200-1205.

Kato et al. (2004) The Characteristic Improvement of Si(111) Metal-Oxide-Semiconductor Field-Effect Transistor by Long-Time Hydrogen Annealing, *Jpn. J. Appl. Phys.* 43(10):6848-6853.

Katz et al. (2001) "Synthetic Chemistry for Ultrapure, Processable, and High-Mobility Organic Transistor Semiconductors," *Acc. Chem. Res.* 34:359-369.

Katz, H.E. (2004) "Recent Advances in Semiconductor Performance and Printing Processes for Organic Transistor-Based Electronics," *Chem. Mater.* 16:4748-4756.

Kawata et al. (2001) "Finer Features for Functional Microdevices," *Nature* 412:697-698.

Kendall, D.L. (1979) "Vertical Etching of Silicon at Very High Apect Ratios," *Ann. Rev. Mater. Sci.* 9:373-403.

Khan et al. (1993) "High Electron Mobility Transistor Based on a $GaN-Al_xGa_{1-x}N$ Heterojunction," *Appl. Phys. Lett.* 63:1214-1215.

Khang et al. (2006) "A Stretchable Form of Single-Crystal Silicon for High-Performance Electronics on Rubber Substraights," *Science* 311:208-212.

Kilby, J.S. (1976) "Invention of the Integrated Circuit," *IEEE Trans. Electron. Dev.* 23:648-654.

Kim et al. (2000) "Field Emission from Carbon Nanotubes for Displays," *Diamond and Related Mater.* 9(3-6):1184-1189.

Kim et al. (2002) "Nanolithography Based on Patterned Metal Transfer and its Application to Organic Electronic Devices," *Appl. Phys. Lett.* 80:4051-4053.

Kim et al. (2003) "Epitaxial self-assembly of block copolymers on lithographically defined nanopatterned substrates," *Nature* 424:411-414.

Kim et al. (2009) "Optimized Structural Designs for Stretchable Silicon Integrated Circuits," *Small* 5(24):2841-2847.

Kim et al. (Apr. 25, 2008) "Stretchable and Foldable Silicon Integrated Circuits," *Science* 320:507-511.

Kim et al. (Dec. 2, 2008) "Materials and Noncoplanar Mesh Designs for Integrated Circuits with Linear Elastic Responses to Extreme Mechanical Deformations," *Proc. Natl. Acad. Sci. USA* 105(48):18675-18680.

Kim et al. (Jan. 2008) "Complementary Logic Gates and Ring Oscillators Plastic Substrates by Use of Printed Ribbons Single-Crystalline Silicon," *IEEE Electron. Dev. Lett.* 29(1):73-76.

Kim et al. (Nov. 15, 1999) "Direct Observation of Electron Emission Site on Boron-Doped Polycrystalline Diamond Thin Films Using an Ultra-High-Vacuum Scanning Tunneling Microscope," *Appl. Phys. Lett.* 75(20):3219-3221.

Kim et al. (Oct. 2004) "Organic TFT Array on a Paper Substrate," *IEEE Electron. Dev. Lett.* 25(10):702-704.

Kim et al. (Web Release Feb. 29, 2008) "Highly Emissive Self-Assembled Organic Nanoparticles Having Dual Color Capacity for Targeted Immunofluorescence Labeling," *Adv. Mater.* 20(6):1117-1121.

Kim et al. (Web Release Jul. 6, 2009) "Ultrathin Silicon Circuits with Strain-Isolation Layers and Mesh Layouts for High-Performance Electronics on Fabric, Vinyl, Leather and Paper," *Adv. Mater.* 21(36):3703-3707.

Kim, Y.S. (Web Release Aug. 9, 2005) "Microheater-Integrated Single Gas Sensor Array Chip Fabricated on Flexible Polyimide Substrate," *Sens. Actuators B* 114(1):410-417.

Klauk et al. (2002) "High-Mobility Polymer Gate Dielectric Pentacene Thin Film Transistors," *J. Appl. Phys.* 92:5259-5263.

Klein-Wiele et al. (2003) "Fabrication of Periodic Nanostructures by Phase-Controlled Multiple-Beam Interference," *Appl. Phys. Lett.* 83(23):4707-4709.

Knipp et al. (2003) "Pentacine Thin Film Transistors on Inorganic Dielectrics: Morphology, Structural Properties, and Electronic Transport," *J Appl. Phys.* 93:347-355.

Ko et al. (2006) "Bulk Quantities of Single-Crystal Silicon Micro-/Nanoribbons Generated from Bulk Wafers," *Nano Lett.* 6(10):2318-2324.

Ko et al. (Aug. 7, 2008) "A Hemispherical Electronic Eye Camera Based on Compressible Silicon Optoelectronics," *Nature* 454:748-753.

Ko et al. (Web Release Oct. 28, 2009) "Curvilinear Electronics Formed Using Silicon Membrane Circuits and Elastomeric Transfer Elements," *Small* 5(23):2703-2709.

Kocabas et al. (2005) "Guided Growth of Large-Scale, Horizontally Aligned Arrays of Single-Walled Carbon Nanotubes and Their Use in Thin-Film Transstors," *Small* 1(11):1110-1116.

Kocabas et al. (2006) "Spatially Selective Guided Growth of High-Coverage Arrays and Random Networks of Single-Walled Carbon Nanotbes and Thir Integration into Electronic Devices," *J. Am. Chem. Soc.* 128:4540-4541.

Kocabas et al. (Feb. 5, 2008) "Radio Frequency Analog Electronics Based on Carbon Nanotube Transistors," *Proc. Natl. Acad. Sci. USA* 105(5):1405-1409.

Kodambaka et al. (2006) "Control of Si Nanowire Growth by Oxygen," *Nano Lett.* 6(6):1292-1296.

Koide et al. (2000) "Patterned Luminescence of Organic Light-Emitting Diodes by Hot Microcontact Printing (HμCP) of Self-Assembled Monolayers," *J. Am. Chem. Soc.* 122:11266-11267.

Konagai et al. (1978) "High Efficiency GaAs Thin Film Solar Cells by Peeled Film Technology," *J. Cryst. Growth* 45:277-280.

Kong et al. (2004) "Single-Crystal Nanorings Formed by Epitaxial Self-Coiling of Polar Nanobelts," *Science* 303:1348-1351.

Kong et al. (Jan. 28, 2000) "Nanotube Molecular Wires as Chemical Sensors," *Science* 287:622-625.

Kong et al. (Oct. 2003) "Structure of Indium Oxide Nanobelts," *Solid State Commun.* 128(1):1-4.

Kong et al. (Oct. 29, 1998) "Synthesis of Individual Single-Walled Carbon Nanotubes on Patterned Silicon Wafers," *Nature* 395:878-881.

Kudo et al. (Web Release Jun. 13, 2006) "A Flexible and Wearable Glucose Sensor Based on Functional Polymers with Soft-MEMS Techniques," *Biosens. Bioelectron.* 22:558-562.

Kulkarni et al. (2002) "Mesoscale Organization of Metal Nanocrystals," *Pure Appl. Chem* 74(9):1581-1591.

Kumar et al. (1993) "Features of Gold Having Micrometer to Centimeter Dimensions can be Formed Through a Combination of Stamping with an Elastomeric Stamp and an Alkanethiol "Ink" Followed by Chemical Etching," *Appl. Phys. Lett.* 63(14):2002-2004.

Kumar et al. (1994) "Patterning Self-Assembled Monolayers: Applications in Materials Science," *Langmuir* 10:1498-1511.

Kumar et al. (2002) "Thermally-Stable Low-Resistance Ti/Al/Mo/Au Multilayer Ohmic Contacts on n-GaN," *J. Appl. Phys.* 92:1712-1714.

Kuo et al. (1985) "Effect of Mismatch Strain on Band Gap in III-V Semiconductors," *J. Appl. Phys.* 57:5428-5432.

Kuykendall et al. (Aug. 2004) "Crystallographic Alignment of High Density Gallium Nitride Nanowire Arrays," *Nat. Mater.* 3:524-528.

Lacour et al. (2003) "Stretchable Gold Conductors on Elastomeric Substrates," *Appl. Phys. Lett.* 82(15):2404-2406.

Lacour et al. (2005) "Stretchable Interconnects for Elastic Electronic Surfaces," *Proc. IEEE* 93(8):1459-1467.

Lacour et al. (Apr. 2004) "Design and Performance of Thin Metal Film Interconnects for Skin-Like Electronic Circuits," *IEEE Electron. Dev. Lett.* 25(4):179-181.

Lacour et al. (Dec. 2004) "An Elastically Stretchable TFT Circuit," *IEEE Electron Dev. Lett.* 25(12):792-794.

Lacour et al. (Web Release Jul. 14, 2006) "Stiff Subcircuit Islands of Diamondlike Carbon for Stretchable Electronics," *J. Appl. Phys.* 100:014913.

Lacour et al. (Web Release May 16, 2006) "Mechanisms of Reversible Stretchability of Thin Metal Films on Elastomeric Substrates," *Appl. Phys. Lett.* 88:204103.

Laimer et al. (Mar. 1997) "Diamond Growth in a Direct-Current Low-Pressure Supersonic Plasmajet," *Diamond Relat. Mater.* 6:406-410.

Lambacher et al. (2004) "Electrical Imaging of Neuronal Activity by Multi-Transistor-Array (MTA) Recording at 7.8 μm Resolution," *Appl. Phys. A* 79:1607-1611.

Landes et al. (2002) "Some Properties of Spherical and Rod-Shaped Semiconductor and Metal Nanocrystals," *Pure Appl. Chem.* 74(9):1675-1692.

Law et al. (2004) "Semiconductor Nanowires and Nanotubes," *Ann. Rev. Mater. Res.* 34:83-122.

Law et al. (Aug. 27, 2004) "Nanoribbon Waveguides for Subwavelength Photonics Integration," *Science* 305:1269-1273.

Leclercq et al. (1998) "III-V Micromachined Devices for Microsystems," *Microelectronics J.* 29:613-619.

Lecomte et al. (Apr. 2006) "Degradation Mechanism of Diethylene Glycol Units in a Terephthalate Polymer," *Polym. Degrade. Stab.* 91(4):681-689.

Lee et al. (2000) "Thin Film Transistors for Displays on Plastic Substrates," *Solid State Electron.* 44:1431-1434.

Lee et al. (2003) "High-Performance Poly-Si TFTs on Plastic Substrates Using a Nano-Structured Separation Layer Approach," *IEEE Elec. Dev. Lett.* 24:19-21.

Lee et al. (2004)"Organic Light-Emitting Diodes Formed by Soft Contact Lamination," *Proc. Natl. Acad. Sci.* USA 101(2):429-433.

Lee et al. (2005) "A Printable Form of Single-Crystalline Gallium Nitride for Flexable Optoelectronic Systems," *Small* 1:1164-1168.

Lee et al. (2005) "Large-Area, Selective Transfer of Microstructured Silicon (μs-Si): A Printing-Based Approach to High-Performance Thin0Film Transistors Supported on Flexible Substraights," *Adv. Mater.* 17:2332-2336.

Lee et al. (2006) "Micron and Submicron Patterning of Polydimethylsiloxane Resists on Electronic Materials by Decal Transfer Lithography and Reactive Ion-Beam Etching: Application to the Fabrication of High-Mobility, Thin-Film Transistors," *Appl. Phys. Lett.* 100:084907/1-7.

Lee et al. (Apr. 2005) "Fabrication of Stable Metallic Patterns Embedded in Poly(dimethylsiloxane) and Model Applications in Non-Planar Electronic and Lab-on-a-Chip Device Patterning," *Adv. Funct. Mater.* 15(4):557-566.

Lee et al. (Dec. 1999) "The Surface/Bulk Micromachining (SBM) Process: A New Method for Fabricating Released MEMS in Single Crystal Silicon," *J. Microelectromech. Syst.* 8(4):409-416.

Lee et al. (Feb. 2001) "Application of Carbon Nanotubes to Field Emission Displays," *Diamond and Related Mater.* 10(2):265-270.

Lee et al. (Feb. 2005) "Weave Patterned Organic Transistors on Fiber for E-Textiles," *IEEE Trans. Electron. Dev.* 52(2):269-275.

Li et al. (2002) "High-Resolution Contact Printing with Dendrimers," *Nano Lett.* 2(4):347-349.

Li et al. (2003) "Ultrathin Single-Crystalline-Silicon Cantilever Resonators: Fabrication Technology and Significant Specimen Size Effect on Young's Modulus," *Appl. Phys. Lett.* 83:3081-3083.

Li et al. (2004) "Electrospinning of Nanofibers: Reinventing the Wheel," *Adv. Mater.* 16(14):1151-1170.

Li et al. (Dec. 2005) "Compliant Thin Film Patterns of Stiff Materials as Platforms for Stretchable Electronics," *J. Mater. Res.* 20(12):3274-3277.

Li et al. (Jul. 1, 2002) "ZnO Nanobelts Grown on Si Substrate," *Appl. Phys. Lett.* 81(1):144-146.

Li et al. (Web Release Mar. 16, 2006) "Catalyst-Assisted Formation of Nanocantilever Arrays on ZnS Nanoribbons by Post-Annealing Treatment," *J. Phys. Chem. B* 110(13):6759-6762.

Lieber, C. (2001) "The Incredible Shrinking Circuit," *Sci. Am.* 285(3):58-64.

Lieber, C.M. (2003) "Nanoscale Science and Technology: Building a Bog Future from Small Things," *MRS. Bull.* 28:486-491.

Lim et al. (2005) "Flexible Membrane Pressure Sensor," *Sens. Act. A* 119:332-335.

Lima et al. (2007) "Creating Micro- and Nanostructures on Tubular and Spherical Surfaces," *J. Vac. Sci. Technol. B* 25(6):2412-2418.

Lin et al. (2005) "High-Performance Carbon Nanotube Field-Effect Transistor with Tunable Polarities," *IEEE Trans. Nano* 4(5):481-489.

Linder et al. (1994) "Fabrication Technology for Wafer Through-Hole Interconnections and Three-Dimensional Stacks of Chips and Wafers," *Proc. IEEE Micro. Electro Mech. Syst.* 349-354.

Ling et al. (2004) "Thin Film Deposition, Patterning, and Printing in Organic Thin Film Transistors," *Chem. Mater.* 16:4824-4840.

Long et al. (1990) "Heterostructure FETs and Bipolar Transistors," In; *Gallium Arsenide Digital Integrated Circuit Design*, McGraw-Hill, New York, pp. 58-69.

Loo et al. (2002) "Additive, Nanoscale Patterning of Metal Films with a Stamp and a Surface Chemistry Mediated Transfer Process: Applications in Plastic Electronics," *Appl. Physics Lett.* 81:562-564.

Loo et al. (2002) "High-Resolution Transfer Printing on GaAs Surfaces Using Alkane Dithiol Monolayers," *J. Vac. Sci. Technol. B* 20(6):2853-2856.

Loo et al. (2002) "Interfacial Chemistries for Nanoscale Transfer Printing," *J. Am. Chem. Soc.* 124:7654-7655.

Loo et al. (2002) "Soft, Conformable Electrical Contacts for Organic Semiconductors: High-Resolution Plastic Circuits by Lamination," *Proc. Natl. Acad. Sci.* USA 99(16):10252-10256.

Loo et al. (2003) "Electrical Contacts to Molecular Layers by Nanotransfer Printing," *Nano Lett.* 3(7):913-917.

Lopes et al. (Sep. 2004) "Thermal Conductivity of PET/(LDPE/Al) Composites Determined by MDSC," *Polym. Test.*23(6):637-643.

Lu et al. (Dec. 2006) "Electronic Materials-Buckling Down for Flexible Electronics," *Nat. Nanotechnol.* 1:163-164.

Lu et al. (Jul. 19, 2005) "One Dimensional Hole Gas in Germanium/Silicon Nanowire Heterostructures," *Proc. Nat. Acad. Sci.* USA 102(29):10046-10051.

Lu et al. (Nov. 2008) "Nanowire Transistor Performance Limits and Applications," *IEEE Trans Electron Dev.* 55(11):2859-2876.

Luan et al. (1992) "An Experimental Study of the Source/Drain Parasitic Resistance Effects in Amorphous Silicon Thin Film Transistors," *J. Appl. Phys.* 72:766-772.

Ma et al. (2004) "Single-Crystal CdSe Nanosaws," *J. Am. Chem. Soc.* 126(3):708-709.

Mack et al. (2006) "Mechanically Flexible Thin-Film Transistors that Use Ultrathin Ribbons of Silicon Derived from Bulk Wafers," *Appl. Phys. Lett.* 88:213101.

Madou, M. (1997) "Etch-Stop Techniques," In; *Fundamentals of Microfabrication*, CRC Press, New York, pp. 193-199.

Maikap et al. (2004) "Mechanically Strained-Si NMOSFETs," *IEEE Electron. Dev. Lett.* 25:40-42.

Maldovan et al. (2004) "Diamond-Structured Photonic Crystals," *Nature Materials* 3:593-600.

Mandlik et al. (Aug. 2006) "Fully Elastic Interconnects on Nanopatterned Elastomeric Substrates," *IEEE Electron Dev. Lett.* 27(8):650-652.

Manna et al. (Web Release May 25, 2003) "Controlled Growth of Tetrapod-Branched Inorganic Nanocrystals," *Nat. Mater.* 2:382-385.

Markovich et al. (1999) "Architectonic Quantum Dot Solids," *Acc. Chem. Res.* 32:415-423.

Marquette et al. (2004) "Conducting Elastomer Surface Texturing: A Path to Electrode Spotting Application to the Biochip Production," *Biosens. Bioelectron.* 20:197-203.

Martensson et al. (2004) "Nanowire Arrays Defined by Nanoimprint Lithography," *Nano Lett.* 4:699-702.

Martin, C.R. (1995) "Template Synthesis of Electronically Conductive Polymer Nanostructures," *Acc. Chem. Res.* 28:61-68.

Mas-Torrent et al. (2006) "Large Photoresponsivity in High-Mobility Single-Crystal Organic Field-Effect Phototransistors," *ChemPhysChem* 7:86-88.

Masuda et al. (2000) "Fabrication of Ordered Diamonds/Metal Nanocomposite Structures," *Chem. Lett.* 10:1112-1113.

Matsunaga et al. (2003) "An Improved GaAs Device Model for the Simulation of Analog Integrated Circuit," *IEEE Trans. Elect. Dev.* 50:1194-1199.

McAlpine et al. (2003) "High-Performance Nanowire Electronics and Photonics on Glass and Plastic Substrates," *Nano Lett.* 3:1531-1535.

McAlpine et al. (2005) "High-Performance Nanowire Electronics and Photonics and Nanoscale Patterning on Flexible Plastic Substrates," *Proc. IEEE* 93:1357-1363.

McCaldin et al. (1971) "Diffusivity and Solubility of Si in the Al Metallization of Integrated Circuits," *Appl. Phys. Lett.* 19:524-527.

Meisel et al. (2004) "Three-Dimensional Photonic Crystals by Holographic Lithography Using the Umbrella Configuration: Symmetries and Complete Photonic Band Gaps," *Phys. Rev. B.* 70:165101:1-10.

Meitl et al. (2004) "Solution Casting and Transfer Printing Single-Walled Carbon Nanotube Films," *Nano Lett.* 4(9):1643-1947.

Meitl et al. (2006) "Transfer Printing by Kinetic Control of Adhesion to an Elastomeric Stamp," *Nat. Mater.* 5:33-38.

Meitl et al. (Web Release Feb. 22, 2007) "Stress Focusing for Controlled Fracture in Microelectromechanical Systems," *Appl. Phys. Lett.* 90:083110.

Melosh et al. (2003) "Ultrahigh-Density Nanowire Lattices and Circuits," *Science* 300:112-115.

Menard et al. (2004) "A Printable Form of Silicon for High Performance Thin Film Transistors on Plastic Substrates," *Appl. Phys. Lett.* 84:5398-5400.

Menard et al. (2004) "High-Performance n- and p-Type Single-Crystal Organic Transistors with Free-Space Gate Dielectrics," *Adv. Mat.* 16:2097-2101.

Menard et al. (2004) "Improved Surface Chemistries, Thin Film Deposition Techniques, and Stamp Designs for Nanotransfer Printing," *Langmuir* 20:6871-6878.

Menard et al. (2005) Bendable Single Crystal Silicon Thin Film Transistors Formed by Printing on Plastic Substrates *Appl. Phys. Lett.* 86:093507.

Miao et al. (2003) "Micromachining of Three-Dimensional GaAs Membrane Structures Using High-Energy Nitrogen Implantation," *J. Micromech. Microeng.* 13:35-39.

Michel et al. (2001) Printing Meets Lithography: Soft Approaches to High-Resolution Patterning, *IBM J. Res. Dev.* 45(5):697-719.

Miller et al. (2002) "Direct Printing of Polymer Microstructures on Flat and Spherical Surfaces Using a Letterpress Technique," *J. Vac. Sci. Technol. B* 20(6):2320-2327.

Milliron et al. (2004) "Colloidal Nanocrystal Heterostructures with Linear and Branched Topology," *Nature* 430:190-195.

Min, G. (Apr. 4, 2003) "Plastic Electronics and Their Packaging Technologies," *Syn. Metals.* 135:141-143.

Mirkin et al. (Jul. 2001) "Emerging Methods for Micro- and Nanofabrication," *MRS Bull.* 26(7):506-507.

Misewich et al. (May 2, 2003) "Electronically Induced Optical Emission from a Carbon Nanotube FET," *Science* 300:783-786.

Mishra et al. (2002) "AlGaN/GaN HEMTs—an Overview of Device Operation and Applications," *Proc. IEEE* 90:1022-1031.

Mitzi et al. (2004) "High-Mobility Ulltrathin Semiconducting Films Prepared by Spin Coating," *Nature* 428:299-303.

Moon et al. (2002) "Ink-Jet Printing of Binders for Ceramic Compinents," *J. Am. Ceram. Soc.* 85(4):755-762.

Moore et al. (Sep. 9, 2003) "Individually Suspended Single-Walled Carbon Nanotubes in Various Surfactants," *Nano Lett.* 3(10):1379-1382.

Morales et al. (Jan. 9, 1998) "A Laser Ablation Method for the Synthesis of Crystalline Semiconductor Nanowires," *Science* 279:208-211.

Morent et al. (2007) "Adhesion Enhancement by a Dielectric Barrier Discharge of PDMS used for Flexible and Stretchable Electronics," *J. Phys. D. Appl. Phys.* 40:7392-7401.

Mori et al. (1978) "A New Etching Solution System, $H_3PO_4$-$H_2O_2$-$H_2O$, for GaAs and Its Kinetics," *J. Electrochem. Soc.* 125:1510-1514.

Morkoc et al. (1995) "High-Luminosity Blue and Blue-Green Gallium Nitride Light-Emitting Diodes," *Science* 267:51-55.

Morkved et al. (1994) "Mesoscopic Self-Assembly of Gold Islands on Diblock-Copolymer Films," *Appl. Phys. Lett.* 64:422-424.

Morra et al. (1990) "On the Aging of Oxygen Plasma-Treated Polydimethylsiloxane Surfaces," *J. Colloid Interface Sci.* 137:11-24.

Namazu et al. (2000) "Evaluation of Size Effect on Mechanical Properties of Single Crystal Silicon by Nanoscale Bending Test Using AFM," *J. MEMS* 9:450-459.

Nath et al. (2002) "Nanotubes of the Disulfides of Groups 4 and 5 Metals," *Pure Appl. Chem.* 74(9):1545-1552.

Nathan et al. (2000) "Amorphous Silicon Detector and Thin Film Transistor Technology for Large-Area Imaging of X-Rays,." *Microelectron J.* 31:883-891.

Nathan et al. (2002) "Amorphous Silicon Technology for Large Area Digital X-Ray and Optical Imaging," *Microelectronics Reliability* 42:735-746.

Newman et al. (2004) "Introduction to Organic Thin Film Transistors and Design of n-Channel Organic Semiconductors," *Chem. Mater.* 16:4436-4451.

Nirmal et al. (1999) "Luminescence Photophysics in Semiconductor Nanocrystals," *Acc. Chem. Res.* 32:407-414.

Noda et al. (1996) "New Realization Method for Three-Dimensional Photonic Crystal in Optical Wavelength Region," *Jpn. J. Appl. Phys.* 35:L909-L912.

Nomura et al. (2004) "Room-Temperature Fabrication of Transparent Flexible Thin-Film Transistors Using Oxide Semiconductors," *Nature* 432:488-492.

Novoselov et al. (Oct. 22, 2004) "Electric Field Effect in Atomically Thin Carbon Films," *Science* 306:666-669.

O'Connell et al. (Jul. 26, 2002) "Band Gap Fluorescence from Individual Single-Walled Caarbon Nanotubes," *Science* 297:593-596.

O'Riordan et al. (2004) "Field Configured Assembly: Programmed Manipulation and Self-Assembly at the Mesoscale," *Nano Lett.* 4:761-765.

Odom et al. (2002) "Improved Pattern Transfer in Soft Lithography Using Compasite Stamps," *Langmuir* 18:5314-5320.

Office Action Corresponding to Chinese Patent Application No. 200780049982.1, Issued May 12, 2010.

Office Action, Corresponding to Chinese Paten Application No. 200580013574.1, Issued May 11, 2010.

Office Action, Corresponding to Taiwan Patent Application No. 095121212, Issued May 7, 2010.
Office Action, Corresponding to U.S. Appl. No. 11/423,287, Mailed Feb. 13, 2008.
Office Action, Corresponding to U.S. Appl. No. 11/851,182, Mailed Apr. 1, 2010.
Office Action, Corresponding to U.S. Appl. No. 11/981,380, Mailed Sep. 23, 2010.
Office Actions, Corresponding to Chinese Patent Application No. 200580018159.5, Issued Jan. 23, 2009 and Feb. 12, 2010.
Office Actions, Corresponding to U.S. Appl. No. 11/145,542, Mailed between Apr. 5, 2007 and Dec. 23, 2008.
Office Action, Corresponding to U.S. Appl. No. 11/421,654, Mailed Sep. 23, 2010.
Ohzono et al. (2004) "Ordering of Microwrinkle Patterns by Compressive Strain," *Phys. Rev. B* 69(13):132202.
Ohzono et al. (Web Release Jul. 7, 2005) "Geometry-Dependent Stripe Rearrangement Processes Induced by Strain on Preordered Microwrinkle Patterns," *Langmuir* 21(16):7230-7237.
Ong et al. (2004) "High-Performance Semiconducting Poolythiophenes for Organic Thin-Film Transistors," *J. Am. Chem. Soc.* 126:3378-3379.
Ong et al. (2005) "Design of High-Performance Regioreular Polythiophenes for Organic Thin-Film Transistors," *Proc. IEEE* 93:1412-1419.
Origin Energy (May 2004) "Fact Sheet—Sliver Cells," www.originenergy.com.au/sliver.
Ouyang et al. (2002) "High-Performance, Flexible Polymer Light-Emitting Diodes Fabricated by a Continuous Polymer Coating Process," *Adv. Mat.* 14:915-918.
Ouyang et al. (2008) "High Frequency Properties of Electro-Textiles for Wearable Antenna Applications," *IEEE Trans. Antennas Propag.* 56(2):381-389.
Ouyang et al. (Web Release Mar. 20, 2000) "Conversion of Some Siloxane Polymers to Silicon Oxide by UV/Ozone Photochemical Processes," *Chem. Mater.* 12(6):1591-1596.
Pan et al. (2001) "Nanobelts of Semiconducting Oxides," *Science* 291:1947-1949.
Panev et al. (2003) "Sharp Exciton Emission from Single InAs Quantum Dots in GaAs Nanowires," *Appl. Phys. Lett.* 83:2238-2240.
Pardo et al. (2000) "Application of Screen Printing in the Fabrication of Organic Ligh-Emitting Devices," *Adv. Mater.* 12(17):1249-1252.
Park et al. (1997) "Block Copolymer Lithography: Periodic Arrays of ~$10^{11}$ Holes in 1 Square Centimeter," *Science* 276:1401-1404.
Park et al. (1998) "Fabrication of Three-Dimensional Macroporous Membranes with Assemblies of Microspheres as Templates," *Chem. Mater.* 10:1745-1747.
Patton et al. (Mar. 1998) "Effect of Diamond like Carbon Coating and Surface Topography on the Performance of Metal Evaporated Magnetic Tapes," *IEEE Trans Magn.* 34(2):575-587.
Paul et al. (Apr. 2003) "Patterning Spherical Surfaces at the Two Hundred Nanometer Scale Using Soft Lithography," *Adv. Func. Mater.* 13(4):259-263.
Pearton et al. (1999) "GaN: Processing, Defects, and Devices," *J. Appl. Phys.* 86:1-78.
Peng et al. (Mar. 2, 2000) "Shape Control of CdSe Nanocrystals," *Nature* 404:59-61.
Piazza et al. (2005) "Protective Diamond-Like Carbon Coatings for Future Optical Storage Disks," *Diamond Relat. Mater.* 14:994-999.
Podzorov et al. (2005) "Hall Effect in the Accumulation Layers on the Surface of Orgaic Semiconductors," *Phys. Rev. lett.* 95:226601.
Pushpa et al. (2002) "Stars and Stripes. Nanoscale Misfit Dislocation Patterns on Surfaces," *Pure Appl. Chem.* 74(9):1663-1671.
Quake et al (2000) "From Micro- to Nanofabrication with Soft Materials," *Science* 290:1536-1540.
Radtke et al. (Feb. 5, 2007) "Laser-Lithography on Non-Planar Surfaces," *Opt. Exp.* 15(3):1167-1174.
Raman et al. (1989) "Study of Mesa Undercuts Produced in GaAs with $H_3PO_4$-Based Etchants," *J. Electrochem. Soc.* 136:2405-2410.
Razeghi et al. (1994) "High-Power Laser Diodes Based on InGaAsP Alloys," *Nature* 369:631-633.
Razouk et al. (Sep. 1979) "Dependence of Interface State Density on Silicon Thermal Oxidation Process Variables," *J. Electrochem. Soc.* 126(9):1573-1581.
Reuss et al. (2005) "Macroelectronics: Perspectives on Technology and Applications," *Proc. IEEE* 93:1239-1256.
Reuss et al. (Jun. 2006) "Macroelectronics," *MRS Bull.* 31:447-454.
Ribas et al. (1998) "Bulk Micromachining Characterization of 0.2 μm HEMT MMIC Technology for GaAs MEMS Design," *Mater. Sci. Eng. B* 51:267-273.
Ridley et al. (1999) "All-Inorganic Field Effect Transistors Fabricated by Printing," *Science* 286:746-749.
Roberts et al. (1979) "Looking at Rubber Adhesion," *Rubber Chem. Technol.* 52:23-42.
Roberts et al. (May 2006) "Elastically Relaxed Free-Standing Strained-Silicon Nanomembranes," *Nat. Mater.* 5:388-393.
Robinson et al. (1983) "GaAs Readied for High-Speed Microcircuits," *Science* 219:275-277.
Roelkens et al. (Dec. 2005) "Integration of InP/InGaAsP Photodetectors onto Silicon-on-Insulator Waveguide Circuits," *Optics Express* 13(25):10102-10108.
Rogers et al. (1997) "Using an Elastomeric Phase Mask for Sub-100 nm Photolithography in the Optical Near Field," *Appl. Phys. Lett.* 70:2658-2660.
Rogers et al. (1998) "Generating ~90 Nanometer Features Using Near Field Contact Mode Photolithography with an Elastomeric Phase Mask," *J. Vac. Sci. Technol.* 16(1):59-68.
Rogers et al. (1998) "Quantifying Distortions in Soft Lithography," *J. Vac. Sci. Technol.* 16:88-97.
Rogers et al. (1998) "Using Printing and Molding Techniques to Produce Distributed Feedback and Bragg Reflector Resonators for Plastic Lasers," *Appl. Phys. Lett.* 73:1766-1768.
Rogers et al. (1999) Printing Process Suitable for Reel-to-Reel Production of High-Performance Organic Transistors and Circuits, *Adv. Mater.* 11(9):741-745.
Rogers et al. (2000) "Organic Smart Pixels and Complementart Inverter Circuits Formed on Plastic Substrates by Casting and Rubber Stamping," *IEEE Electron Dev. Lett.* 21(3):100-103.
Rogers et al. (2001) "Paper-Like Electronic Displays: Large-Area Rubber-Stamped Plastic Sheets of Electronics and Microencapsulated Electrophoretic Inks," *Proc. Natl. Acad. Sci. USA* 98:4835-4840.
Rogers et al. (2002) "Printed Plastic Electronics and Paperlike Displays," *J. Polym. Sci. Part A. Polym. Chem.* 40:3327-3334.
Rogers, J.A. (2001) "Rubber Stamping for Plastic Electronics and Fiber Optics," *MRS Bulletin* 26(7):530-534.
Rogers, J.A. (2001) "Toward Paperlike Displays," *Science* 291:1502-1503.
Rosenblatt et al. (2002) "High Performance Electrolyte Gated Carbon Nanotube Transistors," *Nano Lett.* 2(8):869-872.
Rotkin et al. (2003) "Universal Description of Channel Conductivity for Nanotube and Nanowire Transistors," *Appl. Phys. Lett.* 83:1623-1625.
Roundy et al. (2003) "Photonic Crystal Structure with Square Symetry within Each Layer and a Three-Dimensional Band Gap," *Appl. Phys Lett.* 82:3835-3837.
Ruchehoeft et al. (2000) "Optimal Strategy for Controlling Linewidth on Spherical Focal Surface Arrays," *J. Vac. Sci. Technol. B* 18(6):3185-3189.
Samuelson et al. (2004) "Semiconductor Nanowires for Novel One-Dimensional Devices," *Physica E* 21:560-567.
Sanyal et al. (2002) "Morphology of Nanostructures Materials," *Pure Appl. Chem.* 74(9):1553-1570.
Sazonov et al. (2005) "Low-Temperature Materials and Thin-Film Transistors for Flexible Electronics," *Proc. IEEE* 93:1420-1428.
Schermer et al. (2005) "Thin-Film GaAs Epitaxial Lift-Off Solar Cells for Space Applications," *Prog. Photovolt. Res. Appl.* 13:587-596.
Schermer et al. (2006) "Photon Confinement in High-Efficiency, Thin Film III-V Solar Cells Obtained by Epitaxial Lift-Off," *Thin Solid Films* 211-512:645-653.
Schmid et al. (2003) "Preparation of Metallic Films on Elastomeric Stamps and Their Application for Contact Processing and Contact Printing," *Adv. Funct. Mater.* 13:145-153.

Schmid et al. (Mar. 25, 2000) "Siloxane Polymers for High-Resolution, High-Accuracy Soft Lithography," *Macromolecules* 33(8):3042-3049.

Schmidt et al. (Mar. 8, 2001) "Thin Solid Films Roll up into Nanotubes," *Nature* 410:168.

Schnable et al. (1969) "Aluminum Metallization; Advantages and Limitations for Integrated Circuit Applications," *IEEE* 57:1570-1580.

Schneider et al. (2008) "Mechanical Properties of Silicones for MEMS," *J. Micromech. Microeng.* 18:065008.

Schon et al. (1995) "Ambipolar Pentacene Field-Effect Transistors and Inverters," *Science* 287:1022-1023.

Schrieber et al. (1998) "The Effectiveness of Silane Adhesion Promotors in the Performance of Polyurethane Adhesives," *J. Adhesion* 68:31-44.

Scorzoni et al. (Oct. 4, 2004) "On the Relationship Between the Temperature coefficient of Resistance and the Thermal Conductance of Integrated Metal Resistors," *Sens Actuators A* 116(1):137-144.

Search and Examination Report, Corresponding to Singapore Patent Application No. 200607372-0, Mailed Oct. 17, 2007.

Search Report, Corresponding to Republic of China (Taiwan) Patent Application No. 094118507, Dated Feb. 24, 2007.

Sekitani et al. (2005) "Bending Experimant on Pentacene Field-Effect Transistors on Plastic Films," *Appl. Phys. Lett.* 86:073511.

Sekitani et al. (Sep. 12, 2008) "A Rubberlike Stretchable Active Matrix Using Elastic Conductors," *Science* 321:1468-1472.

Sen et al. (2002) "Nonequilibrium Processes for Generating Silicon Nanostructures in Single-Crystalline Silicon," *Pure Appl. Chem.* 74(9):1631-1641.

Serikawa et al. (May 1, 2000) "High-Mobility Poly-Si Thin Film Transistors Fabricated on Stainless-Steel Foils by Low-Temperature Processes Using Sputter-Depositions," *Jpn. J. Appl. Phys.* 39:L393-L395.

Servanti et al. (2005) "Functional Pixel Circuits for Elastic AMOLED displays," *Proc. IEEE* 93:1257-1264.

Service, R.F. (Aug. 15, 2003) "Electronic Textiles Charge Ahead," *Science* 301:909-911.

Shan et al. (2004) "From Si Source Gas Directly to Positioned, Electrically Contacted Si Nanowires: The Self-Assembling 'Grow-in-Place' Approach," *Nano Lett.* 4(11):2085-2089.

Sharp et al. (2003) "Holographic Photonic Crystals with Diamond Symmetry," *Phys. Rev. B* 68:205102/1-205102/6.

Sheraw et al. (2002) "Organic Thin-Film Transistor-Driven Polymer-Dispersed Liquid Crystal Displays on Flexible Polymeric Substrates," *Appl. Phys. Lett.* 80:1088-1090.

Shetty et al. (2005) "Formation and Characterization of Silicon Films on Flexible Polymer Substrates," *Mater. Lett.* 59:872-875.

Shi et al. (Sep. 2000) "Synthesis of Large Areas of Highly Oriented, Very Long Silicon Nanowires," *Adv. Mater.* 12(18):1343-1345.

Shi et al. (Web Release Oct. 11, 2001) "Free-Standing Single Crystal Silicon Nanoribbons," *J. Am. Chem. Soc.* 123(44):11095-11096.

Shtein et al. (Oct. 15, 2004) "Direct Mask-Free Patterning of Molecular Organic Semiconductors Using Organic Vapor Jet Printing," *J. Appl. Phys.* 96(8):4500-4507.

Shull et al. (1998) "Axisymmetric Adhesion Tests of Soft Materials," *Macromol. Chem. Phys.* 199:489-511.

Siegel et al. (Web Release Feb. 7, 2007) "Microsolidics: Fabrication of Three-Dimensional Metallic Microstructures in Poly(dimethylsiloxane)," *Adv. Mater.* 19(5):727-733.

Sim et al. (1993) "An Analytical Back-Gate Bias Effect Model for Ultrathin SOI CMOS Devices," *IEEE Trans. Elec. Dev.* 40:755-765.

Sirringhaus et al. (2003) "Inkjet Printing of Functional Materials," *MRS Bull.* 28:802-806.

Sirringhaus et al. (Dec. 15, 2000) "High-Resolution Inkjet Printing of All-Polymer Transistor Circuits," *Science* 290:2123-2126.

Sirringhaus, H. (2005) "Device Physics of Solution-Processed Organic Field-Effect Transistors," *Adv. Mater.* 17:2411-2425.

Smay et al. (2002) "Colloidal Inks for Directed Assembly of 3-D Periodic Structures," *Langmuir* 18:5429-5437.

Smith et al. (2000) "Electric-Field Assisted Assembly and Alignment of Metallic Nanowires," *Appl. Phys. Lett.* 77(9):1399-1401.

Someya et al. (2005) "Conformable, Flexible, Large-Area Networks of Pressure and Thermal Sensors with Organic Transistor Active Matrixes," *Proc. Nat. Acad. Sci.* USA 102:12321-12325.

Someya et al. (2005) "Integration of Organic FETs with Organic Photodiodes for a Large Area, Flexible, and Lightweight Sheet Image Scanners," *IEEE Trans. Electron Devices* 52:2502-2511.

Someya et al. (Jul. 6, 2004) "A Large-Area, Flexible Pressure Sensor Matrix With Organic Field-Effect Transistors for Artificial Skin Applications," *Proc. Nat. Acad. Sci.* USA 101(27):9966-9970.

Soole et al. (Mar. 1991) "InGaAs Metal-Semiconductor-Metal Photodetectors for Long Wavelength Optical Communications," *IEEE J. Quantum Electron.* 27(3):737-752.

Srinivasan et al. (Web Release Mar. 26, 2007) "Piezoelectric/Ultrananocrystalline Diamond Heterostructures for High-Performance Multifunctional Micro/Nanoelectromechanical Systems," *Appl. Phys. Lett.* 90:134101.

Stafford et al. (2004) "A Buckling-Based Metrology for Measuring the Elastic Moduli of Polymeris Thin Films," *Nature Mater.* 3:545-550.

Storm et al. (Web Release Jul. 13, 2003) "Fabrication of Solid-State Nanopores with Single-Nanometre Precision," *Nat. Mater.* 2:537-540.

Strukov et al. (2005) "CMOL FPGA: A Reconfigurable Architecture for Hybrid Digital Circuits with Two-Terminal Nanodevices," *Nanotechnology* 16:888-900.

Sumant et al. (Apr. 2005) "Toward the Ultimate Tribological Interface: Surface Chemistry and Nanotribology of Ultrananocrystalline Diamond," *Adv. Mater.* 17(8):1039-1045.

Sun et al. (2004) "Fabricating Semiconductor Nano/Microwires and Transfer Printing Ordered Arrays of them onto Plastic Substrates," *Nano Lett.* 4:1953-1959.

Sun et al. (2005) "Advances in Organic Field-Effect Transistors," *J. Mater. Chem.* 15:53-65.

Sun et al. (2005) "Bendable GaAs Metal-Semiconductor Field-Effect Transistors Formed with a Printed GaAs Wire Arrays on Plastic Substrates," *Appl. Phys. Lett.* 87:083501.

Sun et al. (2005) "Photolithographic Route to the Fabrication of Micro/Nanowires of III-V Semiconductors," *Adv. Funct. Mater.* 15:30-40.

Sun et al. (2007) "Inorganic Semiconductors for Flexible Electronics," *Adv. Mater.* 19:1897-1916.

Sun et al. (2007) "Structural Forms of Single Crystal Semiconductor Nanoribbons for High-Performance Stretchable Electronics," *J. Mater Chem.* 17:832-840.

Sun et al. (Nov. 2006) "Buckled and Wavy Ribbons of GaAs for High-Performance Electronics on Elastomeric Substrates," *Adv. Mater.* 18(21):2857-2862.

Sun et al. (Web Release Dec. 5, 2006) "Controlled Buckling of Semiconductor Nanoribbons for Stretchable Electronics," *Nature Nanotech.* 1:201-207.

Sundar et al. (2004) "Elastomeric Transistor Stamps: Reversible Probing of CHaarge Transport in Organic Crystals," *Science* 303:1644-1646.

Suo et al. (Feb. 22, 1999) "Mechanics of Rollable and Foldable Film-on-Foil Electronics," *Appl. Phys. Lett.* 74(8):11771179.

Supplementary European Search Report, Corresponding to European Application No. EP 05 75 6327, Completed Sep. 25, 2009.

Swain et al. (2004) "Curved CCD Detector Devices and Arrays for Multi-Spectral Astrophysical Application and Terrestrial Stereo Panoramic Cameras," *Proc. SPIE* 5499:281-301.

Sze et al. (1985) *Semiconductor Devices, Physics and Technology*, $2^{nd}$ ed., Wiley, New York, pp. 190-192.

Sze, S. (1985) "Lithography and Etching," In; *Semiconductor Devices: Physics and Technology*, New York: Wiley, pp. 428-467.

Sze, S. (1988) "Ion Implantation," In; *VLSI Technology*, Mcgraw-Hill, 327-374, 566-611.

Sze, S. (1994) "Semiconductor Sensor Technologies," In; *Semiconductor Sensors*, John Wiley and Sons: New York pp. 17-95.

Takamoto et al. (Jan. 20, 1997) "Over 30% Efficient InGaP/GaAs Tandem Solar Cells," *Appl. Phys. Lett.* 70(3):381-383.

Talapin et al. (Oct. 7, 2005) "PbSe Nanocrystal Solids for n- and p-Channel Thin Film Field-Effect Transistors," *Science* 310:86-89.

Tan et al. (Apr. 12, 2004) "Performance Enhancement of InGaN Light Emitting Diodes by Laser-Lift-off and Transfer from Sapphire to Copper Substrate," *Appl. Phys. Lett.* 84(15):2757-2759.

Tanase et al. (2002) "Magnetic Trapping and Self-Assembly of Multicomponent Nanowires," *J. Appl. Phys.* 91:8549-8551.

Tang et al. (2005) "One-Dimensional Assemblies of Nanoparticles: Preparation, Properties, and Promise," *Adv. Mater.* 17:951-962.

Tao et al. (2003) "Langmuir-Blodgett Silver Nanowire Monolayers for Molecular Sensing Using Surface-Enhanced Raman Spectroscopy," *Nano Lett.* 3:1229-1233.

Tate et al. (2000) "Anodization and Microcontact Printing on Elotroless Silver: Solution-Based Fabrication Procudures for Low-Voltage Electronic Systems with Organic Acitve Components," *Langmuir* 16:6054-6060.

Teshima et al. (2001) "Room-Temperature Deposition of High-Purity Silicon Oxide Films by RF Plasma-Enhanced CVD," *Surf. Coat. Technol.* 146-147:451-456.

Theiss et al. (1998) "PolySilicon Thin Film Transistors Fabricated at 100° C. on a Flexible Plastic Substrate," *IEDM* 98:257-260.

Toader et al. (2004) "Photonic Band Gap Architectures for Holographic Lithography," *Phy. Rev. Lett.* 043905/1-043905/4.

Toader et al. (2004) "Photonic Band Gaps Based on Tetragonal Lattices of Slanted Pores," *Phys. Rev. Lett.* 90:233901/1-233901/4.

Tong (1999) "Stresses in Bonded Wafers," In; *Semiconductor Wafer Bonding: Science and Technology*, John Wiley; New York, pp. 187-221.

Trau et al. (1997) "Microscopic Patterning of Orientated Mesoscopic Silica Through Guided Growth," *Nature* 390:674-676.

Trentler et al. (1995) "Solution-Liquid-Solid Growth of Crytalline III-V Semiconductors: An Analogy to Vapor-Liquid-Solid Growth," *Science* 270:1791-1794.

Tseng et al. (Web Release Dec. 19, 2003) "Monolithic Integration of Carbon Nanotube Devices with Silicon MOS Technology" *Nano Lett.* 4(1):123-127.

Ucjikoga, S. (2002) "Low-Temperature Polycrystalline Silicon Thin-Film Transistor Technologies ofr System-on-Glass Displays," *MRS Bull.* 27:881-886.

Urruchi et al. (2000) "Etching of DLC Films Using a Low Intensity Oxygen Plasma Jet," *Diamond Relat. Mater.* 9:685-688.

Vanhollenbeke et al. (2000) "Compliant Substrate Technology: Integration of Mismatched Materials for Opto-Electronic Applications," *Prog. Cryst. Growth Charact. Mater.* 41(1-4):1-55.

Velev et al. (1997) "Porous silica via colloidal crystallization," *Nature* 389:447-448.

Vilan et al. (2000) "Molecular Control Over Au/GaAs Diodes," *Nature* 404:166-168.

Vlasov et al. (2001) "On-Chip Natural Assembly of Silicon Photonic Bandgap Crystals," *Nature* 414:289-293.

Voss, D. (2000) "Cheap and Cheerful Circuits," *Nature* 407:442-444.

Wagner et al. (2003) "Silicon for Thin-Film Transistors," *Thin Solid Films* 430:15-19.

Wagner et al. (2005) "Electronic Skin: Architecture and Components," *Physica E* 25:326-334.

Wagner et al. (Mar. 1, 1964) "Vapor-Liquid-Solid Mechanism of Single Crystal Growth," *Appl. Phys. Lett.* 4(5):89-90.

Wang et al. (2003) "A Solution-Phase, Precursor Route to Polycrystalline $SnO_2$ Nanowores That Can Be Used for Gas Sensing under Ambient Conditions," *J. Am. Chem. Soc.* 125:16176-16177.

Wang et al. (2005) "Oxidation Resistant Germanium Nanowires: Bulk Synthesis, Long Chain Alkanethiol Functionalization, and Langmuir-Blodgett Assembly," *J. Am. Chem. Soc.* 127(33):11871-11875.

Wang et al. (2006) "Direct Synthesis and Characterization of CdS Nanobelts," *Appl. Phys. Lett.* 89:033102.

Weber et al. (Jan. 2004) "A Novel Low-Cost, High Efficiency Micromachined Silicon Solar Cell," *IEEE Electron Device Lett.* 25(1):37-39.

Wen et al. (Web Release Dec. 4, 2004) "Controlled Growth of Large-Area, Uniform, Vertically Aligned Arrays of $\alpha\text{-}Fe_2O_2$ Nanobelts and Nanowires," *J. Phys. Chem. B* 109(1):215-220.

Whang et al. (2003) "Large-Scale Hierarchical Organization of Nanowire Arrays for Integrated Nanosystems," *Nano Lett.* 3(9):1255-1259.

Williams et al. (Oct. 2006) "Growth and Properties of Nanocrystalline Diamond Films," *Phys. Stat. Sol. A* 203(13):3375-3386.

Williams et al. (Web Release Jan. 23, 2006) "Comparison of the Growth and Properties of Ultranocrystalline Diamond and Nanocrystalline Diamond," *Diamond Relat. Mater.* 15:654-658.

Willner et al. (2002) "Functional Nanoparticle Architectures for Senoric, Optoelectronic, and Bioelectronic Applications," *Pure Appl. Chem.* 74(9):1773-1783.

Wind et al. (May 20, 2002) "Vertical Scaling of Carbon Nanotube-Field-Effect Transitors Using Top Gate Electrodes," *Appl. Phys. Lett.* 80(20):3871-3819.

Won et al. (2004) "Effect of Mechanical and Electrical Stresses on the Performance of an a-Si:H TFT on Plastic Substrate," *J. Electrochem. Soc.* 151:G167-G170.

Wu et al. (2001) "Amorphous Silicon Crystallization and Polysilicon Thin Film Transistors on SiO2 Passivated Steel Foil Substrates," *Apple. Surf. Sci* 175-176:753-758.

Wu et al. (2001) "Thermal Oxide of Polycrystalline Silicon on Steel Foil as a Thin-Film Transitor Gate Dielectric," *Appl. Phys. Lett.* 78:3729-2731.

Wu et al. (2002) "Growth of Au-Catalyzed Ordered GaAs Nanowire Arrays by Molecular-Beam Epitaxy," *Appl. Phys. Lett.* 81:5177-5179.

Wu et al. (2002) "Inorganic Semiconductor Nanowires: Rational Growth, Assembly, and Novel Properties," *Chem. Eur. J.* 8(6):1261-1268.

Wu et al. (2003) "Growth, Branching, and Kinking of Molecular-Beam Epitaxial (110) GaAs Nanowires," *Appl. Phys. Lett.* 83:3368-3370.

Wu et al. (Jul. 1, 2004) "Single-Crystal Metallic Nanowires and Metal/Semiconductor Nanowire Heterostructures," *Nature* 430:61-65.

Wu et al. (Nov. 2002) "Complementary Metal-Oxide-Semiconductor Thin-Film Transistor Circuits from a High-Temperature Polycrystalline Silicon Process on Steel Foil Substrates," *IEEE Trans. Electr. Dev.* 49(11):1993-2000.

Wu et al. (Web Release Jan. 19, 2002) "Block-by-Block Growth of Single-Crystalline Si/SiGe Superlattice Nanowires," *Nano Lett.* 2(2):83-86.

Wu et al. (Web Release Mar. 13, 2001) "Direct Observation of Vapor-Liquid-Solid Nanowire Growth," *J. Am. Chem. Soc.* 123(13):3165-3166.

Xia et al. (1996) "Shadowed Sputtering of Gold on V-Shaped Microtrenches Etched in Silicon and Applications in Microfabrication," *Adv. Mater.* 8(9):765-768.

Xia (1998) "Soft Lithography" *Angew. Chem. Int. Ed.* 37:551-575.

Xia et al. (1998) "Soft Lithography," *Annu. Rev. Mater. Sci.* 28:153-184.

Xia et al. (1999) "Unconventional Methods for Fabricating and Patterning Nanostructures," *Chem. Rev.* 99:1823-1848.

Xia et al. (2003) "One-Dimensional Nanostructures: Synthesis, Characterization and Applications," *Adv. Mater.* 15:353-389.

Xia et al. (Jul. 19, 1996) "Complex Optical Surfaces Formed by Replica Molding Against Elastomeric Masters," *Science* 273:347-349.

Xiang et al. (Mar. 25, 2006) "Ge/Si Nanowire Heterostructures as High-Performance Field-Effect Transistors," *Nature* 441:489-493.

Xie et al. (May 2003) "Polymer-Controlled Growth of $Sb_2Se_3$ Nanoribbons Via a Hydrothermal Process," *J. Cryst. Growth* 252(4):570-574.

Xin et al. (Jun. 2005) "Evaluation of Polydimethylsiloxane Scaffolds with Physiologically-Relevant Elastic Moduli: Interplay of Substrate Mechanics and Surface Chemistry Effects on Vascular Smooth Muscle Cell Response," *Biomaterials* 26(16):3123-3129.

Yang et al. (1997) "Mesoporous Silica with Micrometer-Scale Desgns," *Adv. Mater.* 9:811-814.

Yang et al. (2000) "Stability of Low-Temperature Amorphous Silicon Thin Film Transistors Formed on Glass and Transparent Plastic Substrates," *J. Vac. Sci. Technol. B* 18:683-689.

Yang et al. (2002) "Creating Periodic Three-Dimensional Structures by Multibeam Interface of Visible Laser," *Chem. Mater.* 14:2831-2833.

Yang et al. (Dec. 2007) "RFID Tag and RF Structures on a Paper Substrate Using Inkjet-Printing Technology," *IEEE Trans. Microw. Theory Tech.* 55(12):2894-2901.

Yang, P. (2005) "The Chemistry and Physics of Semiconductor Nanowires," *MRS Bull.* 30:85-91.

Yao et al. (Mar. 2000) "High-Field Effect Electrical Transport in Single-Walled Carbon Nanotubes," *Phys. Rev. Lett.* 84(13):2941-2944.

Yeh et al. (1994) "Fluidic Self-Assembly for the Integration of GaAs Light-Emitting Diodes on Si Substrates," *IEEE Photon. Technol. Lett.* 6:706-708.

Yin et al. (2000) "A Soft Lithography Approach to the Fabrication of Nanostructures of Single Crystalline Silicon with Well-Defined Dimensions and Shapes," *Adv. Mater.* 12:1426-1430.

Yin et al. (2005) "Colloidal Nanocrystal Synthesis and the Organic-Inorganic Interface," *Nature* 437:664-670.

Yoon et al. (2005) "Low-Voltage Organic Field-Effect Transistors and Inverters Enabled by Ultrathin Cross-Linked Polymers as Gate Dielectrics," *J. Am. Chem. Soc.* 127:10388-10395.

Yu et al. (2000) "Silicon Nanowires: preparation, Device Fabrication, and Transport Properties," *J. Phys. Chem. B* 104(50):11864-11870.

Yu et al. (2003) "Solution-Liquid-Solid Growth of Soluble GaAs Nanowires," *Adv. Mater.* 15:416-419.

Yu et al. (2003) "Two- Versus Three-Dimensional Quantum Confinement in Indium Phosphide Wires and Dots," *Nat. Mater.* 2:517-520.

Yuan et al. (2006) "High-Speed Strained-Single-Crystal-Silicon Thin-Film Transistors on Flexible Polymers," *J. Appl. Phys.* 100:013708.

Yurelki et al. (Jul. 24, 2004) "Small-Angle Neutron Scattering from Surfactant-Assisted Aqueous Dispersions of Carbon Nanotubes," *J. Am. Chem. Soc.* 126(32):9902-9903.

Zakhidov et al. (1998) "Carbon Structure with Three-Dimensional Periodicity at Optical Wavelengths," *Science* 282:897-901.

Zaumseil et al. (2003) "Nanoscale Organic Transistors that use Source/Drain Electrodes Supported by High Resolution Rubber Stamps," *Appl. Phys. Lett.* 82(5):793-795.

Zaumseil et al. (2003) "Three-Dimensional and Multilayer Nanostructures Formed by Nanotransfer Printing," *Nano Lett.* 3(9):1223-1227.

Zhang et al. (2005) "Low-Temperature Growth and Photoluminescence Property of ZnS Nanoribbons," *J. Phys. Chem. B* 109(39):18352-18355.

Zhang et al. (Apr. 2003) "Oxide-Assisted Growth of Semiconducting Nanowires," *Adv. Mater.* 15(7-8):635-640.

Zhang et al. (Apr. 5, 2004) "Structure and Photoiluminescence of ZnSe Nanoribbons Grown by Metal Organic Chemical Vapor Deposition," *Appl. Phys. Lett.* 84(14):2641-2643.

Zhang et al. (Feb. 9, 2006) "Electronic Transport in Nanometre-Scale Silicon-onInsulator Membranes," *Nature* 439:703-706.

Zhang et al. (Jun. 6, 2006) "Anomalous Coiling of SiGe/Si and SiGe/Si/Cr Helical Nanobelts," *Nano Lett.* 6(7):1311-1317.

Zhao et al. (Mar. 2007) "Improved Field Emission Properties from Metal-Coated Diamond Films," *Diamond Relat Mater.* 16(3):650-653.

Zheng et al. (2004) "Shape-and Solder-Directed Self-Assembly to Package Semiconductor Device Segments," *Appl. Phys. Lett.* 85:3635-3637.

Zheng et al. (Aug. 31, 2004) "Sequential Shape-and-Solder-Directed Self Assembly of Functional Microsystems," *Proc. Natl. Acad. Sci. USA* 101(35):12814-12817.

Zhou et al. (2002) "An Efficient Two-Photon-Generated Photoacid Applied to Positive-Tone 3D Microfabrication," *Science* 296:1106-1109.

Zhou et al. (2004) "p-Channel, n-Channel Thin Film Transistors and p-n Diodes Based on Single Wall Carbon Nanotube Networks," *Nano Lett.* 4:2031-2035.

Zhou et al. (2005) "Band Structure, Phonon Scattering, and the Performance Limit of Single-Walled Carbon Nanotube Transistors," *Phys. Rev. Lett.* 95:146805.

Zhou et al. (2005) "Mechanism for Stamp Collapse in Soft Lithography," *Appl. Phys. Lett.* 87:251925.

Zhu et al. (2005) "Spin on Dopants for High-Performance Single-Crystal Silicon Transistors on Flexible Plastic Substrates," *Appl. Phys. Lett.* 86:133507.

* cited by examiner

Thermal model assumptions:
GaN HEMT dissipated power: 200 W/cm
Thermal conductivities (W/K cm):

| C | GaN | AlN | Si | SiN | PI |
|---|---|---|---|---|---|
| 15 | 2.3 | 2.85 | 1.3 | 0.2 | 1.5e-3 |

| | $\Delta T_{Junction}$ | $\Delta T_{CMOS}$ | Sink to CMOS Heat Flux ratio |
|---|---|---|---|
| A | 64 °C | NA | NA |
| B | 64 °C | < 1 °C | > 2,000 |
| C | 71 °C | < 1 °C | > 2,000 |

2 μm diamond heat spreader reduces junction temperature by ~11%

PRINTABLE, FLEXIBLE AND STRETCHABLE DIAMOND FOR THERMAL MANAGEMENT

CROSS-REFERENCE TO RELATED APPLICATIONS

This application claims the benefit of U.S. provisional application No. 61/042,162 filed Apr. 3, 2008, which is incorporated by reference in its entirety herein to the extent not inconsistent with the disclosure herein.

STATEMENT REGARDING FEDERALLY SPONSORED RESEARCH OR DEVELOPMENT

This invention was made with government support under DMI-0328162 awarded by the National Science Foundation and under DEFG02-91-ER45439 the U.S. awarded by the Department of Energy. The government has certain rights in the invention.

BACKGROUND OF THE INVENTION

Heat generation is a significant concern with complex electronic components such as integrated circuits (IC's) (e.g., see U.S. Pat. No. 6,667,548). The amount of heat generated by a chip is related to the number of transistors on the device as well as the operation speed of the transistors. As transistor density and operating speed increases, so does heat generation. IC performance and reliability decrease as the temperature increases, so that it is important that the IC has adequate means for dissipating heat from the IC environment. Accordingly, thermal management of such IC's and related electronic components and devices are important so that the operating temperature is maintained at an acceptable level. However, as electronic devices continue to improve in capability and processing speed, requiring greater power demands, further improvements in thermal management are needed. Poor power dissipation is a significant constraint on the ability to develop circuits of continuously higher speed and/or power.

A number of thermal management techniques are known in the art, such as heat spreaders, heat sinks or heat pipes. U.S. Pat. No. 5,313,094 discloses dissipating thermal energy from isolated active silicon regions by filling a trench or hole with chemical vapor deposition (CVD) diamond material. Such heat spreaders and sinks are used to transfer generated heat from the device into the surrounding material, such as air or to a portion of the device where temperature does not affect operating characteristics. Heat sinks known in the art are typically made of a high thermal conductivity material (e.g., copper, aluminum, high thermal conductivity plastic) and may be designed to maximize the surface area exposed to ambient air to allow generated heat to be removed either by natural or forced convection (e.g., cooling fins, pins, etc., see U.S. Pat. No. 5,907,189).

Other thermal dissipation techniques involve etching a trench or hole through an active silicon region and an underlying dielectric layer to a supportive silicon substrate, oxidizing a trench wall, and filling the trench with a high thermal-conductivity material, such as diamond (e.g., see U.S. Pat. No. 7,170,164). Various back-side and front-side trench etching in semiconductor substrate for heat dissipation are known in the art (see, e.g., U.S. Pat. Nos. 7,029,951, 5,753,529, 5,757,081, 5,767,578, 7,170,164, 6,080,608).

Thermal conductivity of diamond is relatively high (e.g., 2200 W/m K, about twenty times greater than silicon and 5.5 times greater than copper) and so has been used in a number of applications as a heat sink or thermal regulating material (see, e.g., U.S. Pat. Nos. 5,648,148, 7,067,903, 7,170,164, 5,313,094, 5,907,189, 5,525,815). Diamond is also useful because it is readily formed through processes such as chemical vapor deposition (CVD) and by other attachment or deposition processes. Diamond need not be pure, but rather must have a higher thermal conductivity than the substrate to which the diamond is connected.

One disadvantage of conventional thermal dissipation techniques and devices is that those platforms are rather inflexible, with a result that fracture or other breakage occurs if the material is bent or strained. Accordingly, for applications where shape change is desired, such as in the field of flexible electronics or flexible integrated electronic devices on plastic substrates, thermal management can be difficult to achieve. In particular, the means for thermal regulation must be compatible with the flexible characteristics of the electronic system. Because thermal management techniques known in the art are inherently inflexible, they are generally not compatible with the field of flexible electronics. Conventional brittle thermal management systems cannot be integrated into an electronic device (e.g., flexible displays, electronic textiles, electronic skin) capable of deforming into many different shapes.

Another disadvantage is the difficulty in integrating diamond materials with products made using wafer-scale manufacturing. Thick diamond films on silicon substrates are always highly stressed unless great care is taken to minimize such stress by tailoring the deposition temperature and growth chemistry. Such processes inhibit further processing of the wafer due to excessive wafer bow (curvature of the wafer surface). Integration of other thin film materials with diamond further complicates the integration of diamond into products. Presented herein are various processes to circumvent these issues by integration of diamond as a thermal management material at the device level, which both maximizes the effectiveness of the diamond as a heat spreader and minimizes the amount of (relatively expensive) diamond needed to reduce the temperature of the active device to safe levels. Such integration can also occur at points closer to the end of the manufacturing sequence, thereby reducing the need for massive production redesign and thus facilitating earlier adoption of the technology.

SUMMARY OF THE INVENTION

The systems and methods provided herein utilize diamond as a thermally conductive element to dissipate heat build-up by heat-generating components. The ability to transfer print diamond patterns provides a unique capability to precisely tailor thermal contact to areas corresponding to substantial heat generation and attendant temperature increase. This not only provides improved and more efficient heat transfer, but also reduces the amount of diamond required to achieve thermal cooling of a heat-sensitive component. In a similar fashion, other characteristics of diamond such as durability, hardness, wear resistance, index of refraction, modulus, chemical inertness and biocompatibility may be combined with the printing processes provided herein to achieve desired functionality of a device or device component.

Transfer printing of diamond patterns to achieve thermal regulation provides the ability to integrate diamond with thermally-regulated components that are flexible. Traditional thermal regulators relying on diamond or other thermally conductive materials are generally used in a manner whereby their relatively brittle properties make them prone to mechanical failure when bent or stretched. Disclosed herein are platforms having diamond patterned in a bent or wavy configuration so that the diamond is capable of being bent, folded or otherwise stressed without fracturing. The diamond, however, remains in thermal contact with the heat-generating component, being either printed directly onto such components, or such as via a substrate to which each of the diamond and heat-generating component are thermally connected. Accordingly, any of the methods provided herein may be used to print buckled diamond patterns that remain capable of thermal regulation even while subjected to shape-deforming forces. This is increasingly important as the complexity and power requirement of components within a flexible electronic device continuously increase.

To facilitate thermal regulation by diamond on device substrates incompatible with high-temperature processing (e.g., plastics, semiconductor dies attached to a substrate with a low melting point solder or epoxy), the diamond is optionally deposited on a different substrate than the device substrate. The diamond is then patterned as desired and printed to the device substrate by transfer printing, including such as those methods and systems disclosed in U.S. patent application Ser. Nos. 11/851,182, 11/145,574, 11/145,542, 11/423,287, 61/033,886.

In an embodiment, the invention relates to a heat-sinked electronic component. Electronic component is used broadly herein and may refer to an individual electronic component or a plurality of individual components packaged in a chip (e.g., an integrated circuit) or any other component that generates heat within an electronic device. Heat-sinking is accomplished, at least in part, by providing a diamond material that is capable of conducting heat in a manner that increases heat dissipation. In an aspect, transfer printing of diamond provides package-level integration of diamond into a conduction path that removes heat from a substrate to the environment surrounding the package. For example, the diamond material is in thermal contact with a substrate capable of supporting an electronic component. In an aspect, a portion of the diamond may not be in direct thermal contact with the substrate, but instead is thermally connected to another portion that is in thermal contact with the substrate. In this aspect, a diamond region that is not in direct physical contact with the substrate may nevertheless be within a heat path that transfers heat from heat-generating regions to heat dissipating regions. In an aspect the diamond is a micropattern of diamond. In an aspect the diamond is in a buckled geometry, with portions of diamond bonded to a substrate and other portions not bonded and physically separated from the substrate.

In another aspect, the diamond itself is an active component, such as an active component integrated with the device, component, or a layer thereof. In an aspect, the diamond has a thickness less than or equal to 2 µm The exact composition of the diamond is not necessarily critical to achieve the desired function of thermal regulation. In an embodiment the diamond is a CVD diamond material. In another embodiment the diamond is an ultrananocrystalline diamond. In an aspect the diamond is a single crystal diamond. Diamond films with smaller grain sizes have reduced thermal conductivity relative to natural diamond, but over a broad compositional range still have conductivities much greater than copper and other materials.

The actual geometric configuration of the micropattern can be tailored to the heat-generating characteristics or temperature distribution of the electronic component. Accordingly, in regions that are susceptible to a large amount of heat generation, the micropattern may be constructed to maximize thermal contact in those regions. Similarly, for those regions where temperature is not expected to change significantly (or where such temperature changes do not impact device or component performance) there may not need to be any diamond or any diamond footprint is minimal. Accordingly, in an aspect the diamond printing step comprises high-fidelity, registered printing where the diamond pattern corresponds to a pattern of regions susceptible to heat generation effects. In an aspect, the micropattern comprises a plurality of microstructures, such as an array of microstructures. The pattern itself may further have a passive heat-radiating element, such as large surface area fins or radiators for releasing heat from the diamond micropattern to surrounding ambient region or a heat-sink material. These passive elements may be made of diamond, non-diamond, or both. In an aspect, microstructure refers to those structures having at least one dimension that is between 200 nm and 1 mm, or between 200 nm and 1 µm.

For those embodiments where flexibility is desired, any of the micropatterns optionally have at least a portion that is buckled. For example, the micropattern may comprise a plurality of ribbons, each ribbon having a period, phase and amplitude. Depending on the operating conditions, such as magnitude and/or type of stress/strain that will be exerted on the component, the buckle variables are accordingly selected. The electronic component itself is optionally flexible. In an aspect, the invention is further described functionally where the heat-sinked component is capable of undergoing a strain without fracture. In an embodiment, this strain is about 20%, 15%, 10% or 5%.

In an aspect, any of the electronic components disclosed herein are supported by a substrate top surface, and at least a portion of the micropattern of diamond is bonded to the substrate bottom surface.

The systems described herein are useful for thermally-regulating any number of heat-generating components, such as an electronic component that is an integrated circuit; a transistor; a diode; a microprocessor; a light-emitting device; a semiconductor laser array; a logic gate array; a solar cell, a power amplifier, a low-noise amplifier, microelectromechanical systems (MEMS) device, passive devices such as filters, resistors, inductors, or capacitors and any combinations thereof.

In an aspect, the diamond is in physical contact with the electronic component and/or with the substrate. In another aspect, the diamond is in thermal contact, physical contact, or both, with the functional component. In another aspect, the electronic component has at least a portion of the diamond integrated with the functional component.

In another aspect, any of the electronic components provided herein comprise a plurality of stacked electronic components.

In an embodiment, the diamond micropattern comprises a plurality of substantially parallel ribbons, wherein the ribbons have a width that is less than 100 µm.

In another aspect, the invention is a method of making any of the devices disclosed herein, such as a method of manufacturing an electronic device capable of thermal regulation. A substrate capable of supporting a device or a device component that generates heat is provided. A micropattern of diamond is printed on at least a portion of a surface of the substrate. The diamond is in thermal contact with the substrate so that a change in substrate temperature from the generated heat results in a change in diamond temperature, thereby providing thermal regulation of the electronic device. In other words, heat in the substrate (generated by a heat-generating component) is capable of being at least substantially dissipated by the micropattern of diamond. This dissipation can be purely passive such as by heat conduction through the diamond micropattern where it is either radiated to the environment or directed to a specific heat sink material. The dissipation may further comprise an active component, such as a heat sink that itself is temperature-controlled, or by a means for cooling or otherwise temperature-controlling the diamond micropattern. In an embodiment, the micropattern of diamond is thermally connected to a heat sink, such as a thermally-conductive metal (e.g., copper). In an aspect, at least a portion of the diamond is in physical contact with the substrate.

In an aspect, at least a portion of the micropattern of diamond is connected to a substrate surface that is different than the surface to which the device or device component is attached or supported. Any of the methods and components provided herein may have a substrate, diamond, or both substrate and diamond of any desired thickness. In an embodiment, the substrate has a thickness that is greater than 400 nm and less than 50 µm, or any subrange thereof, such as a thickness that is less than or equal to 2 µm. In an embodiment, the substrate surface supporting the device or device component is opposite the surface that establishes thermal contact with the micropattern of diamond. Such a configuration can assist in ensuring the diamond does not adversely impact operation of any electronic component.

Any of the methods provided herein may be used to make an electronic device that is flexible. For example, a heat-sinked electronic device that is bendable and/or stretchable. In an aspect, the micropattern of diamond is capable of bending or stretching without fracture by making at least a portion of the micropattern of diamond that is buckled.

The methods and systems can have a micropattern of diamond shape as desired to best match the heat generating characteristics of the heat-generating components. Alternatively, the diamond micropattern can have a geometrical configuration to take advantage of other diamond properties such as wear resistance, hardness, high modulus, optical properties (e.g., low IR, visible, UV absorption; index of refraction) and electrical properties (e.g., high or low electrical resistivity, high breakdown field). For example, the micropattern is optionally a structured array of elements, a grid geometry, a distribution of islands, or other pattern that tailors a physical property of diamond to the desired application. Examples of applications include, but are not limited to, situations where device wear, durability, hardness, flexibility and/or optical property (e.g., index of refraction for waveguides and other optical devices) is a concern. Accordingly, the diamond-based printing methods provided herein are capable of use and compatible with any number of a wide range of applications.

Any of the methods provided herein optionally use contact printing to generate or transfer the micropattern of diamond that is operably connected with the device, device component or substrate supporting the device or device component, including various printing processes described in U.S. patent application Ser. Nos. 11/851,182, 11/145,574, 11/145,542, 11/423,287, to provide the desired performance characteristic to the device (e.g., thermal dissipation; hardness; high modulus; index of refraction; bendability; wear resistance, chemical inertness, biocompatibility, field emitter of electrons).

In addition to passive diamond microtips and patterns, another embodiment is the use of the transfer printing technique to integrate active diamond devices with other electronic components and substrates that are traditionally incompatible with each other. Such active diamond devices include diamond electronics (diamond transistors), diamond MEMS structures, such as cantilevers, microtip arrays, SAW (surface acoustic wave) filters, BAW filters (Bulk acoustic wave), acoustic resonators, accelerometers, micro-mirror arrays, and biosensors. A specific example is an RF front-end consisting of diamond RF filters, RF switches, low-noise amplifiers, mixers, oscillators, and passive components, combined to process the radio frequency signal between the antenna and the baseband components. The RF front end may be further integrated with ADC/DAC components and a CPU to form the working components of a mobile phone. Similar constructs are also used for phased array radars and RFID tags, and may be more effectively and economically integrated together on flexible and non flexible substrates using patterning, transfer printing processes and related systems as provided herein and in copending application Ser. Nos. 11/001,689 (filed Dec. 1, 2004), 11/151,954 (filed Apr. 27, 2005), 11/145,574 (filed Jun. 2, 2005), 11/145,542 (filed Jun. 2, 2005), 11/675,659 (filed Feb. 16, 2007), 11/465,317 (filed Aug. 17, 2006), 11/465,317 (filed Aug. 17, 2006), 11/423,192 (filed Jun. 9, 2007), 11/421,654 (filed Jun. 1, 2006), 11/858,788 (filed Sep. 20, 2007), 11/851,182 (filed Sep. 6, 2007), 11/981,380 (filed Oct. 31, 2007), 61/033,886 (filed Mar. 5, 2008), each of which are specifically incorporated by reference for transfer printing processes, systems and/or material or substrate patterning.

Other printing methods known in the art are used as desired, such as solution printing, liquid printing, or inkjet printing.

In an embodiment, the printing step is achieved by providing a diamond layer supported by a supporting substrate and patterning the diamond layer to generate a desired pattern, such as a micropattern. At least a portion of the patterned diamond layer is contacted with an elastomer stamp receiving surface. The patterned diamond layer is removed by lifting the stamp in a direction that is away from the supporting substrate, thereby transferring at least a portion of the patterned diamond layer to the elastomer stamp receiving surface. This accordingly "inks" the stamp with the patterned diamond. The inked stamp is contacted with the substrate that is to be thermally regulated. The stamp is removed in a direction that is away from the substrate, thereby transferring the patterned diamond layer to the substrate surface. In this fashion, thermal contact is achieved between the patterned diamond layer and the substrate to which any number of heat-generating components are connected. In an aspect the diamond layer is at least partially ultrananocrystalline diamond.

To facilitate improved fidelity and pattern transfer, any patterned diamond layer optionally has tether or anchor regions for controlled transfer of a portion of the patterned diamond layer from the supporting substrate to the elastomer stamp surface.

In an embodiment, at least a portion of the micropattern of diamond is buckled, thereby facilitating thermally-regulated heat-generating components that are shapeable, bendable, flexible or stretchable. In an aspect, the buckling is achieved by providing the elastomer stamp receiving surface with a first level of strain and bonding at least a portion of the patterned diamond layer to the stamp receiving surface. A force is applied to the elastomer stamp to generate a change in the level of strain of the receiving surface from the first level to a second level of strain different than the first level of strain. The change in the level of strain in the stamp causes the patterned diamond layer to bend, thereby generating a buckled micropattern of diamond. The magnitude of this strain change, or how the change is accomplished, does not particularly matter so long as the change in the level of strain in the substrate from the first level to the second level causes the diamond to bend, thereby generating a diamond pattern having regions that are bonded to the substrate and other regions provided in a bent configuration (e.g., having a different vertical position than the bonded ends). For example, any of the first level of strain or the second level of strain is optionally equal to zero.

In an embodiment, the step of bonding at least a portion of the patterned diamond layer to the stamp receiving surface occurs after the step of applying the force to the elastomer stamp to generate the second level of strain.

In another embodiment, the substrate surface in thermal contact with the micropattern of diamond has a pattern of bond sites that bond the substrate surface with the diamond, thereby facilitating a stronger adhesive force between the diamond and the substrate.

Bonding of the diamond to the substrate is by any suitable means. In an embodiment, the bonding step comprises generating a pattern of bonded and non-bonded regions in the diamond pattern, wherein the bonded regions of the diamond are bonded to the elastomeric substrate and wherein the non-bonded regions of the diamond are not bonded to the elastomeric substrate.

To facilitate bonding of the diamond surface to the elastomer and/or substrate surface, the surface chemistry of the diamond is manipulated using a number of techniques as desired. As-grown diamond is normally hydrogen terminated and hydrophobic, but when exposed to air collects water molecules which also form hydroxyl groups. The surface can be converted to a hydrophilic state by changing the surface termination to predominately hydroxyl (—OH) termination. Such manipulations in the surface chemistry can be performed immediately prior to transfer printing of the diamond in which the printing process itself may need to be performed in an inert gas environment to further control and preserve the surface chemistry of the diamond.

To facilitate bonding and transfer of the diamond to the elastomer and/or the substrate the diamond surface roughness is optionally reduced by polishing or by the deposition of a thin film (metal, oxide) that is subsequently polished using, for instance, chemical mechanical polishing. Self-leveling polymers, such as BCB (benzocyclobutene) may also be applied to the diamond surface to reduce roughness and tailor the surface chemistry to facilitate the transfer printing process.

In another aspect, non-bonded regions correspond to central regions of the diamond, wherein the step of applying the force to the elastomeric substrate causes the central regions to bend such that at least a portion of the central region of each diamond structure or pattern portion is not in physical contact with the substrate. In an aspect, the step of applying the force to the elastomeric substrate causes central regions to bend such that at least a portion of the central region of a diamond structure is not in physical contact with the substrate.

In an embodiment, any of the methods for making a buckled diamond further comprises generating a pattern of bonding sites on the diamond, the receiving surface of the elastomeric substrate or on both the diamond and the receiving surface of the elastomeric substrate and/or device substrate.

In another embodiment, any of the methods or devices has an elastomeric substrate with a plurality of compliant regions and a plurality of rigid regions. Such a substrate provides flexural rigidity of the compliant regions that is less than that of the rigid regions, and optionally have the first and second ends of a diamond structure bonded to at least one of the rigid regions and a central region of each of the diamond structure bonded to at least one of the compliant regions. Use of this substrate type provides the capacity of achieving controllable buckling of the diamond based on the pattern of compliancy of the underlying substrate.

In an embodiment, the force applied to the elastomeric substrate is achieved mechanically. In an aspect of this embodiment, the first level of strain, the second level of strain or both are generated by elongating or compressing the elastomeric substrate, curing the elastomeric substrate, or by thermal means, such as by raising or lowering the temperature of the elastomeric substrate, or by thermal expansion or thermally induced contraction of the elastomeric substrate.

In another embodiment, the step of bonding the diamond to the receiving surface of the elastomeric substrate is carried out before the step of applying a force to the elastomeric substrate that generates a change in the level of strain of the substrate from the first level to a second level of strain different than said first level. Alternatively, the step of bonding is carried out after the step of applying a force to the elastomeric substrate that generates a change in the level of strain of the substrate from the first level to a second level of strain different than the first level.

In an aspect, the device component is a diode, light emitting diode, transistor, a laser, a solar cell, a power amplifier, an integrated circuit, or any other components that generate heat or whose performance may be susceptible or degrade with increasing temperature.

In another aspect, the invention is capable of efficiently and reliably printing a pattern of diamond over a relatively large area of a substrate surface. For example, the pattern of diamond optionally covers a substrate footprint area that is greater than 1 $mm^2$ and less than 100 $cm^2$. The printing is particularly useful for achieving high placement accuracy for operating conditions requiring precise placement of heat-dissipating elements. In an embodiment, the pattern of diamond is transferred to a selected region of the substrate with a placement accuracy that is better than 25 μm over the substrate footprint area that is less than or equal to 5 $cm^2$.

Other aspects of the invention relate to devices in which any of the electronic components of the present invention are incorporated. Particularly useful devices include flexible devices that are susceptible or prone to heat generation and in which to preserve operating lifetime and performance heat dissipation is desired. Examples include displays, solar cells, smart textiles, etc. In addition, the invention provides flexible diamond structures that may be incorporate into these flexible devices, or components thereof. In other embodiments, methods are provided for making printable diamond patterns that can be used in any of the methods or devices described herein, such as for thermal dissipation by heat-generating devices and device components.

In another aspect, the invention provides transfer printing of slabs of diamond, such as single crystal diamond that is obtained from homoepitaxial or HPHT (high pressure high temperature) material followed by a release process. The release process optionally involves bombardment of the sample with ions to create a graphitized layer at a user-selected depth from the surface, followed by chemical release of this layer.

In another aspect, the invention is a device or method related to multiply stacked layers of thermal diamond with active devices. For example, applications requiring more aggressive thermal dissipation can have a first diamond layer that is relatively thick, with a heat-generating active device printed to be in thermal contact with the relatively thick diamond layer, such as in physical contact with the thick diamond layer. A relatively thin, more conformal diamond layer may be printed on top of this heat-generating active device, such as in thermal or physical contact with the active device. In this geometrical configuration, the relatively thin "top" diamond layer can spread the heat away from the top of the device and redirect it down into the thicker diamond layer. In effect, the thicker bottom layer functions as a heat sink, whereas the top thinner layer conducts heat away from the device. Optionally, substrate layers are used as needed between adjacent layers.

In another aspect, provided is a stretchable diamond material capable of dissipating heat, the stretchable diamond material comprising a first end, a second end; and a central region disposed between the first and second ends. The diamond material is supported by a substrate, wherein the first end and second end are bonded to the substrate, and at least a portion of the central region has a bent configuration. In an aspect, the central region is separated from the substrate by a separation distance.

In an embodiment, the geometry of the bent configuration is further described by one or more physical parameters, such as, the central region bent configuration having an amplitude selected from a range that is greater than 100 nm and less than 1 mm, or a diamond thickness that is less than 1 mm. In another aspect, the diamond has a pattern comprising a plurality of ribbon microstructures.

Also provided are heat-sinked stretchable device comprising any of the stretchable diamond materials disclosed herein.

In another aspect, provided are electronic devices having an integrated active diamond device, made by any of the methods provided herein. In an embodiment, one or more active diamond device on a first substrate are fabricated. The active diamond devices are printed onto a second substrate that supports a second device, thereby integrating the fabricated diamond device with a second device, wherein the printing step is by transfer printing. Examples of active diamond device include, but are not limited to, a MEMS device, a transistor, a diode, a solar cell, a field electron emitter, an electrochemical electrode, a biosensor, a filter, and an oscillator. In an embodiment, the device comprises multiple layers of thermal diamond with active devices.

In an embodiment, any of the diamond layers provided herein is also configured to simultaneously provide good electrical insulation properties (at RF frequencies) along with excellent thermal dissipation for an electrical device, such as a high-powered RF device. In an embodiment, the thermal dissipation and electrical insulation are provided by a unitary diamond layer. In an embodiment, different diamond layers are used to functionally achieve thermal dissipation and electrical insulation for a high power RF device, such as a diamond layer that is between the heat-sinked electronic component and a conductive substrate. In an aspect, the diamond layer is not in direct physical contact with the conductive substrate or the electronic component, but optionally has one or more layers interspersed therein. In an aspect, the diamond layer providing electrical insulation has a low loss tangent at the frequency at which the device typically operates, such as in the MHz to THz range. In the aspect where the high power RF device is a GaN HEMTs the frequency range is in the 10 GHz-1 THz range. This embodiment is one example of leveraging multiple physical characteristics of a diamond material to achieve multiple benefits such as thermal dissipation and electrical insulation. Electrical insulation is used to refer to diamond providing a functional benefit to the device that is at least partially electrically isolated from a conductive material.

DETAILED DESCRIPTION OF THE INVENTION

Figure 1:
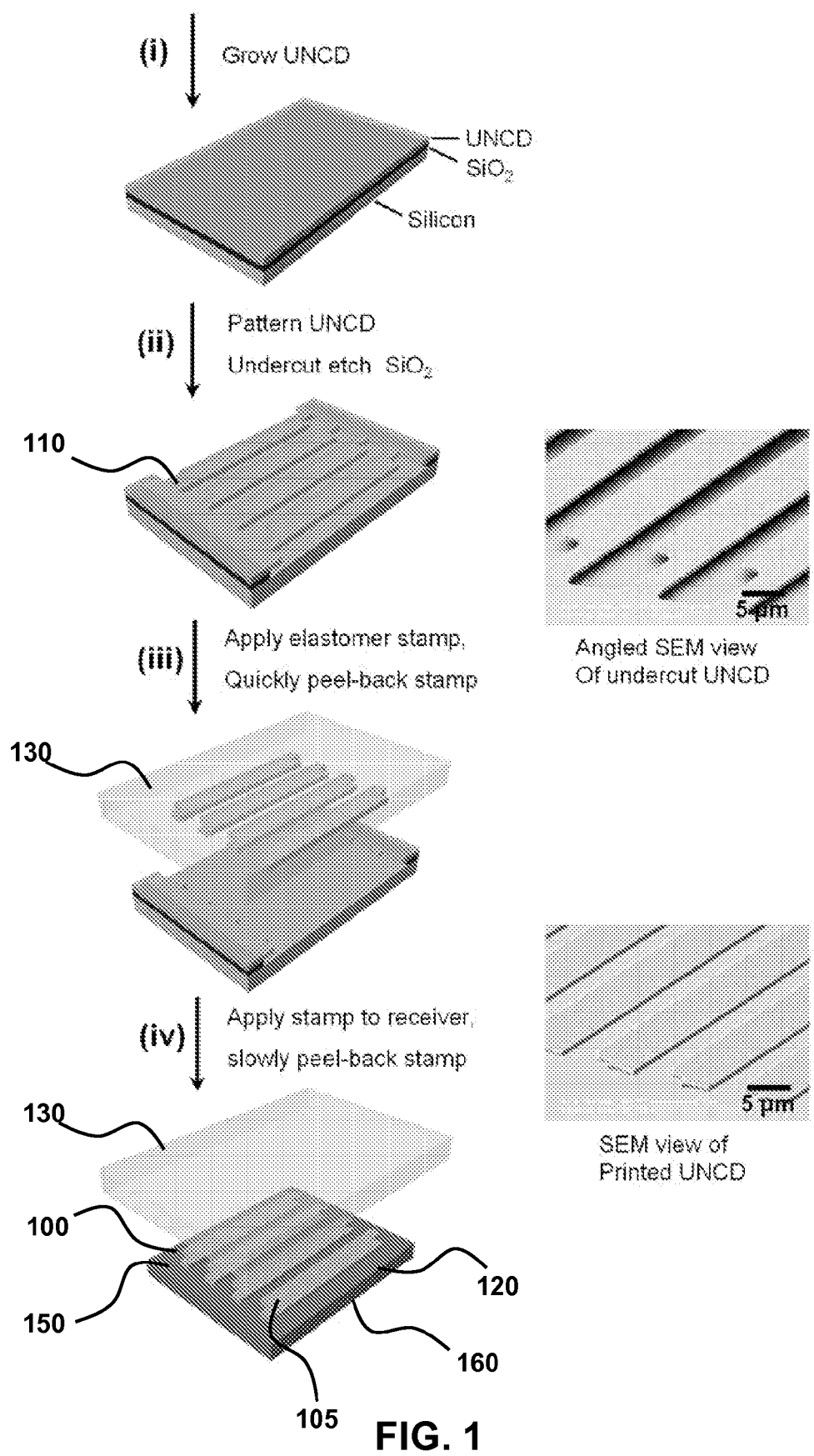
FIG. 1 Schematic summarizing processing steps for creating microstructures of thin film ultrananocrystalline diamond and for transferring these elements from a growth substrate to a target substrate using a printing technique.

"Heat-sinked" refers to a passive, active or both passive and active element that facilitates heat transfer from a heat-generating component, such as an electronic component, to either a part of the component that is not sensitive to high temperature or to the surrounding medium (e.g., air). A "heat sink" refers to an element capable of receiving a significant amount of heat without a significant increase in temperature in a heat-sensitive device or component. Examples include relatively large volumes of good heat conductors, such as copper or other metals, for example. A heat sink may also refer to ambient air surrounding a heat radiating-element, such as patterned microstructures disclosed herein that may be shaped into arrays of heat-radiating fins, for example. The exact composition of the material is not important, so long as the heat sink is capable of removing heat from the heat-sensitive electronic component, thereby effectively decreasing the operating temperature of the electronic component.

Transistors, diodes, and capacitors are examples of electrical or "electronic components" that may be combined with the thermal management processes provided herein to yield improved temperature regulation and/or isolation. Furthermore, an electronic component may itself be a device, such as a solar cell, array of transistors, integrated circuits, flexible fabrics or displays or any other relatively complex combination of electronic components. The component may be, without limitation, a passive or active circuit element, or an integrated circuit chip.

"Diamond" is used broadly to refer to natural and synthetic diamond such as polycrystalline diamond including ultrananocrystalline diamond made by methods known in the art, such as by chemical vapor deposition (CVD) (see, e.g., U.S. Pat. No. 5,907,189) or plasma jet deposition systems (see, e.g., U.S. Pat. Nos. 5,648,148, 4,471,003, 4,487,162 and 5,204,144). Other methods may be used as desired, so long as a layer of diamond is deposited on a substrate, such as a layer that is less than about 1 µm thick. "Nanocrystalline" refers to a diamond having nanoscale grain sizes, and "ultrananocrystalline" refers to grain sizes on the order of between about 1 and 10 nm, or between about 3 and 5 nm, for example. Those of skill in the art will recognize that various suitable types of diamond are useful in the devices and processed, depending on the desired thermal conductivity (e.g., relatively low or relatively high). Other properties of the diamond, such as the surface roughness and stress of the film, may be optimized at the expense of the thermal conductivity of the films in order to facilitate transfer printing and integration with other materials. In addition, dielectric properties (e.g., relative dielectric constant, dielectric strength, loss tangent at high frequencies) are optimized as desired for a given device operation frequency range.

"Pattern" refers to a spatial variation in a material, such as the depth or thickness of a material that varies over a surface. "Pattern" may also refer to a parameter of a material that varies over a surface. A specific diamond pattern is selected depending on the application for which the diamond is used. "Micropattern" refers to one or more structures having at least one dimension on the micrometer scale, such as less than 1000 µm, 100 µm, 10 µm, or a dimension that is selected from a range of 100 nm to 100 µm, or any range therein as desired. In particular, a micropattern can have a spatially-varying pattern of elements, such as strategic placement of one or more heat-conducting or wear-resistant elements such as diamond. A plurality of such elements is referred to as a pattern of "microstructures." In another aspect, micropattern refers to a situation where the height or depth of a single structure varies over at least a portion of the surface location of the substrate to which the micropattern thermally contacts. The diamond is of any thickness, as desired, depending on operating conditions, parameters and heat generation, for example. In an embodiment, the diamond has a thickness that is thin, such as less than 100 µm, less than 10 µm, less than 1 µm or less than 500 nm. "Feature" is used broadly to refer to a diamond element in thermal contact with a device, device component or substrate region to provide thermal dissipation. Such a feature may be free-standing on a surface, or alternatively may itself be connected to other elements, conduits or other diamond features for additional physical support or thermal dissipation. Particularly useful features include those that are shaped to maximize heat exchange such as fins or heat radiators. Other features are selected to take advantage of a desired diamond property, such as diamond's relative hardness, wear resistance, physical characteristics (e.g., modulus) or index of refraction. The particular pattern or micropattern is selected so that any one or more of these characteristics provide the desired "performance characteristic" to a device. For example, where the desired performance characteristic is to increase the hardness of a device, diamond may be printed to coat regions of the device where increased hardness is desired. Similar patterned diamond printing is performed to provide a performance characteristic related to an optical property, mechanical property, flexibility, thermal dissipation, or other diamond-based parameters of interest.

A "pattern of bond sites" refers to spatial application of bonding means to a supporting substrate surface and/or to the diamond so that a supported diamond has bond regions and non-bond regions with the substrate. For example, a diamond ribbon that is bonded to the substrate at its ends and not bonded in a central portion. Further shape control is possible by providing an additional bond site within a central portion, so that the not-bonded region is divided into two distinct central portions. Bonding means can include adhesives, adhesive precursors, welds, photolithography, photocurable polymer. In general, bond sites can be patterned by a variety of techniques, and may be described in terms of surface-activated ($W_{act}$) areas capable of providing strong adhesive forces between substrate and feature (e.g., interconnect) and surface-inactive ($W_{in}$) where the adhesive forces are relatively weak. A substrate that is adhesively patterned in lines may be described in terms of $W_{act}$ and $W_{in}$ dimensions. Those variables, along with the magnitude of prestrain, $\in_{pre}$ affect interconnect geometry.

"Thermal contact" refers to the ability of two materials that are capable of substantial heat transfer from the higher temperature material to the lower temperature material, such as by conduction. Bent structures resting on a substrate are of particular use in providing regions that are in thermal contact (e.g., bond regions) with the substrate and other regions that are not in thermal contact (e.g., regions that are insulated and/or physically separated from the substrate). Thermal contact refers to two elements that are in physical contact with each other. Alternatively, thermal contact refers to two materials that are not in direct physical contact with each other, but instead may be separated by another material (e.g., air, adhesive coating, etc.). The term is used broadly to refer to the functionality such that the material can dissipate heat build-up, with an end result of decreasing or substantially abolishing the temperature increase that would otherwise occur.

"Buckled" refers to micropattern that has a separation distance from the substrate to which the micropattern is thermally connected that varies. For example, ribbons of diamond whose separation from the substrate varies along the length of the ribbon. Such a geometry can be described as buckled or "wavy." In an aspect, that geometry can be obtained by exerting a force (e.g., a strain) on diamond by exerting a force on an underlying deformable substrate (e.g., stamp surface used to transfer the diamond micropattern), such that a change in a dimension of the underlying substrate generates buckles or waves in the diamond. Accordingly, an individual diamond ribbon may be defined by portions that are bonded to a target substrate, and a curved central portion between the ends that does not physically contact the substrate (e.g., are not bonded to the substrate). "Curved" or "buckled" refers to relatively complex shapes, such as by a diamond pattern having one or more additional bond regions in the central portion. "Arc-shaped" refers to a generally sinusoidal shape having an amplitude, where the amplitude corresponds to the maximum separation distance between the diamond micropattern and the substrate surface.

"Flexible" refers to a material that is capable of undergoing strain, such as bending or stretching, without adverse impact of physical characteristics, such as irreversible break-down associated with material fracture, for example. "Stretchable" is used in a similar manner to refer to reversible strain without material fracture.

"Strain" is defined as: $\in = \Delta L/L$ for lengths changed from L (at rest) to $L+\Delta L$ (under an applied force), where $\Delta L$ is the displacement distance from resting. Axial strain refers to a force applied to an axis of the substrate to generate the displacement $\Delta L$. Strain is also generated by forces applied in other directions, such as a bending force, a compressive force, a shearing force, and any combination thereof. Strain or compression may also be generated by stretching a curved surface to a flat surface, or vice versa. "Level of strain" refers to the magnitude of the strain and can range from negative (corresponding to compression) to zero (relaxed state) to positive (corresponding to elongation or stretching). Strain is related to a material's "Young's modulus" and applied stress. Young's modulus is a mechanical property of a material, device or layer which refers to the ratio of stress to strain for a given substance. Young's modulus may be provided by the expression;

$$E = \frac{(stress)}{(strain)} = \left(\frac{L_0}{\Delta L} \times \frac{F}{A}\right); \quad (II)$$

wherein E is Young's modulus, $L_0$ is the equilibrium length, $\Delta L$ is the length change under the applied stress, F is the force applied and A is the area over which the force is applied. Young's modulus may also be expressed in terms of Lame constants via the equation:

$$E = \frac{\mu(3\lambda + 2\mu)}{\lambda + \mu}; \quad (III)$$

wherein $\lambda$ and $\mu$ are Lame constants. High Young's modulus (or "high modulus") and low Young's modulus (or "low modulus") are relative descriptors of the magnitude of Young's modulus in a give material, layer or device. Compression is used herein in a manner similar to the strain, but specifically refers to a force that acts to decrease a characteristic length, or a volume, of a substrate, such that $\Delta L<0$.

Contact printing methods for assembling, organizing and/or integrating printable elements, such as diamond patterns, in the present methods include dry transfer contact printing, microcontact or nanocontact printing, microtransfer or nanotransfer printing and self assembly assisted printing, as known in the art. Various patents, patent applications and publications are hereby incorporated by reference for various transfer methods, stamps, printing, and related materials, processes and devices, including "Pattern transfer printing by kinetic control of adhesion to an elastomeric stamp" Ser. No. 11/423,192 (41-06 filed Jun. 9, 2006).

"Registered transfer" refers to a substantially one-to-one transfer of elements from one substrate surface to a second surface, such as from a donating to a receiving surface. To assist in registered transfer of diamond microstructures a "bridge" may be etched in the patterned diamond to facilitate controlled breakage and lift-off of the diamond structure. Examples of such a bridge are illustrated by the tethers and anchors in FIG. 1 that connect to-be-transferred diamond elements with diamond regions that have not been undercut etched. Other bridge geometries are provided as needed depending on the geometry of the diamond elements to-be-printed.

The invention may be further understood by the following non-limiting examples. All references cited herein are hereby incorporated by reference to the extent not inconsistent with the disclosure herewith. Although the description herein contains many specificities, these should not be construed as limiting the scope of the invention but as merely providing illustrations of some of the presently preferred embodiments of the invention. For example, thus the scope of the invention should be determined by the appended claims and their equivalents, rather than by the examples given.

EXAMPLE 1

Thin film diamond has many potential applications in electronics[1] and optoelectronics,[2,3] microelectromechanical systems (MEMS),[4,5] wear resistant coatings[6], thermal management[7] and other areas, due to its exceptional electronic, optical, mechanical, chemical/tribological and thermal properties, respectively.[8-11] Diamond is most commonly implemented in these systems by directly growing the material on the surfaces of device substrates, where it is used as uniform or lithographically patterned films. This approach places restrictions on the range of applications because known growth techniques involve high temperatures, vacuum or low pressure conditions and often other demanding conditions.[12,13] Implementing thin film diamond on low temperature plastics, for example, is not possible. Large area substrates are also not well matched to capabilities of existing deposition techniques, and is particularly cost ineffective when the diamond is only required at sparse coverage. This example presents etching and printing techniques that avoid some of these and other limitations. Results demonstrate the ability to integrate films, platelets, ribbons and other microstructures of ultrananocrystalline diamond (UNCD) with plastic, rubber, glass and other substrates. Certain of these systems provide mechanically bendable and even stretchable structural forms of UNCD. Implementation as efficient heat spreaders on flexible plastic sheets is a representative application for the approaches disclosed herein.

FIG. 1 shows the main processing steps for forming and printing micropattern of diamond 100 comprising, in this example, microstructures 105 of thin films of UNCD, referred to as μs-UNCD. First, chemical vapor deposition with methane as a carbon source[14, 15] forms a uniform film (400 nm thick) of UNCD on a $SiO_2$ (1 μm)/Si substrate. This process, which involves continuous renucleation during growth, leads to films with nanoscale grain sizes (3~5 nm) and other interesting properties.[15, 16] Next, plasma enhanced chemical vapor deposition (PECVD) creates a layer of $SiO_2$ (300 nm thick) on top of the UNCD. Photolithography and reactive ion etching (RIE) with a $CF_4$ plasma defines a pattern in this $SiO_2$ layer. RIE with an $O_2$ plasma removes both the photoresist and the exposed UNCD. The $SiO_2$ on top of and beneath the patterned UNCD is then removed with concentrated hydrofluoric acid (HF 49%). With appropriate pattern geometries, controlled etching allows the UNCD structures to be undercut completely, but in a manner that keeps them tethered to the substrate to prevent their removal into the etching bath. For the case illustrated in FIG. 1, these tethers, or 'anchors' 110, consist of narrow regions at the ends of ribbons of UNCD. The printing step involves first contacting a substrate processed in this manner with a slab of an elastomer (i.e. the stamp 130), to establish a conformal wetting contact with the top surface of the µs-UNCD through the action of van der Waals forces.[17] Peeling the stamp away from the substrate at a high rate leads to the selective fracture of the UNCD structures at points of stress concentrations that form at the anchors,[18] thereby removing these structures from their growth substrate. The stamp, inked with µs-UNCD in this manner, then delivers these elements to a target substrate 120, such as plastic, glass, rubber or a semiconductor wafer, in a room temperature process that involves contact and then peel back of the stamp at a slow rate. The transfer is optionally aided either by a thin adhesive layer on the substrate or by an adhesiveless, shear force technique that directs separation at the interface between the stamp and the UNCD. Substrate 120 has a top surface 150 and a bottom surface 160. Optionally, the micropattern of diamond is bonded to bottom surface 160 and an electronic component is connected to the top surface 150.

Figure 2:
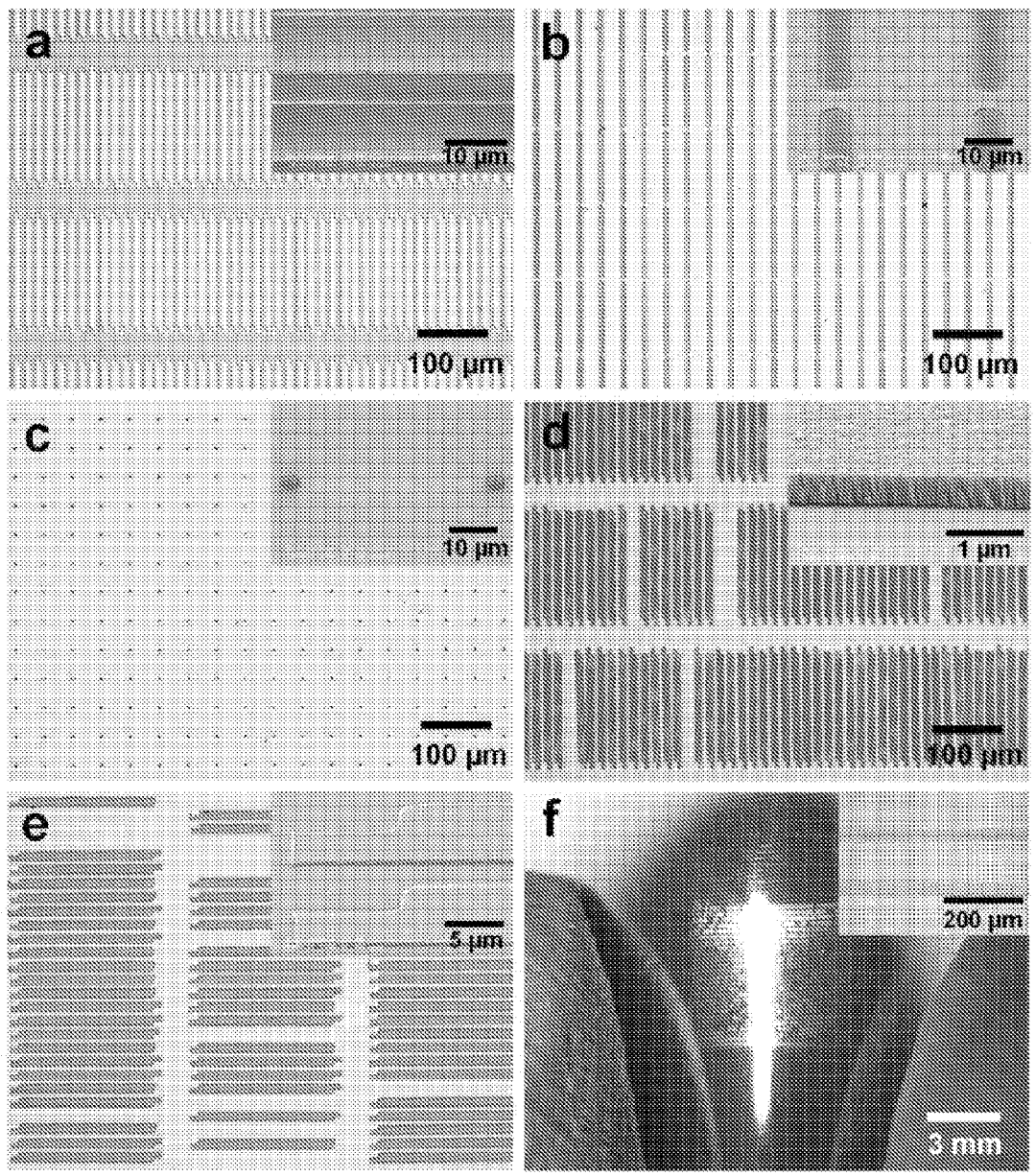
FIG. 2 Optical microscope images and scanning electron microscope images (inset) of transfer-printed UNCD microstructures. a) Isolated ribbons on glass. b) I-shaped structures on glass. c) Membrane printed on glass. d) Isolated ribbons on GaAs. e) Isolated ribbons on Si. f) Photo of ribbons on PET, in a bent configuration.

FIG. 2 shows scanning electron and optical microscope images of diverse classes of thin (400 nm in this example) diamond microstructures, including membranes (FIG. 2c; square array of 3 µm diameter holes separated by 40 µm to enable SiO$_2$ undercut etching) interconnected meshes (FIG. 2b; I-shapes with widths and lengths of 25 and 100 µm) and arrays of isolated ribbons (FIGS. 2a, d, e and f; widths and lengths of 10 and 175 µm, respectively), printed with poly (dimethylsiloxane) stamps (PDMS; Dow Corning) onto various substrates, including glass (FIGS. 2a, b, c), GaAs (FIG. 2d), silicon (FIG. 2e), and plastic (polyethyleneterephthalate, PET, with 100 µm thickness; FIG. 2f). For cases other than the PET and GaAs, a thin, spin-cast layer (~1.0 µm) of benzocyclobutene (BCB, CYCLOTENE 3022-35 Resin, Dow Chemical) served as an adhesive layer to receive the printed µs-UNCD. Adhesiveless printing was used for GaAs, silicon and PET, in which the transfers were facilitated by (i) the large differences in surface energies of the target substrates (43 mJ/m$^2$ for PET, 1140 mJ/m$^2$ for Si, 860 mJ/m$^2$ for GaAs and 19.8 mJ/m$^2$ for the PDMS),[19,20] (ii) viscoelastic effects associated with low rates for peeling back the stamps, [21] (iii) the low roughness on the bottom surfaces of the µs-UNCD elements (root-mean-squared (rms) roughness of ~1.8 nm, as measured by atomic force microscopy with a standard tip) and the receiving substrates (rms: 0.22 nm for Si, 0.25 nm for GaAs, 0.45 nm for glass and 38 nm for PET), and (iii) shear forces to facilitate crack formation at the PDMS/UNCD interface. The topsides of the UNCD structures exhibit the nanometer-scale roughness characteristic of UNCD, while the undersides are smooth.[22] The high printing yields (85%> in all cases) and the uniformity of the fracture points associated with the isolated ribbons (FIGS. 2a, d and e) are evidence of well controlled, repeatable processes.

The results of FIG. 2f indicate the ability to bend, without cracking, the µs-UNCD when placed on a thin plastic sheet. In this case, the small thicknesses of both the substrate and the µs-UNCD lead to small strains at the surface for moderately small bend radii. The strain, ∈, in the diamond is approximately equal to:

$$\frac{h_P}{2r}\left[1 - \frac{E_D h_D}{E_P h_P} + \left(\frac{E_D h_D}{E_P h_P}\right)^2\right] \times 100\%$$

where $E_P$ and $h_P$, and $E_D$ and $h_D$ are modulus and thickness of PET substrate and diamond, respectively; r is the bending radius. For the bending radius (r~2 cm), PET thickness ($h_P$~100 µm) and diamond thickness ($h_D$~400 nm) corresponding to the image of FIG. 2f, and peak strain in the diamond is ∈—0.17%, well below the fracture point. Structural configurations that combine thin, flexible geometries such as these with 'wavy' shapes can impart mechanical stretchability to these elements, in strategies that are conceptually similar to those recently described for single crystalline elements of Si, GaAs and other materials.[23,24] (see also U.S. patent application Ser. No. 11/851,182, filed Sep. 6, 2007 (134-06)) FIGS. 3a and b show optical and scanning electron microscope images of arrays of substantially parallel ribbons 180 that are buckled or wavy UNCD, created by transfer printing these elements onto a prestrained (~4.8% created by heating to 180° C.) substrate of PDMS followed by release of this prestrain.[25] The distances between the ribbons in this case are sufficiently small that mechanical coupling results in phase coherent buckling patterns. The waves have uniform, periodic structures with wavelengths of 85.2, and 86.3 µm for prestrains of 4.8 and 3.9%, respectively. The prestrain dependent wavelength values agree well with other experimental observations and accurate models of the mechanics.[23,26] FIG. 3c presents optical images of stretchable diamond ribbons (the sample prepared with 4.78% prestrain) with various levels of strain at compressed, unperturbed, and stretched states. For applied compressive strains larger than ~5%, some cracking of the UNCD was observed (FIG. 3c). We conducted theoretical analysis of the wavy structures, comprising 400 nm thick UNDC film, 30 nm thick SiO$_2$ film with Young's modulus and Poisson's ratio of 94 GPa and 0.33, respectively, and 4 mm thick PDMS substrate with Young's modulus and Poisson ratio of 2 MPa and 0.48, respectively. If we assume a Poisson's ratio of 0.07 for the diamond, analysis based on the observed buckling wavelengths yields a Young's modulus for the UNDC of 780 GPa, consistent with reports based on conventional mechanical testing techniques.[23,27]

Figure 3:
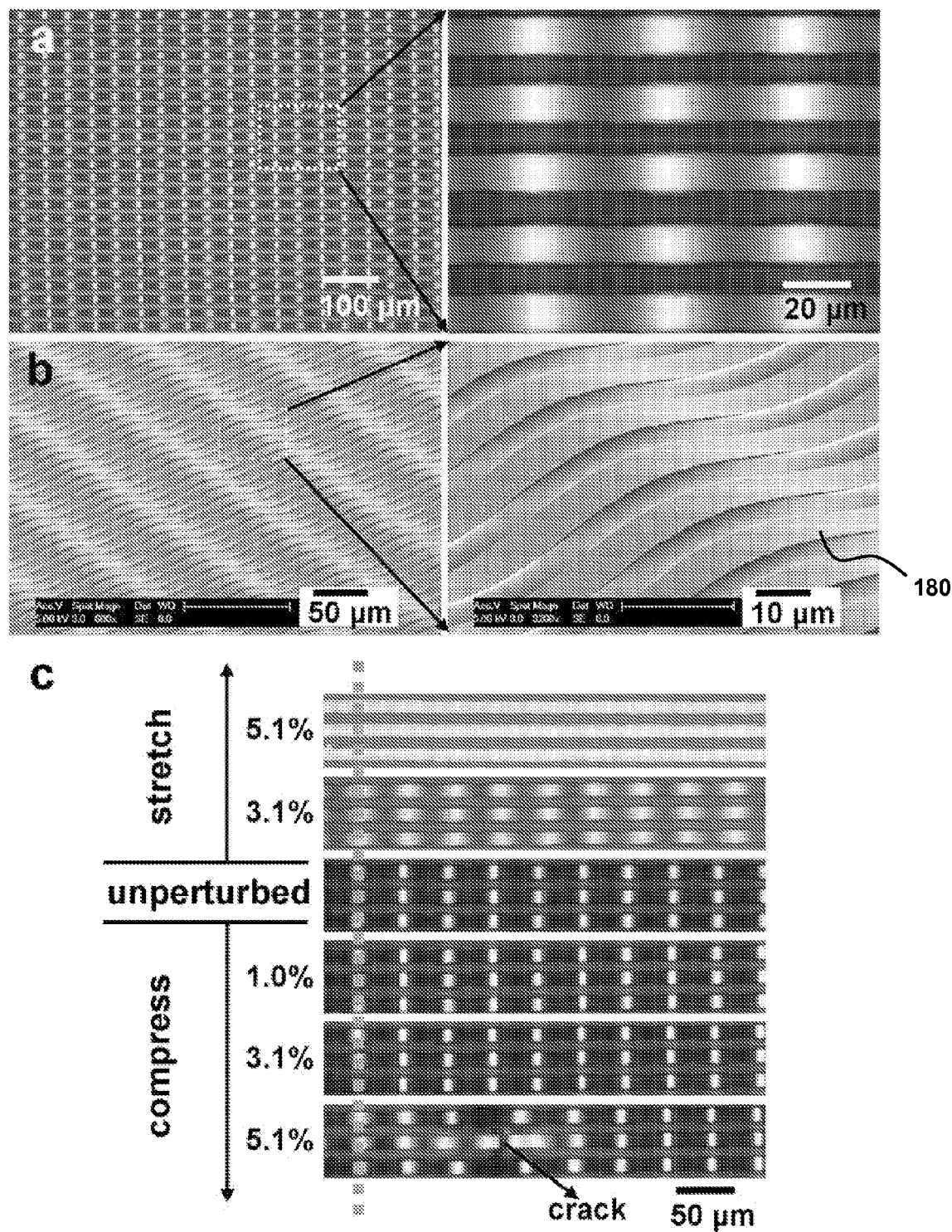
FIG. 3 'Wavy' diamond ribbons on a rubber substrate. a) Optical microscope top-view images of wavy diamond ribbons on PDMS. b) Angled-view SEM images of wavy diamond ribbons from the array shown in a). c) Optical images of wavy diamond ribbons on PDMS under different applied strains: −5.1%, −3.1%, −1.0%, 3.1%, and 5.1% from the unperturbed state, evaluated along the lengths of the ribbons.
Figure 4:
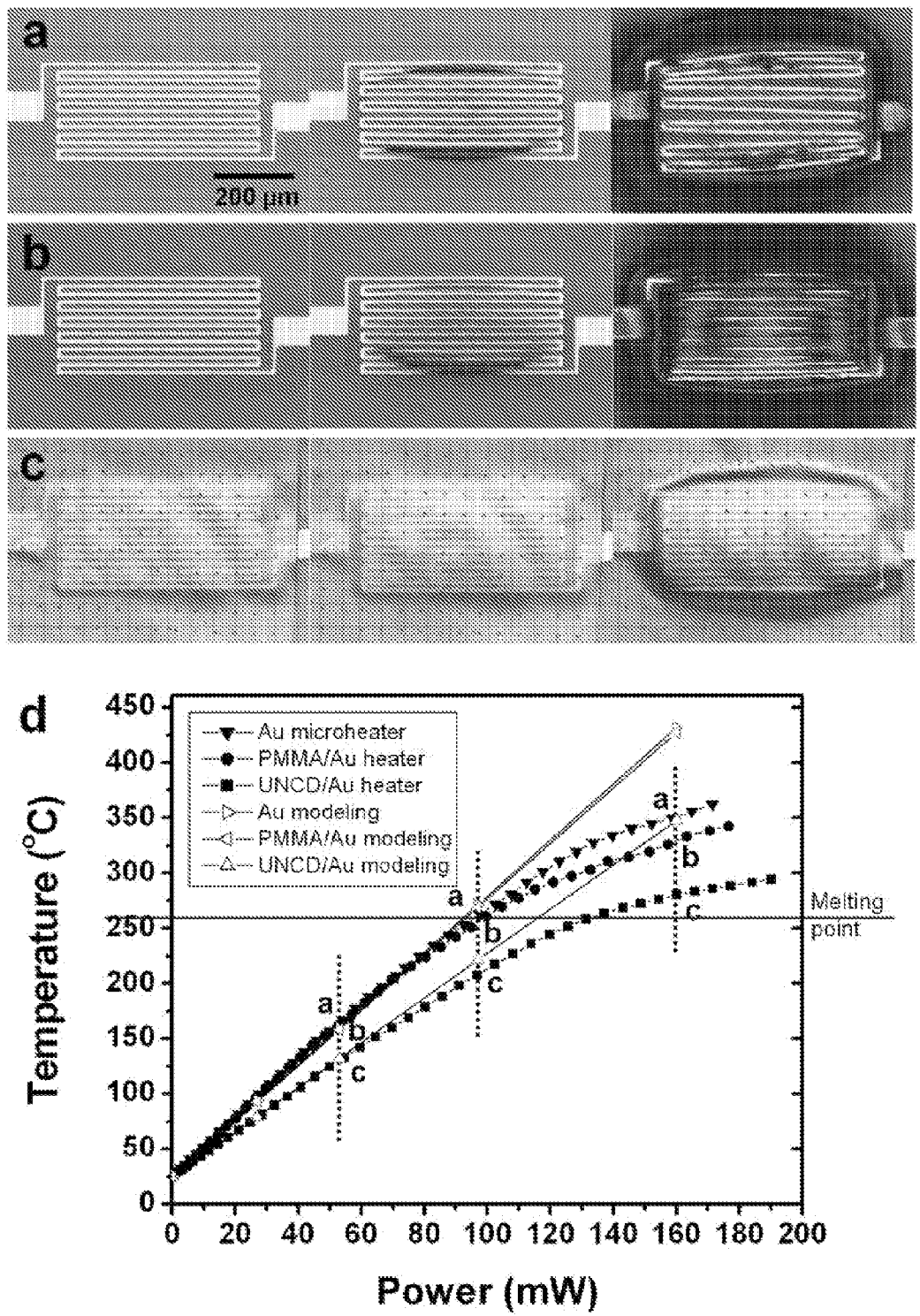
FIG. 4 Optical microscope images of serpentine microheaters on plastic substrates collected at applied powers of 53 mW, 97 mW, and 160 mW, for the case of heaters (a) exposed to air, (b) coated with a thin (600 nm), spin cast layer of PMMA and (c) covered with a printed, thin (400 nm) platelet of diamond. d) Average heater temperatures from experiment and from finite element modeling as a function of applied power for these three different samples.

The ability to manipulate thin diamond films in the manner illustrated in FIGS. 1-3 creates new application possibilities. As one example, printed µs-UNCD are used as heat spreaders in flexible electronic systems that use low temperature plastic substrates. Although the thermal conductivity of UNCD used in this example is quite low relative to natural diamond due to the nanoscale structure of the material (~20 W/mK) [see, e.g., M. A. Angadi et al., J. Appl. Physics 99, 114301 (2006).], this value is relatively much higher than typical flexible substrates such as PET. UNCD also has lower differential stress and high fracture strength compared to films of similar thickness but engineered for higher thermal conductivities. Such a system represents a solution to the difficult challenge of thermal management in flexible electronics. For this example, we create thin film microheaters (serpentine patterns of 10 µm wide wires, covering an area of ~250×250 µm) of Ti/Au (300 nm) on PET substrates, and then flow current through the microheaters while monitoring the resistance. The behavior of three different structures are compared: one with the microheater exposed to air, another with a uniform coating (600 nm thick) of poly(methylmethacrylate) (PMMA; Microchem corp.), and a third with a printed platelet of µs-UNCD (800×800 µm; 400 nm thick). FIGS. 4a, b and c correspond to the uncoated, the PMMA and the μs-UNCD cases, respectively, for applied powers of 53 mW, 97 mW and 160 mW. The PET substrate (~75 μm) could be easily damaged by heat generated by the microheater. The first stage of thermal degradation occurred at temperatures close to the melting point of 260° C., followed by a second stage characterized by weight loss at around 350° C.[28,29] The images show that the sample with μs-UNCD exhibits the most robust behavior to heating, indicating its effectiveness in heat spreading.

FIG. 4d presents the average temperature of the microheaters for the three different cases, as a function of applied power. The temperatures were computed from the known temperature dependence of the resistivity of the metal microheater, according to:

$$R(T) = R_a[1 + TCR_a(T - T_a)],$$

where $R_a$ and $TCR_a$ are the resistance and temperature coefficient of resistance, respectively, evaluated at temperature $T_a$. The resistance $R_a$ is determined by:

$$R_a = \rho_a \frac{L}{A},$$

where $\rho_a$ is resistivity of gold at $T_a$, L is length and A is cross-sectional area of gold wire. The value of R(T) value is obtained simply by dividing applied voltage (V) by the current (I). Using values of $\rho_{(20°\,C.)}$ and TCR(20° C.) for gold are $2.214 \times 10^{-8}$ Ω·m and 0.003715/° C. at 20° C., we calculated average temperatures (T) at various applied voltages and currents.[30-32] The temperatures of the microheater, PMMA/heater, and μs-UNCD/heater systems were, respectively, 261° C., 257° C., and 208° C. at a power of 97 mW, and 350° C., 329° C., and 279° C. at a power of 160 mW.

Figure 5:
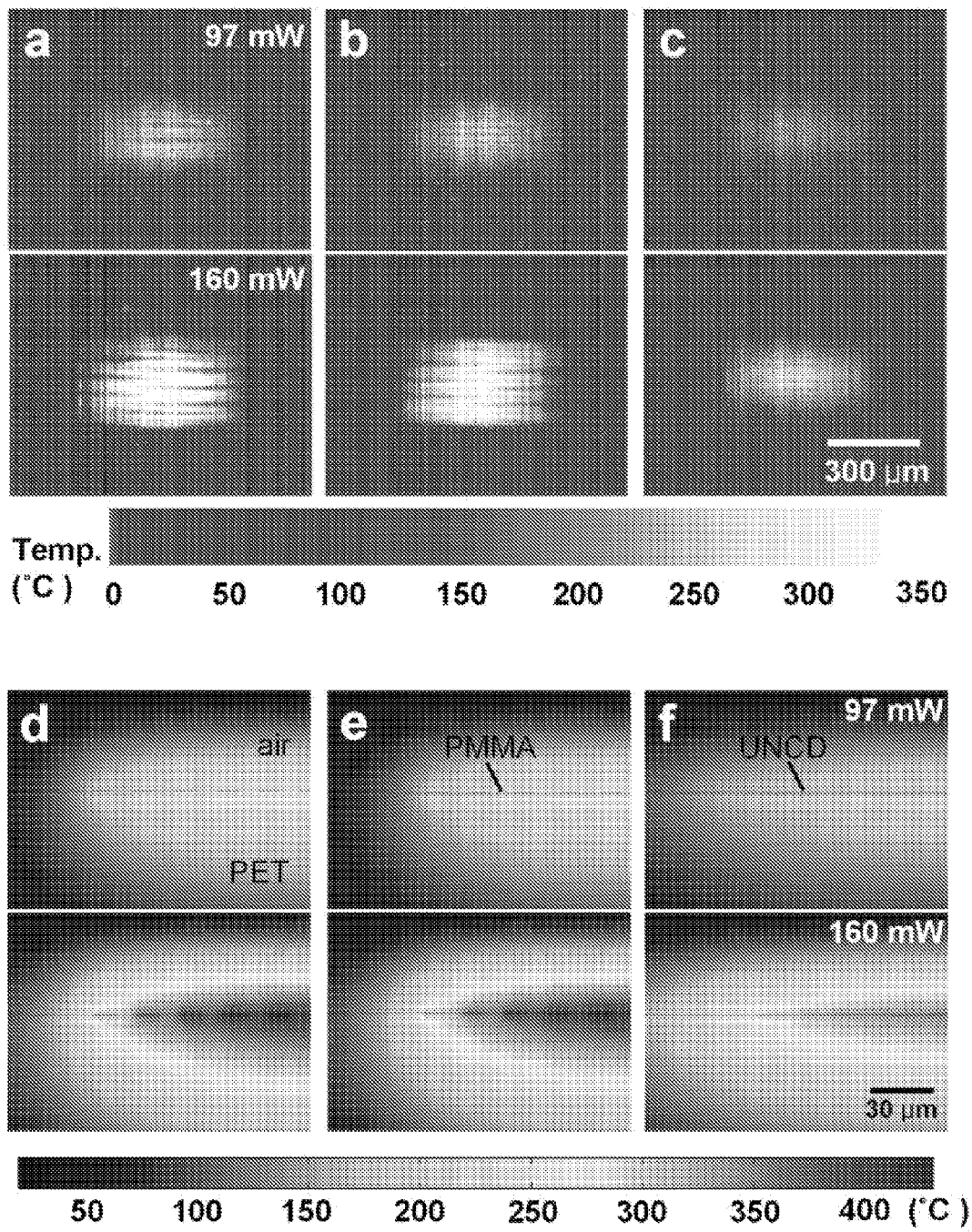
FIG. 5 Infrared images of microheaters on PET at various applied powers. a) Au microheater on PET film at 97 mW and 160 mW. b) Au microheater with PMMA top layer at 97 mW and 160 mW. c) Diamond membranes-printed Au microheater at 97 mW and 160 mW. d, e, f) Temperature profiles in cross-section from finite element analysis at 97 mW and 160 mW.

Infrared microscope images of these three systems were collected at different power levels are shown in FIG. 5. FIGS. 5a, b and c correspond to the uncoated, the PMMA and the μs-UNCD cases, respectively, for applied powers of 97 mW and 160 mW. The temperature distribution of the μs-UNCD sample has a rectangular shape with a broad thermal distribution, while the uncoated and PMMA-coated cases show localized heating distributions centered on the gold wires. These distributions illustrate that the UNCD platelet efficiently spreads heat laterally and thereby reduces the peak temperatures. Simple finite element analysis of the heat flow was conducted to reveal further this behavior. In particular, 2D analysis (COMSOL FEMLab, Multiphysics heat transfer via conduction mode) yields expected temperature distributions for the three systems at different applied powers. The simulated cross-sectional temperature profiles are shown in FIG. 5d-f. In the analysis, the gold heater elements supply heat to the system (via Joule heating) which then exits via conduction through the 75 μm PET substrate below the heater and through the PMMA or ms-UNCD coatings and then through a 40 μm of air (i.e. 'dead air') above the structure. The width of the modeled system is ~1 mm. For simplicity, convective heat transfer is ignored, and the faces of the PET substrate and the 40 μm air block farthest from the gold heating elements were held at a constant temperature of 25° C. These boundary conditions lead to (maximum) simulated temperatures that vary linearly with the applied power in each system (bare, PMMA-coated, UNCD-coated). The thickness of the air block (40 μm) was chosen to roughly match simulated temperatures of the bare microheater system at low power (<50 mW) to the experimentally measured values, which across that range also vary linearly with applied power. In comparison to simulations of the bare heater, in which the gold is exposed directly to air (thermal conductivity 0.025 W/mK), simulations of the coated heaters produced lower (maximum) temperatures. Simulations of heaters coated with PMMA (thermal conductivity=0.15 W/mK) produced only slightly lower temperatures, but simulations with UNCD (thermal conductivity=25 W/mK) produced a more significant temperature reduction and a broader, more uniform temperature profile.[33] The simulated (maximum) temperatures of the bare microheater, PMMA/heater, and UNCD/heater were 271° C., 269° C., and 221° C. for the applied power of 97 mW, and 432° C., 427.5° C. and 348° C. for the applied power of 160 mW, respectively, as shown in FIG. 4d. Simulated temperatures follow the experimental trend closely at low values of applied power (<100 mW for bare and PMMA-coated systems; <80 mW for the UNCD system, FIG. 4d). At higher powers and temperatures, the simulations overestimate the temperature in each system, possibly due to non-linear heat transfer mechanisms (e.g. convection, temperature-dependent thermal conductivity of the PET substrate) that were ignored in the simulations.[34] Despite the discrepancy at higher values of applied power, both the simple simulations and measurements demonstrate that printed UNCD thin films may serve as effective temperature spreaders.

In summary, etching and printing procedures can be used to manipulate thin film microstructures of diamond in a manner that permits integration with substrates (e.g. plastic) and creation of structural forms (e.g. bent or wavy) that are incompatible with conventional processing. The resulting capabilities are useful for certain applications, such as those in thermal management for plastic electronics.

Preparation of diamond microstructures: After growth of the UNCD, a $SiO_2$ layer (300 nm thick) was deposited by plasma-enhanced chemical vapor deposition (PECVD) using $SiH_4$ and $N_2O$ at 250° C. Photolithography with AZ 5214 defined a pattern of photoresist (PR) on the surface of the $SiO_2$ (300 nm)/UNCD (400 nm)/$SiO_2$ (1 μm)/Si substrate. The PR served as a mask for RIE etching of the PECVD $SiO_2$ layer with a $CF_4$ plasma (Plasmatherm RIE system, 40 sccm $CF_4$ flow with a chamber base pressure of 50 mTorr, 100 W RF power for 15 min 30 sec). The exposed regions of the UNCD were then etched with an $O_2$ plasma (chamber pressure of 40 mTorr, 20 sccm $O_2$ flow, and 220 W RF power for 35 min). In an optional embodiment, more efficient use of the diamond source wafer and reduction in processing time is achieved by the use of heterogeneous and/or homogeneous anchor structures, as provided in U.S. patent application Ser. No. 11/858,788 (filed Sep. 20, 2007) and PCT App. No. PCT/US07/79070 (filed Sep. 20, 2007), each of which are specifically incorporated by reference for anchor and tether structures for release strategies that facilitate high-fidelity release of structures, microstructures and patterns thereof, such as for transfer printing. Finally, the buried $SiO_2$ and PECVD $SiO_2$ layers were then removed in concentrated hydrofluoric acid (HF 49%), and the substrate was then washed with de-ionized (DI) water. The etching times were carefully controlled to complete the undercut etching of the UNCD in desired locations, but not in the regions of the anchors, as illustrated in FIG. 1.

Transfer printing: Stamps of poly(dimethylsiloxane) (PDMS; Sylgard 184, Dow Corning) were formed by casting and curing in polystyrene Petri dishes, and then cutting to convenient dimensions. Laminating such stamps against processed μs-UNCD substrates and then quickly peeling them back lifted the μs-UNCD onto the surface of the stamp. Contacting these 'inked' stamps against a receiving substrate and then slowly peeling them back transferred the μs-UNCD to the receiver. In certain cases, this transfer was facilitated either by the application of a small shear force to the stamp while in contact with the receiver or by use of a separate adhesion layer.

Preparation of wavy diamond ribbons: After creating μs-UNCD ribbons according to the process of FIG. 1, thin layers of Cr (3 nm thick) and $SiO_2$ (30 nm thick) were deposited by electron beam evaporation (Temescal, Inc). We found that the Cr enhanced the adhesion between the μs-UNCD and $SiO_2$. A flat sheet of PDMS (~3 mm thick) was exposed to ultraviolet light in air to create a hydrophilic surface (—OH and —O—Si—O— end groups),[24] that can provide the strong bonding with the $SiO_2$/Cr coated μs-UNCD. Heating the surface modified PDMS substrate in a convection oven generated prestrain by thermal expansion. The coefficients of thermal expansion, α, are $3.1×10^{-4}$ $K^{-1}$ and $1.2×10^{-6}$ $K^{-1}$ for PDMS substrate and UNDC, respectively. The thermally induced prestrain, $\in_{pre}$, for samples heated to 180° C. was calculated by:

$$\in_{pre}=\Delta\alpha\times\Delta T=((3.1\times10^{-4}-1.2\times10^{-6})\times(180-25)=4.8\%.$$

The prestrained PDMS was brought into conformal contact with the μs-UNCD ribbons, and then peeled back to leave the ribbons adhered to the PDMS. Subsequent heating in a convection oven led to strong adhesion between ribbons and the PDMS. Finally, the sample was cooled to room temperature (25° C.) to release the thermally induced prestrain, thereby creating the wavy μs-UNCD via a nonlinear buckling process.

Fabrication of Au microheaters: Photolithography with AZ nLOF 2020 for negative imaging defined a pattern of resist on a sheet of PET (75 μm thick). A uniform bilayer of Ti(3 nm)/Au(300 nm) was then deposited by electron beam evaporation (Temescal, Inc.). Removal of the photoresist by acetone followed by washing with water completed the fabrication of the microheaters. A thin (300 nm), spin-cast layer of BCB was used to planarize the heater structure, and then the μs-UNCD platelets were printed on top. After printing, the samples were placed on a hot plate at 100° C. for 10 min, and then in an oven at 75° C. for 24 h to cure the BCB. In other samples, PMMA A6 (Microchem corp.) was spin-coated on top of Au microheater at 2000 rpm for 45 s to produce PMMA layer of 600 nm thickness, and placed in an oven at 75° C. for 8 h for removing solvent.

REFERENCES

[1] J. Isberg, J. Hammersberg, E. Johnsson, T. Wikstrom, D. J. Twitchen, A. J. Whitehead, S. E. Coe, G. A. Scarsbrook, *Science* 2002, 297, 1670.
[2] A. De Sio, J. Achard, A. Tallaire, R. S. Sussmann, A. T. Collins, F. Silva, E. Pace, *Appl. Phys. Lett.* 2005, 86, 213504
[3] H. Masuda, K. Yasui, M. Watanabe, K. Nishio, T. N. Rao, A. Fujishima, *Chem. Lett.* 2000, 10, 1112.
[4] S. Srinivasan, J. Hiller, B. Kabius, O. Auciello, *Appl. Phys. Lett.* 2007, 90, 134101.
[5] Y. Fu, H. Du, J. Miao, *J Mater. Proces. Technol.* 2003, 132, 73
[6] F. Piazza, D. Grambole, D. Schneider, C. Casiraghi, A. C. Ferrari, J. Robertson, *Diamond Relat. Mater.* 2005, 14, 994.
[7] A. Harkonen, S. Suomalainen, E. Saarinen, L. Orsila, R. Koskinen, O. Okhotnikov, S. Calvez, M. Dawson *Electron. Lett.* 2006, 42, 693.
[8] Y. D. Kim, W. Choi, H. Wakimoto, S. Usami, H. Tomokage, T. Ando, *Appl. Phys. Lett.* 1999, 75, 3219.
[9] Y. Zhao, B. Zhang, N. Yao, G. Sun, J. Li, *Diamond Relat. Mater.* 2007, 16, 650.
[10] S. T. Patton, B. Bhushan, *IEEE Trans. Magn.* 1998, 34, 575.
[11] W. I. Urruchi, M. Massi, H. S. Maciel, C. Otani, L. N. Nishioka, *Diamond Relat. Mater.* 2000, 9, 685.
[12] R. Abbaschian, H. Zhu, C. Clarke, *Diamond Relat. Mater.* 2005, 14, 1916.
[13] J. Laimer, H. Pauser, H. Störi, R. Haubner, B. Lux, *Diamond Relat. Mater.* 1997, 6, 406.
[14] D. M. Gruen, S. Liu, A. R. Krauss, J. Luo, X. Pan, *Appl. Phys. Lett.* 1994, 64, 1502.
[15] O. A. Williams, M. Daenen, J. D'Haen, K. Haenen, J. Maes, V. V. Moshchalkov, M. Nesládek, D. M. Gruen, *Diamond Relat. Mater.* 2006, 15, 654.
[16] O. A. Williams, M. Nesládek, *phys. stat. sol. (a)* 2006, 203, 3375.
[17] K. J. Hsia, Y. Huang, E. Menard, J.-U. Park, W. Zhou, J. A. Rogers, J. M. Fulton, *Appl. Phys. Lett.* 2005, 86, 154106.
[18] M. A. Meitl, X. Feng, J. Y. Dong, E. Menard, P. M. Ferreira, Y. Huang, J. A. Rogers, *Appl. Phys. Lett.* 2007, 90, 083110.
[19] S.-H. Hur, D.-Y. Khang, C. Kocabas, J. A. Rogers, *Appl. Phys. Lett.* 2004, 85, 5730.
[20] Choi J.-H, Kim D, Yoo P. J, Lee H. H, *Adv. Mater.* 2005, 17, 166.
[21] M. A. Meitl, Z. T. Zhu, V. Kumar, K. J. Lee, X. Feng, Y. Y. Huang, I. Adesida, R. G. Nuzzo, J. A. Rogers, *Nature Mater.* 2006, 5, 33.
[22] A. V. Sumant, D. S. Grierson, J. E. Gerbi, J. Birrell, U. D. Lanke, O. Auciello, J. A. Carlisle, R. W. Carpick, *Adv. Mater.* 2005, 17, 1040.
[23] D.-Y. Khang, H. Jiang, Y. Huang, J. A. Rogers, *Science* 2006, 311, 208.
[24] Y. Sun, W. M. Choi, H. Jiang, Y. Y. Huang, J. A. Rogers, *Nature Nanotech.* 2006, 1, 201.
[25] a) T. Buma, M. Spisar, M. O'Donnell, *Appl. Phys. Lett.* 2001, 79, 548. b) Y. Gurbuz, O. Esame, I. Tekin, W. P. Kang, J. L. Davidson, *Sol. Stat. Electron.* 2005, 49, 1055.
[26] a) Y. Sun, V. Kumar, I. Adesida, J. A. Rogers, *Adv. Mater.* 2006, 18, 2857. b) H. Jiang et al., Submitted.
[27] H. Jiang, D.-Y. Khang, H. Kim, Y. Huang, J. A. Rogers, *J. Mech. Phys. Sol.* In preparation.
[28] H. A. Lecomte, J. J. Liggat, *Polym. Degrade. Stab.* 2006, 91, 681.
[29] M. T. Freire, A. P. Damant, L. Castle, F. G. R. Reyes, *Packag. Technol. Sci.* 1999, 12, 29.
[30] A. Scorzoni, M. Baroncini, P. Placidi *Sens. Actuators A* 2004, 116, 137.
[31] Y. S. Kim, *Sens. Actuators B* 2006, 114, 410.
[32] A. G. Bishay, W. Fikry, H. Hunter, H. F. Ragie, *J. Phys. D: Appl. Phys.* 2000, 33, 2218.
[33] S. Ahmed, R. Liske, T. Wunderer, M. Leonhardt, R. Ziervogel, C. Fansler, T. Grotjohn, J. Asmussem, T. Schuelke, *Diamond Relat. Mater.* 2006, 15, 389.
[34] C. M. A. Lopes, M. I. Felisberti, *Polymer Testing* 2004, 23, 637.

EXAMPLE 2

Efficient Heat Extraction from the Active Junction of Transfer Printed GaN Power HEMTs Excess heat generated by output transistors in high power amplifiers (PA) limit the safe operating area (SOA) and negatively impact surrounding control electronics. Current approaches to substrates for high thermal density include either the integration of functionality on a single semiconductor material as an integrated circuit (e.g., monolithic microwave integrated circuits, MMICs) or the heterogeneous integration of planar layers of varying functional properties (e.g., semiconductor on diamond, SOD). For MMIC devices, integration can be limited by an inability to match semiconductor materials technology with device type. For instance, a high-power GaN PA might be most optimally integrated with a CMOS control circuit for efficient feed-forward digital signal synthesis. Integrated as a single device, the control device can be negatively influenced by thermal losses dissipated from the power amplifier. Similarly, for SOI or SOD devices, heat is dissipated laterally as well as vertically through a high diffusivity substrate. Such thermal cross-talk becomes more severe as devices are more closely spaced as needed for sophisticated feedback/feed-forward signal processing approaches.

Semiconductor printing technology provided herein facilitates heterogeneous integration onto of state of the art RF power devices. This integration platform can dramatically improve overall thermal dissipation and optimize heat dissipation paths to prevent thermal-cross talk between power and control circuits. The critical novelty resides in the fact that it permits the ultra-fine heterogeneous integration of RF power devices and CMOS control circuits with high performance heat spreaders onto thermally engineered substrates. The assembled substrate will circumvent thermal cross-talk issues by combining passive and active substrate materials (insulators and semiconductors) on a 5-20 micron length scale as a heterogeneous assembly, providing integrated thermal management, not just isotropic thermal dissipation. The end goal system structure enables the design of high efficiency power amplifiers tightly controlled by a CMOS circuit through short range interconnects with greatly reduced thermal feed-through to the control circuit.

The RF semiconductor electronic device platform combines devices of different materials into a single small-scale microsystem enabling superior functionality to separate individual semiconductor devices. This platform is heterogeneously assembled of semiconductor devices through a precise and scalable device transfer process. Combining semiconductor technologies at a device-by-device scale permits achievement new electronic functionalities, for instance: integrating sense and modulate intelligence with highest efficiency RF power devices. The resulting RF microsystem has reduced thermal energy loss (1/PAE) and related loss of device functionality (frequency-power-linearity) at RF frequencies, particularly microwave and mm-wave. Thermal energy is managed more efficiently by designing highly conductive thermal pathways, not just thermal dissipation into the assembled substrate.

Figure 6:
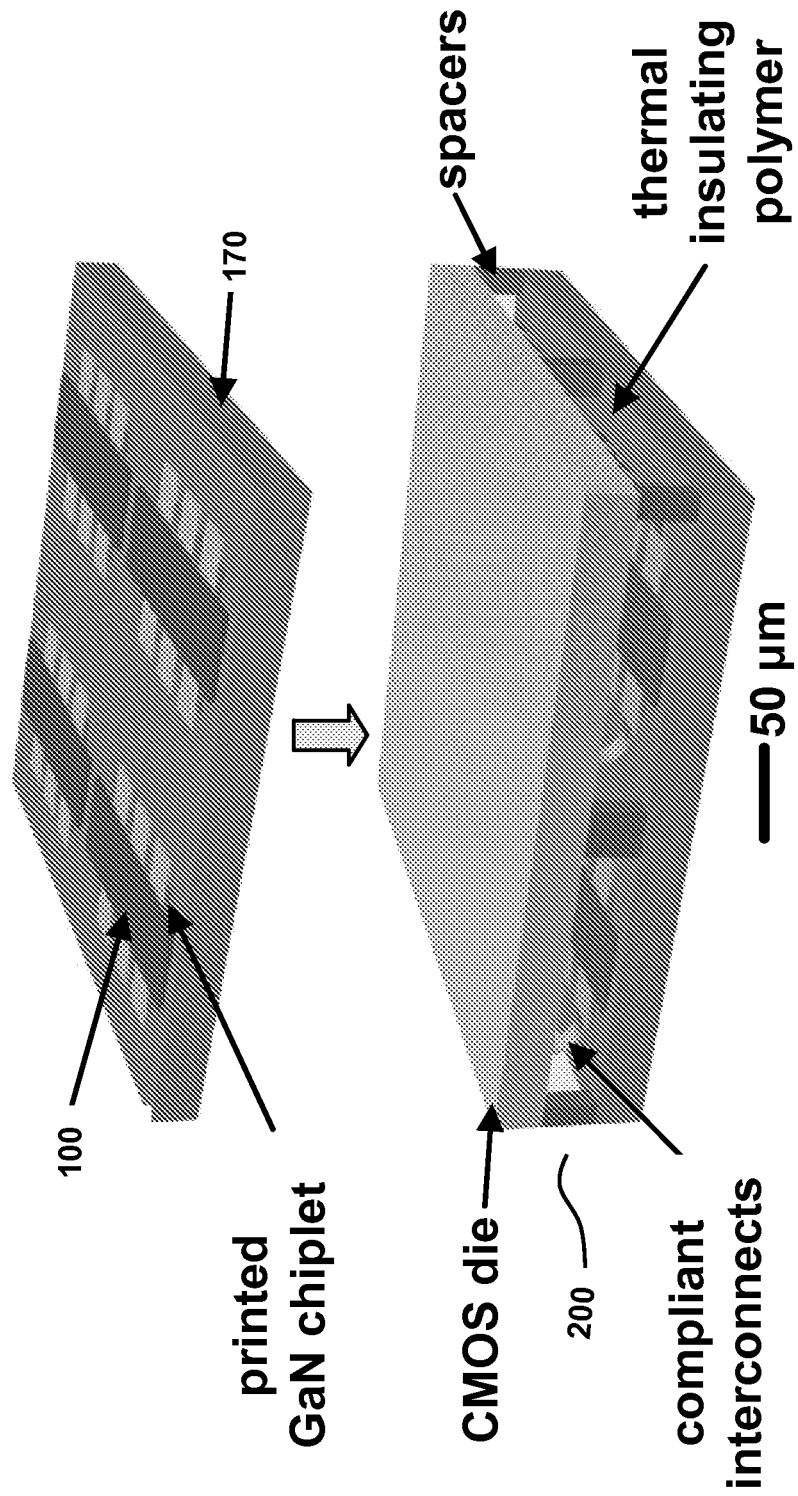
FIG. 6 RF semiconductor electronic device platform.

RF semiconductor electronic device platform: To test this approach, we construct a heat-sinked electronic component 200 in an assembled substrate comprising a highly thermally conductive diamond pattern 100 connected to a heat sink 170 comprising a copper substrate, GaN chiplets, diamond heat spreaders, and a CMOS die (see FIG. 6). This assembled device platform provides superior thermal management, which can be verified through both modeling and experiment.

The semiconductor device platform exhibits dramatically improved overall thermal dissipation (>30% improvement compared to GaN on SiC). Furthermore, optimization of thermal dissipation paths prevents or substantially hinders thermal-cross talk between power and control circuits (targeting>1000:1 heat flux ratio).

Some key technical challenges in developing the semiconductor device platform are: Selective dry-transfer onto GaN chiplets onto diamond on copper substrates; Release of the diamond thin film to allow dry-transfer; Selective dry-transfer of diamond heat spreaders above GaN chiplets to create highly tailored thermal pathways; Controlling interfaces to minimize thermal resistance.

Figure 7:
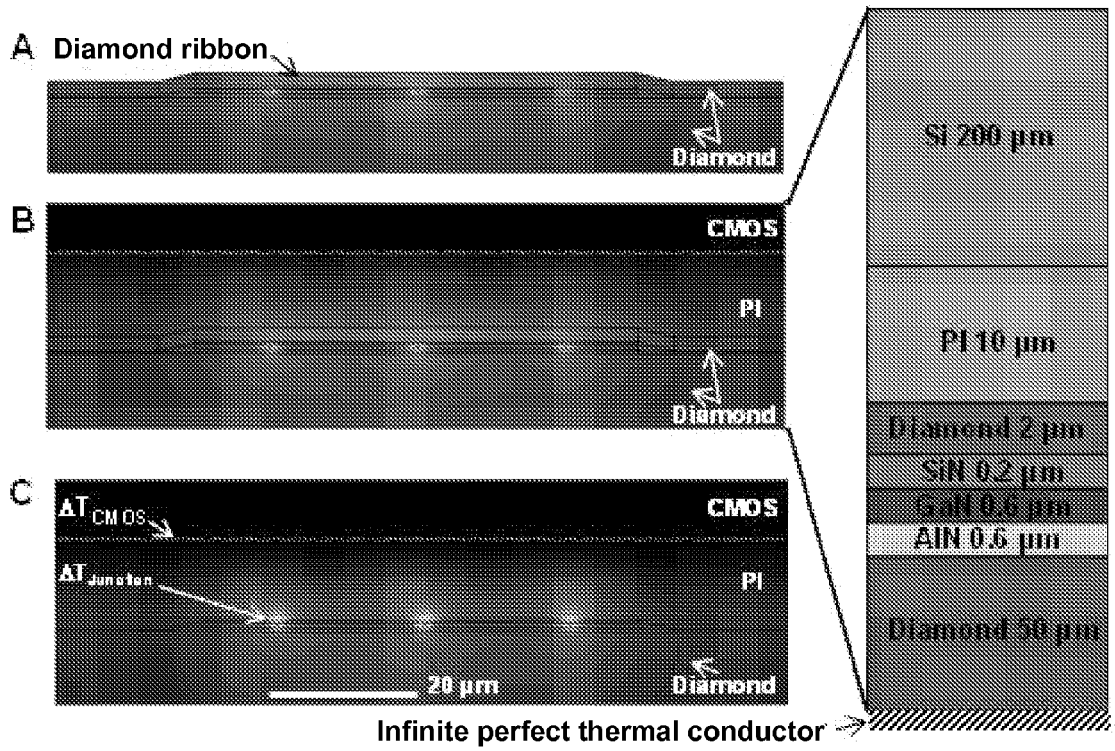
FIG. 7 Thermal simulations for: printed GaN chiplets and: A. Diamond heat spreaders; B. Diamond heat spreaders and dummy CMOS die; C. Dummy CMOS die.
Figure 8:
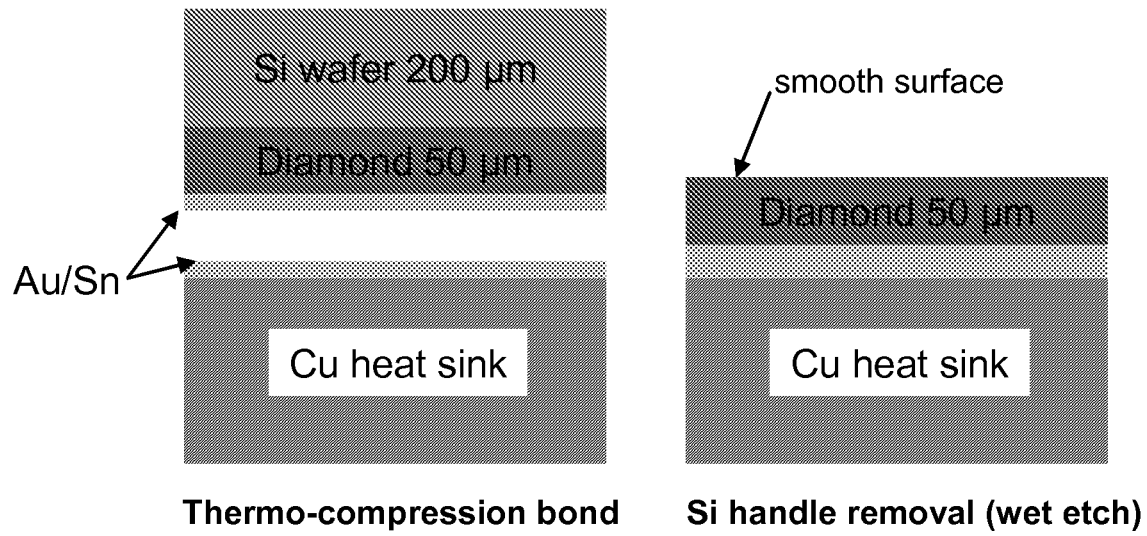
FIG. 8 Diamond on copper substrate preparation.

Thermal simulations: In order to estimate the overall thermal dissipation characteristics of the proposed semiconductor device platform, thermal simulations are conducted for three cases outlined in FIG. 7 A) Printed GaN chiplets+Diamond heat spreaders; B) Printed GaN chiplets+Diamond heat spreaders+dummy CMOS die; C) Printed GaN chiplets+dummy CMOS die. The underlying copper heat sink substrate is assumed to be an infinite perfect thermal conductor as the main purpose of these preliminary simulations is to compare the above listed three cases. These simulations show that the proposed semiconductor electronic device platform can efficiently manage thermal heat flux toward the copper heat sink substrate and minimize thermal feed-through to the control CMOS circuit (with heat flux ratio potentially greater than 2,000:1). These simulation results also indicate that printing a 2 micron thick diamond heat spreader onto the GaN chiplets can induce a ~11% decrease of the GaN device junction temperature.

Figure 9:
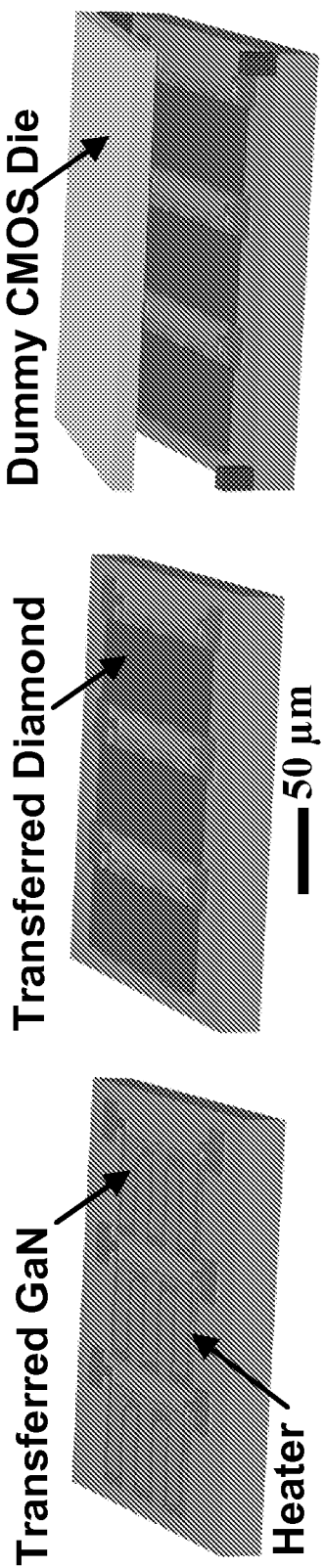
FIG. 9 Schematic illustration of the assembly process step.

RF semiconductor electronic device platform manufacturing process: The process begins with deposition of a ~50 micron thick diamond coating on a polished silicon wafer. By adjusting the process conditions during growth as well as employing wafer-level stress management, 50 micron thick films can be made with residual stresses that are low-enough to meet wafer bow specifications necessary for bonding at the wafer level and for lithography. Diamond is optionally attached to a copper substrate using a solder (e.g., indium-silver) die attach process. A thin film metallic adhesion promotion layer is optionally deposited (such as by sputtering) onto the surface of the diamond film in order to increase the strength of die attachment to the diamond film. Such processes provide diamond film bonding, using thermo-compression eutectic bonding, onto a polished copper substrate (see FIG. 9). This bonding process is performed at moderate temperatures (<300° C.) and pressures (<$10^6$ Pa) using a standard die bonder. In order to minimize the interfacial stress due to coefficient of thermal expansion mismatch between copper and diamond ($17 \times 10^{-6}$/° K and $1.1 \times 10^{-6}$/° K, respectively), the diamond film is etched into isolated small islands prior to performing the die bonding process using oxygen reactive ion etching and a simple shadow mask for patterning. Thick diamond is optionally etched into isolated islands using a relatively slow plasma etching process. Thick diamond is optionally etched using a laser dicing process.

Figure 10:
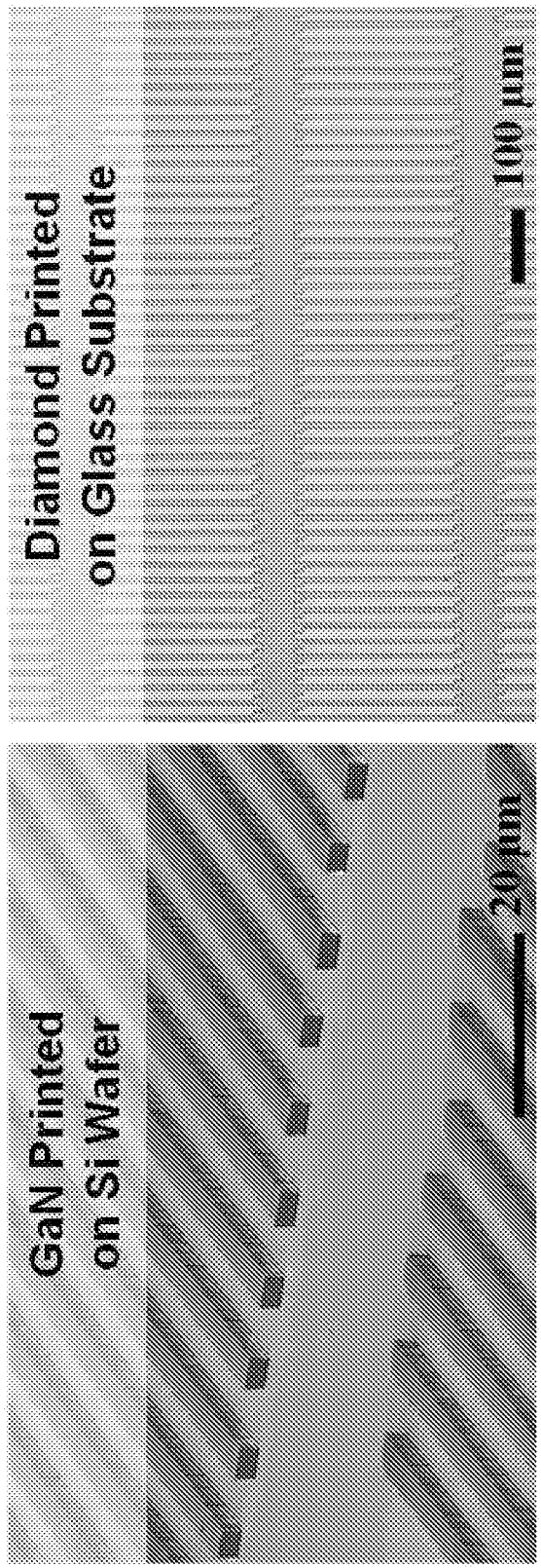
FIG. 10 Micrographs of GaN printed on Si Wafer (left panel) and Diamond printed on glass substrate (right panel).

The temporary silicon carrier is then dissolved by wet etching in order to leave on the top surface an ultra flat diamond (~1 nm rms) surface onto which GaN chiplets are transfer printed. Heat spreaders, consisting diamond films that are 2 micron thin and grown under conditions to minimize the differential stress in the films, are then transferred onto the GaN chiplets in order to enable efficient heat extraction from the top surface of the GaN chiplets. Finally, a silicon die populated with thermally sensitive elements is stacked onto the assembled structure. The inter-substrate spacing is controlled by use of ~10 μm tall spacers. FIG. 10 schematically illustrates an assembly process.

Resistive heaters are fabricated on the surface of the GaN chiplets in order to simulate the heat required to be dissipated by power HEMTs devices. Power applied to the heaters is cycled in order to evaluate the robustness of the printed material stack. Heat flux to the heat sink substrate and surface temperature of a dummy CMOS die is measured to verify experimentally the heat extraction performance of the proposed structure.

This technology provides a platform for integrating state of the art GaN HEMTs on to thermally engineered substrates to enable efficient heat extraction. Dry transfer printing process permits the heterogeneous integration of materials on the device scale of 5-25 microns at significantly higher resolution than that of existing interposer or pick-and-place heterogeneous assembly technologies (see, e.g., Ser. Nos. 11/115,954 (18-04); 11/145,574 (38-04A); 11/145,542 (38-04B); 11/675,659 (137-05); 11/465,317 (38-04C); 11/423,192 (41-06); 11/421,654 (43-06); 11/858,788 (151-06); 11/851,182 (134-06); 11/981,380 (216-06) each of which is specifically incorporated by reference). This unique printing process combined with the ability to provide efficient thermal management near the junction of high power GaN devices will: permit optimally efficient GaN utilization (small size); lower the fabrication cost of PA (efficient GaN wafer area usage); enable more compact designs (reduction of die size); short interconnects (low parasitics) leads to improved PAE.

A possible area of risk relates to materials CTE mismatch during diamond bonding onto Cu heat sink. This is mitigated by one or more of: reducing area of transfer; pattern diamond layer into isolated islands; etch isolation trenches in Cu heat sink; use of a lower melting point eutectic.

Another concern relates to appropriate bonding of the GaN chiplets onto the diamond layer. This concern is alleviated by: use of an ultra thin glue layer stable at ~250° C.; use of metal eutectic bonding pads in the chiplet peripheral area and/or in direct contact with the underlying diamond layer.

Figure 11:
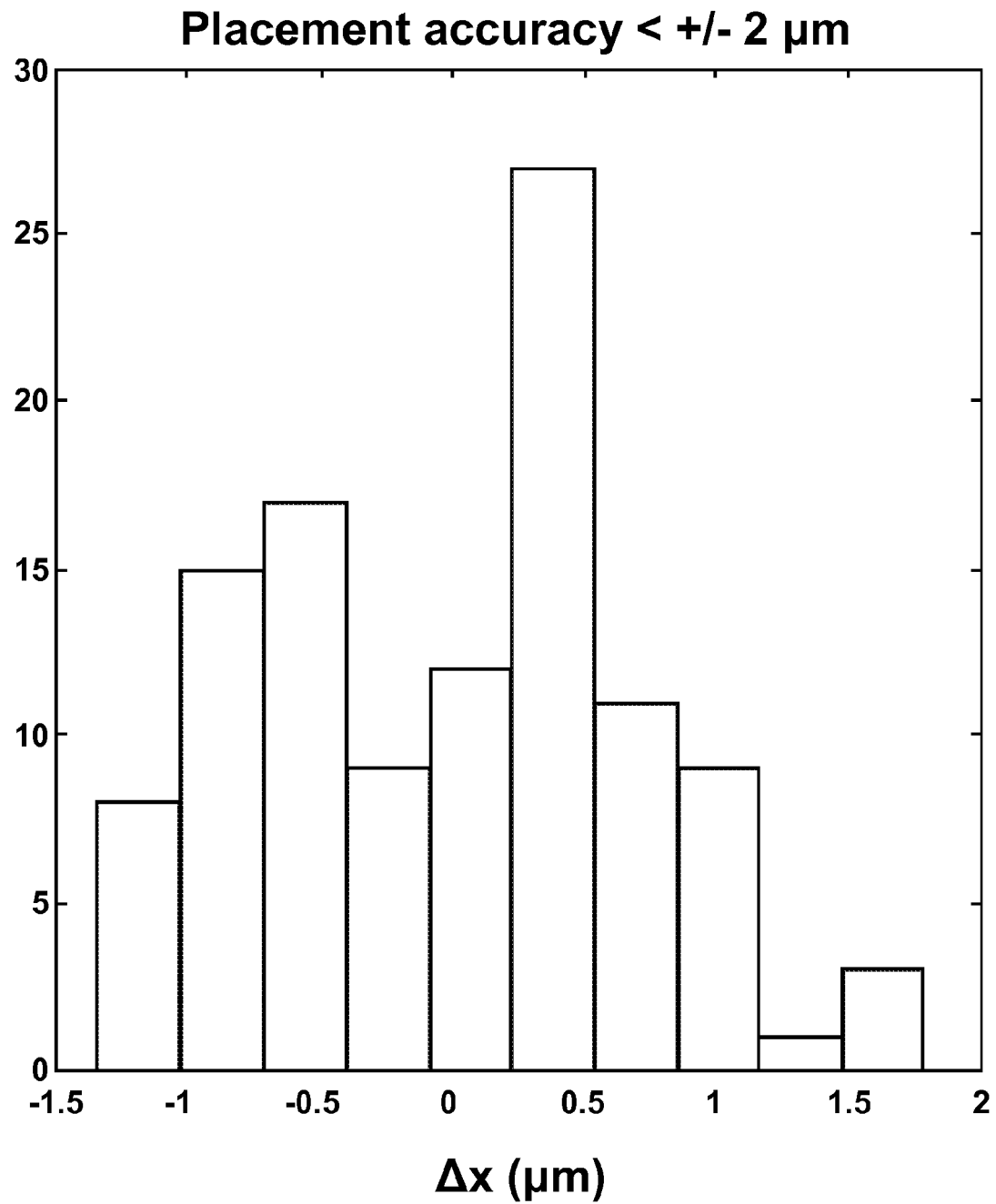
FIG. 11 Histogram of placement accuracy of a microstamping tool capable of high-fidelity and placement accuracy for transfer of large-area semiconductor elements from donor wafers to target substrates.

Examples of placement accuracy for various patterns from a donor substrate to a target substrate are provided in FIG. 11. The printing platform provides for micron and sub-micron placement accuracy.

EXAMPLE 3

Examples and Analysis of Heat Extraction Devices

Integration technology achieved via transfer printing can significantly improve overall heat extraction from heat-generating devices, such as from the active junction of GaN high power devices. Exemplary components of such heat-extraction devices include, copper/diamond heat sink substrate, GaN chiplets transfer printed on the heat sink substrate, and thin diamond heat spreaders transfer printed and incorporated into the device. The performance of the semiconductor device platforms are evaluated and compared to conventional state of the art semiconductor platforms.

Figure 12A:
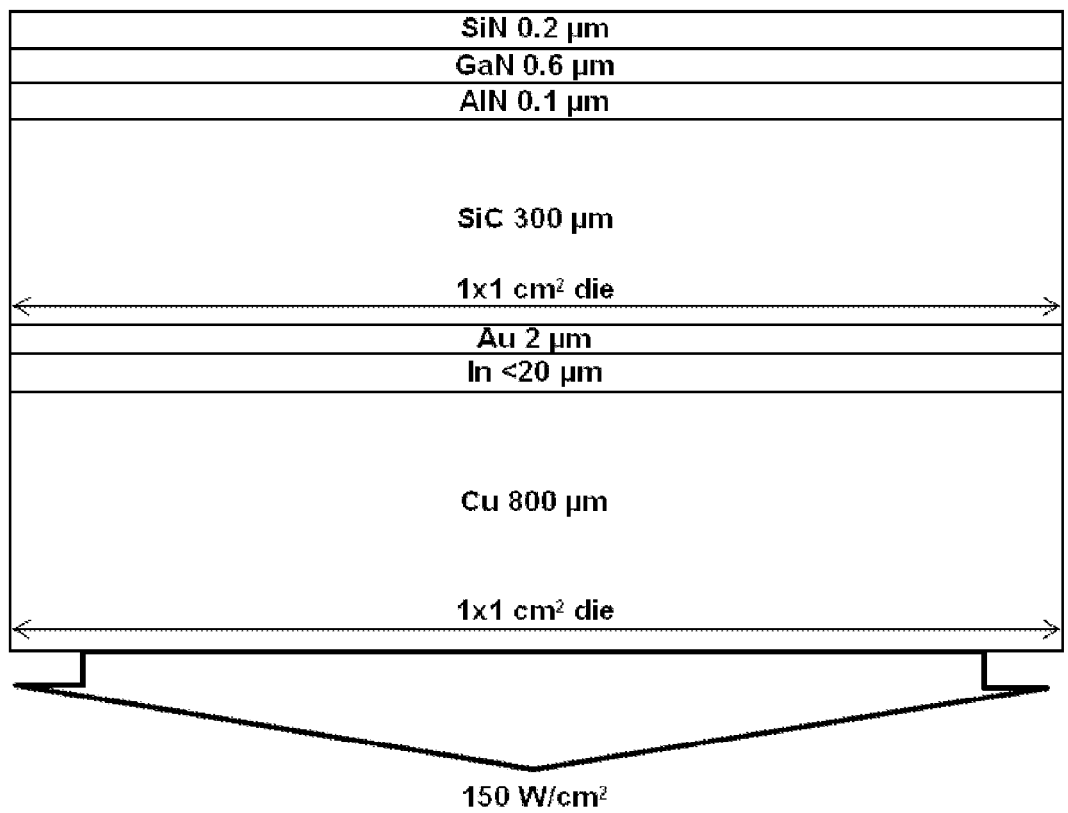
FIG. 12 Cross-sectional schematics of (A) state of the art GaN on SopSiC and (B) semiconductor platform utilizing diamond for thermal management.
Figure 12B:
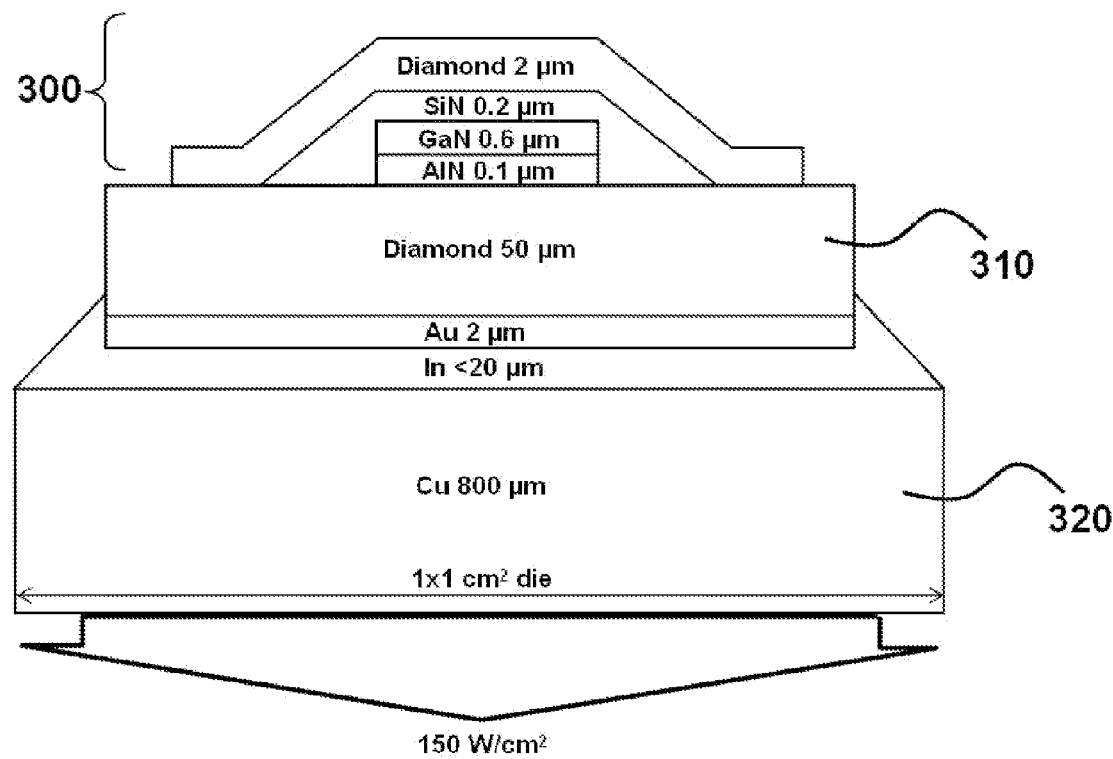

A state of the art GaN on SopSiC is illustrated in FIG. 12A. A corresponding semiconductor platform incorporating the processes and systems provided herein for improved heat extraction is illustrated in FIG. 12B. The performance of the semiconductor device platform proposed in FIG. 12B is compared against state of the art GaN devices fabricated on Silicon on poly-crystalline Silicon Carbide (SopSiC) substrates (FIG. 12A).

FIG. 12B also illustrates that incorporation of a diamond material can provide multiple functional benefits to a device, in this case a heat-sinked high-powered RF device (e.g., GaN device) 300. A diamond layer 310 provides electrical insulation between device 300 and a conductive substrate 320 (e.g., Cu). In this example, the diamond layer 310 has a different position and geometry (e.g., thickness) than another diamond layer that faces the opposite surface of the GaN device (compare 50 μm and 2 μm). Configuration and printing of diamond layers and patterns may be selected based on the main purpose of the layer, such as thermal dissipation, electrical isolation or dielectric loss. In an aspect, the diamond layer has a low dielectric loss so that the diamond material does drain energy away from the device, thereby further improving performance. Incorporation of diamond layers to achieve desired level of electrical isolation at desired device radiofrequency (RF) ranges (e.g., MHz to THz, with the precise range depending on the specific device characteristics) is informed by diamond having a low loss tangent in those ranges. Further information related to low loss tangent at different frequencies is provided in Garin et al. (Nature of millimeter wave losses in low loss CVD diamonds. Diamond and Related Materials. 12 (10-11), 2003: 1755-1759. Proceedings of the 8th International Conference on New Diamond Science and Technology (ICNDST-8)).

Heat Sink Substrate Preparation—Growth of 50 μm thick diamond on Si wafer. Provided are two types of 50 μm thick films: 1) 50 μm films deposited onto 50 mm diameter thick (⅛") silicon disks (2), and 2) Twelve 50 μm thick films deposited onto 700 μm and 3 mm 1×1 cm silicon coupons, for bonding work. The chemistry to synthesize these films is optimized to produce the highest thermal conductivity diamond, which leads to the formation of films with a highly columnar grain structure with grain sizes at the as-grown surface up to 100 μm in size. The films for process development is polished down to ~5 nm rms roughness, so that chiplets can be transferred directly to this surface. These films on thick silicon substrates are subsequently used for the final devices tested.

Thin Diamond Capping Heat Spreader: A wafer with about 2 μm thick UNCD Aqua100 is used to make the final device.

Delineation of diamond heat spreaders: The same mask and microfabrication processes is used to pattern and fabricate the heat spreaders as described herein.

Figure 13:
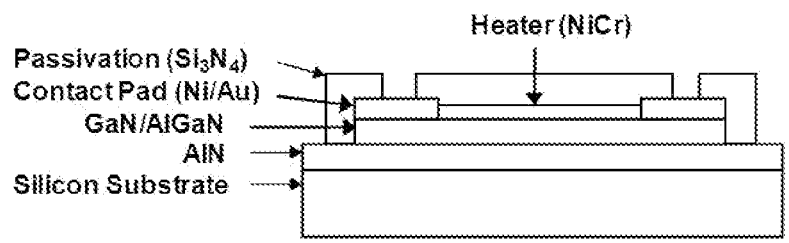
FIG. 13 Structures fabricated to isolate and test the relative effect of printing a thermal diamond overlayer on the devices. The devices are equivalent except that the right panel incorporates a diamond heat spreader.
Figure 13:
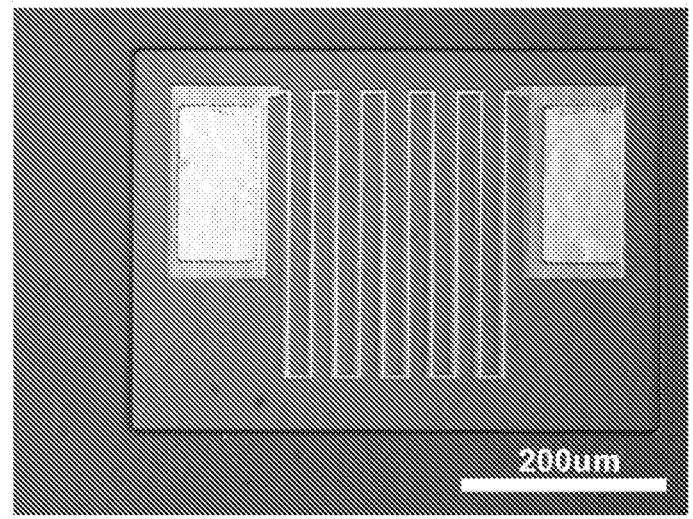
Figure 13:
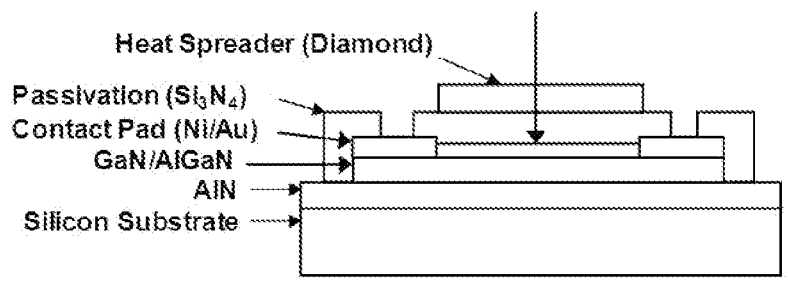
Figure 13:
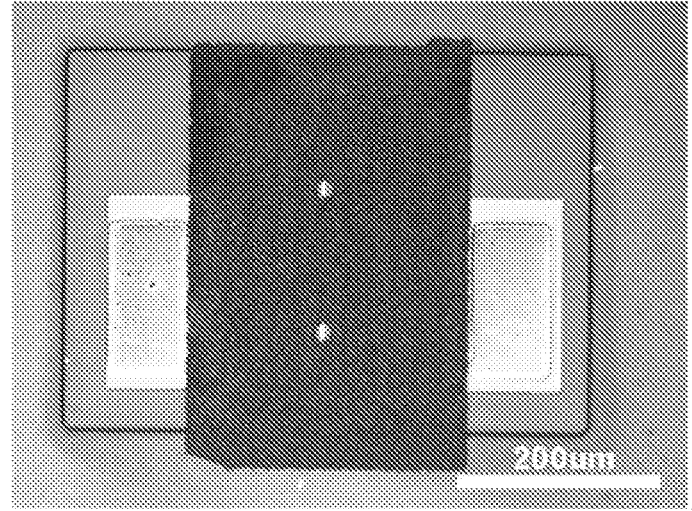

Release and transfer of diamond heat spreaders: Wafers having 2 um thick diamond films grown on 100 mm silicon wafers are optimized to have material properties most similar to bulk diamond, including the high thermal conductivity. Although patterning and printing micro-stripes of these films onto flat surfaces is relatively straightforward, printing onto more complex 3D substrates is challenging and requires heater and chiplet geometries to make the surfaces as planar as possible. Using the alternative design the yield of the transfer printing process is greatly improved and several devices are constructed for further testing. The final structures fabricated for further testing are shown in FIG. 13. The diamond films are also very transparent in the IR, facilitating the direct measurement of the heater temperatures as discussed below.

Device test and simulations: Temperature and heat flux measurements. Thermal imaging tests of the final as-fabricated heterostructures are conducted using a QFI Infrascope II. For each device tested the base plate is maintained at a constant temperature (50 or 60 C) and the temperature of the devices imaged while current is run passed through the integrated heaters with input powers ranging from about ~0.2 to 8.5 watts of power. The lateral resolution of the thermal imaging is sufficient to determine the temperature along the heater lines (thin film electrode) and in the immediate regions surrounding the lines quite easily. Overall, more than 300 devices are evaluated. Direct determination of the temperatures precisely on the lines of the heaters is made possible by the low IR adsorption of the diamond films, which is a secondary confirmation of the quality of the films.

Figure 14:
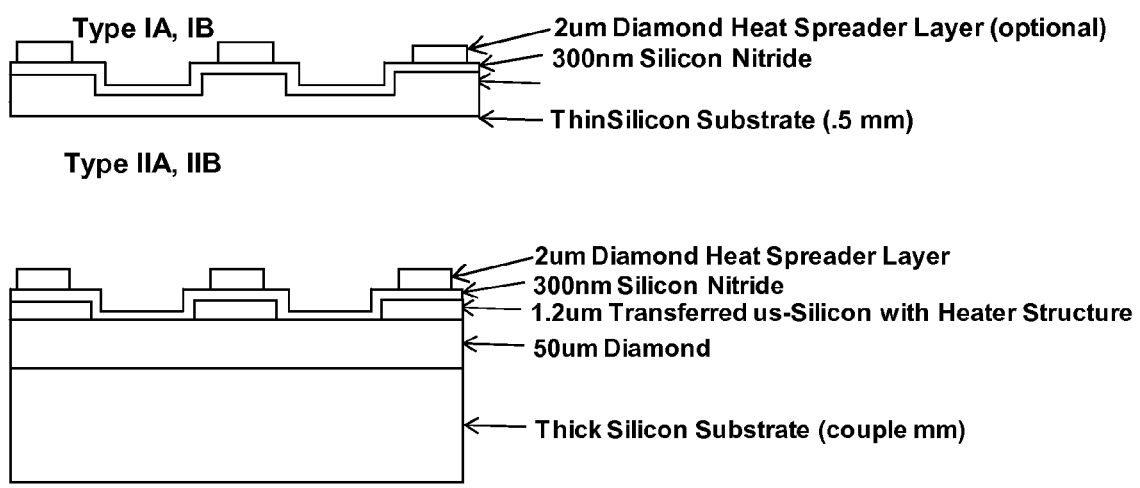
FIG. 14 Schematic cross-sections of the devices tested. IA and IB have structures fabricated on a silicon substrate without and with a thin diamond thermal spreader printed on top of the devices, respectively. IIA and IIB consist of structures fabricated on a 50 micron diamond film deposited onto a thick silicon substrate, again without and with a diamond spreader printed on top of the devices, respectively.

Two types of structures are tested and yielded meaningful results from which to draw conclusions in comparison to the thermal simulations. These structures are shown in FIG. 14. Instead of using a 50 micron diamond film bonded to a copper substrate, a film grown onto a thick (⅛ inch) silicon substrate is used. To facilitate transfer printing of the chiplets to this surface, the surface is polished to ~5 nm rms roughness. GaN chiplets are not used due to the high differential stresses in the nitride layers, leading to non-planar contacts after transfer printing them to the diamond and silicon substrates. Strategies are available to minimize this problem to accommodate GaN chiplet printing. To expedite progress on demonstrating key concepts, data presented in this example are for pure silicon chiplets.

Structure I: These specimens consisted of a standard silicon substrate (about 500 microns thickness) on which silicon chiplets with micron-strip heaters are printed. A SiN passivation layer is deposited on top of the chiplets prior to printing (for electrical isolation). Some of the structures (IA) are tested in this configuration while others (IB) have thin film (2 micron thick) diamond heat spreaders transfer printed on top of them in a second transfer process (see top panel of FIG. 14). Prior to doing this an ultra thin (~30 nm) layer of BCB is coated on top of the SiN layer to promote adhesion of the diamond heat spreader to the silicon chiplet.

Structure II: consisted of the same structures that were discussed above (Structure 1) but transfer printed onto a substrate consisting of the 50 micron thick polished diamond film on a thick silicon substrate. Again, some of the devices tested have diamond heater spreaders transfer printed on top of them (IIB) and others do not (IIA), allowing for the addition performance benefit of the thin diamond to be evaluated.

To facilitate a direct comparison between the two structures, Table I summarizes their relative performance for input powers close to 3W only.

TABLE I

Summary of test results from a representative group of devices with about 3 W of input power applied to heaters. The temperatures of the device during operation were recorded using the QCF instrument for temperatures on the heaters, made possible by the ability to image through the diamond heat spreaders. The temperatures associated with the additional thin diamond spreaders are subject to uncertainties due to their non-uniform contact with the substrates, as discussed below. The estimated maximum operating power is an extrapolation of the experimental results using the model discussed in Task 5.3, predicting what might be achievable for a real device.

| Device type | Input power (W) | BPT (° C.) | Max Temp (° C.) | Delta T (° C.) | % relative decrease due to diamond/ diamond spreader | Estimated Max operating power at 150° C. (W/cm) |
|---|---|---|---|---|---|---|
| IA | 2.79 | 50 | 132.3 | 82.3 | —/— | ~15 |
| IB | 2.76 | 50 | 120.0* | 70.00* | —/9% | ~23 |
| IIA | 2.96 | 60 | 76.87 | 16.87 | 80%/— | ~35 |
| IIB | 2.96 | 60 | 72.93 | 12.93* | 85%/5% | ~40 |

Thermal imaging data are obtained for these devices with the performance characteristics as summarized in Table 1. From these data and images and other work described herein, several conclusions can be drawn: (1) Transfer printing can be used to integrate these devices with both thick and thin diamond thermal materials to enhance their ability to perform at higher powers and lower operating temperatures; (2) The reduction of the max temperatures on the heater lines is significant, with the diamond substrate and overlayer lowering the temperature by a maximum of 84% and 10%, respectively; (3) Based on the model, we estimate that this integration pathway could be used to increase the power handling capability from about 15 W/cm to about 40 W/cm, based on a maximum allowable junction temperature of 150° C. If the junction can operate continuously at 250° C. this number increases to about 65 W/cm; (4) The data shows that the thin diamond thermal spreader is not always in good thermal contact with the subject. In places where the spreader is in good contact the local reduction in temperature, especially on the heater lines, is dramatic. Where there is an air gap between the thin thermal spreader and the substrate the temperature at the heater can be worse than is the case when there is no thin spreader present.

Figure 15:
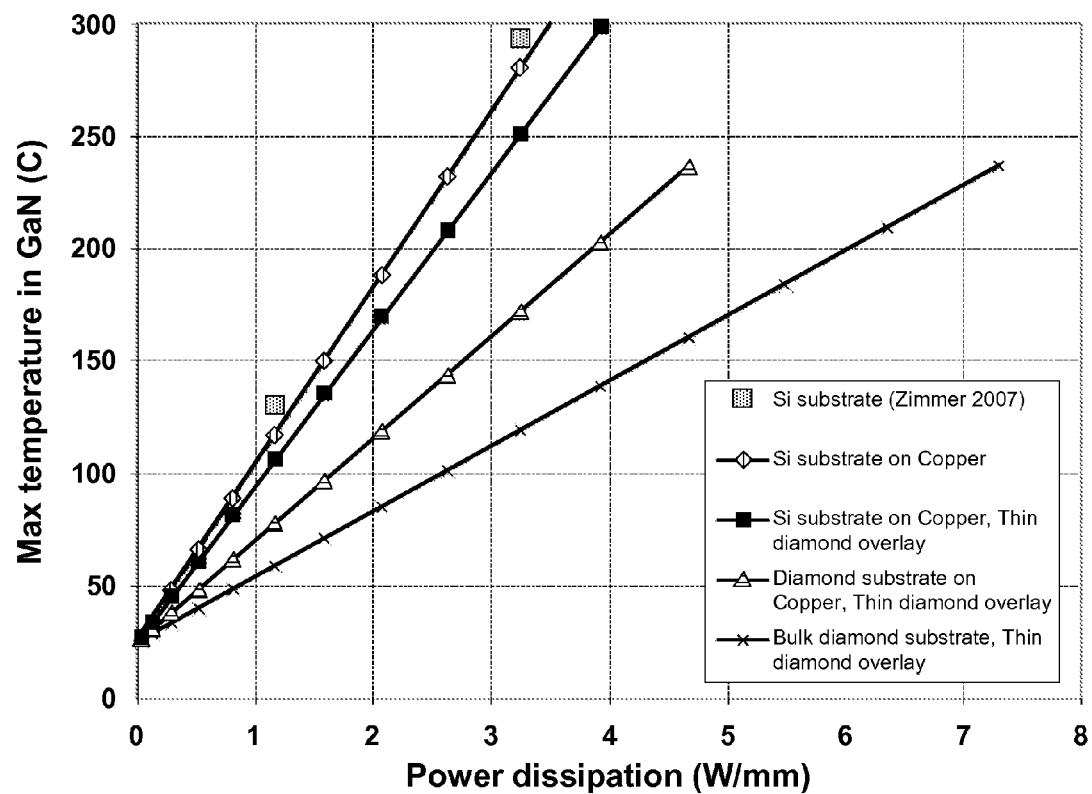
FIG. 15 Plot of junction temperature (in GaN layer) as a function of power dissipation for various substrates with the addition of a diamond overlayer on the NiCr resistive heater.

Thermal Simulations: Results of thermal simulations of the heterogeneously integrated structure is presented in FIG. 15. The temperature for each device is monitored as the maximum temperature in the mid-thickness of the GaN layer, appropriately approximating the junction temperature of the HFET device. For comparison, the HEMT thermal modeling results (with a Si substrate) from a literature reference (Zimmer, CS MANTECH 2007) is provided in the chart. The modeling results obtained in this work are in good agreement with the literature referenced. As expected, for a given power dissipation, the GaN temperature is decreased as the thermal conductivity of the substrate layer is increased.

Table II provides the W/mm observed at a GaN junction temperature of 200° C. and percent differences observed by varying the substrate and package (sub-mount). It is shown that the use of a thin diamond overlay results in an observed improvement of ~13%. The combined used of this thin diamond overlay with a 50 um thick diamond substrate results in an observed improvement of 74%, and ultimately up to 172% if the sub-mount is also made out of diamond.

TABLE II

| | 2 um thick Diamond overlay | Power (W/mm) | Improvement (%) |
|---|---|---|---|
| 50 um Si substrate on Copper | No | 2.22 | |
| 50 um Si substrate on Copper | Yes | 2.51 | 13 |
| 50 um Diamond substrate on Copper | Yes | 3.87 | 74 |
| 50 um Diamond substrate on Diamond | Yes | 6.04 | 172 |

Limitations of the thermal model include: 1. Thermal conductivities of the diamond overlayer and substrate were 1000 and 1350 W/m·K, respectively, which are conservative values. Also, only constant thermal conductivity values were considered in this version of the model where in reality the thermal conductivity is known to vary with temperature. 2. Limited physical information was available on the material used for the experimental study, so all thermal properties were assumed to be isotropic in this thermal model. 3. Perfect array symmetry (thermal insulation) lateral boundary conditions were used on the outside edges of the device model. This assumption is valid for the case of power devices assembled in a densely packed array configuration (applications such as millimeter-wave arrays). However, this assumption does not allow direct comparison of these thermal simulation results with the temperature measured experimentally (single device test).

Heterogeneous integration via transfer printing is a viable approach to integrating advanced thermal materials with high power electronics. This is accomplished except silicon chiplets are used instead of GaN chiplets. GaN chiplets may be used by depositing appropriately stressed SiNx layers on top of the chiplets prior to printing. Rather than devote resources to optimizing those stresses, we construct device structures much closer to the relevant end-products. Another area of concern is imperfections in the thermal interface between the thin diamond thermal spreaders and the chiplets. This is due to the differential stress presence in the diamond films and is mitigated by changing the temperature and chemistry used to grow these films.

The full 3D model predicts 2×-3× improvement in power density handling at a given junction temperature for diamond-based devices compared to silicon carbide and silicon, respectively. The computational model agrees with recently published work and predicts the maximum power that can be handled for a junction temperature of 150° C. via this approach is about ~43 W/cm, compared to ~16 W/cm for silicon devices being sold today and about 25 W/cm predicted for SiC substrates. For junction temperatures of 250° C. (used in present commercial devices) we project heterogeneous integration permits power densities up to 80 W/cm compared with 30 W/cm max for silicon and 38 W/cm for SiC substrates. The performance gains made possible by heterogeneous integration are clear. Scaling the process to large volumes while also reducing costs (compared to wafer-scale integration of diamond thermal films) means approaches provided herein would be of very high commercial interest to power HEMT manufacturers.

The measurements demonstrate the thermal performance of the devices made using heterogeneous integration via the transfer printing process. The extrapolated power handling levels for the actual devices for junction temperatures of 150° C. matches well with the full thermal model developed. Clearly there is room for improvements however, both in the quality of the materials used (thermal conductivity, thermal performance of interfaces, etc.). In particular, the use of thin thermal diamond heat spreaders could yield performance enhancements better than 25% by fully addressing issues of interfacial thermal resistance and differential film stress, and could be integrated onto the back end of exiting process flows used to make fully packaged HEMT devices.

All references throughout this application, for example patent documents including issued or granted patents or equivalents; patent application publications; and non-patent literature documents or other source material; are hereby incorporated by reference herein in their entireties, as though individually incorporated by reference, to the extent each reference is at least partially not inconsistent with the disclosure in this application (for example, a reference that is partially inconsistent is incorporated by reference except for the partially inconsistent portion of the reference).

The terms and expressions which have been employed herein are used as terms of description and not of limitation, and there is no intention in the use of such terms and expressions of excluding any equivalents of the features shown and described or portions thereof, but it is recognized that various modifications are possible within the scope of the invention claimed. Thus, it should be understood that although the present invention has been specifically disclosed by preferred embodiments, exemplary embodiments and optional features, modification and variation of the concepts herein disclosed may be resorted to by those skilled in the art, and that such modifications and variations are considered to be within the scope of this invention as defined by the appended claims. The specific embodiments provided herein are examples of useful embodiments of the present invention and it will be apparent to one skilled in the art that the present invention may be carried out using a large number of variations of the devices, device components, methods steps set forth in the present description. As will be obvious to one of skill in the art, methods and devices useful for the present methods can include a large number of optional composition and processing elements and steps.

Every formulation or combination of components described or exemplified herein can be used to practice the invention, unless otherwise stated.

Whenever a range is given in the specification, for example, a temperature range, a time range, or a composition or concentration range, all intermediate ranges and subranges, as well as all individual values included in the ranges given are intended to be included in the disclosure. It will be understood that any subranges or individual values in a range or subrange that are included in the description herein can be excluded from the claims herein.

All patents and publications mentioned in the specification are indicative of the levels of skill of those skilled in the art to which the invention pertains. References cited herein are incorporated by reference herein in their entirety to indicate the state of the art as of their publication or filing date and it is intended that this information can be employed herein, if needed, to exclude specific embodiments that are in the prior art. For example, when composition of matter are claimed, it should be understood that compounds known and available in the art prior to Applicant's invention, including compounds for which an enabling disclosure is provided in the references cited herein, are not intended to be included in the composition of matter claims herein.

As used herein, "comprising" is synonymous with "including," "containing," or "characterized by," and is inclusive or open-ended and does not exclude additional, unrecited elements or method steps. As used herein, "consisting of" excludes any element, step, or ingredient not specified in the claim element. As used herein, "consisting essentially of" does not exclude materials or steps that do not materially affect the basic and novel characteristics of the claim. In each instance herein any of the terms "comprising", "consisting essentially of" and "consisting of" may be replaced with either of the other two terms. The invention illustratively described herein suitably may be practiced in the absence of any element or elements, limitation or limitations which is not specifically disclosed herein.

One of ordinary skill in the art will appreciate that starting materials, biological materials, reagents, synthetic methods, purification methods, analytical methods, assay methods, and biological methods other than those specifically exemplified can be employed in the practice of the invention without resort to undue experimentation. All art-known functional equivalents, of any such materials and methods are intended to be included in this invention. The terms and expressions which have been employed are used as terms of description and not of limitation, and there is no intention that in the use of such terms and expressions of excluding any equivalents of the features shown and described or portions thereof, but it is recognized that various modifications are possible within the scope of the invention claimed. Thus, it should be understood that although the present invention has been specifically disclosed by preferred embodiments and optional features, modification and variation of the concepts herein disclosed may be resorted to by those skilled in the art, and that such modifications and variations are considered to be within the scope of this invention as defined by the appended claims.

We claim:

1. A method of making printable diamond patterns, the method comprising:
   providing a flexible receiving substrate;
   growing a diamond layer on a supporting substrate; and
   patterning the diamond layer to form a plurality of diamond microstructures capable of printing to the flexible receiving substrate.

2. The method of claim 1, wherein the diamond layer has a thickness that is less than or equal to 2 μm.

3. The method of claim 1, further comprising a bridge connected to an end of the diamond microstructure to provide registered transfer of the diamond microstructure from the supporting substrate to the receiving substrate.

4. The method of claim 1, further comprising printing the plurality of diamond microstructures to said receiving substrate.

5. The method of claim 4, wherein the flexible receiving substrate is part of a device or a device component.

6. The method of claim 5, wherein the diamond provides a performance characteristic to the device or device component, the performance characteristic selected from the group consisting of:
   a. thermal dissipation;
   b. hardness;
   c. high modulus;
   d. index of refraction;
   e. bendability;
   f. chemical inertness;
   g. biocompatibility; and
   h. wear resistance.

* * * * *